(12) United States Patent
Brown et al.

(10) Patent No.: US 9,620,834 B2
(45) Date of Patent: Apr. 11, 2017

(54) METHOD FOR FABRICATING MINIATURE STRUCTURES OR DEVICES SUCH AS RF AND MICROWAVE COMPONENTS

(71) Applicant: Microfabrica Inc., Van Nuys, CA (US)

(72) Inventors: Elliott R. Brown, Glendale, CA (US); John D. Evans, Alexandria, VA (US); Christopher A. Bang, Northridge, CA (US); Adam L. Cohen, Dallas, TX (US); Michael S. Lockard, Lake Elizabeth, CA (US); Dennis R. Smalley, Newhall, CA (US); Morton Grosser, Menlo Park, CA (US)

(73) Assignee: Microfabrica Inc., Van Nuys, CA (US)

( * ) Notice: Subject to any disclaimer, the term of this patent is extended or adjusted under 35 U.S.C. 154(b) by 22 days.

(21) Appl. No.: 14/194,592

(22) Filed: Feb. 28, 2014

(65) Prior Publication Data

US 2014/0197904 A1     Jul. 17, 2014

Related U.S. Application Data

(63) Continuation of application No. 13/205,357, filed on Aug. 8, 2011, now Pat. No. 8,713,788, which is a (Continued)

(51) Int. Cl.
*H01P 3/00* (2006.01)
*H01P 1/202* (2006.01)
(Continued)

(52) U.S. Cl.
CPC .............. *H01P 1/202* (2013.01); *C25D 1/003* (2013.01); *G01P 15/0802* (2013.01);
(Continued)

(58) Field of Classification Search
CPC .. H01P 1/202; H01P 3/06; H01P 5/183; H01P 11/00; H01P 11/005; H01P 11/07
(Continued)

(56) References Cited

U.S. PATENT DOCUMENTS 2,178,299 A    10/1939  Walter et al.
2,306,082 A    12/1942  Prest et al.
(Continued)

FOREIGN PATENT DOCUMENTS

DE    3212152 A1    10/1983
EP    0313058 A2    4/1989
(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.
(Continued)

*Primary Examiner* — Robert Pascal
*Assistant Examiner* — Kimberly Glenn
(74) *Attorney, Agent, or Firm* — Dennis R. Smalley

(57) ABSTRACT

Multi-layer, multi-material fabrication methods include depositing at least one structural material and at least one sacrificial material during the formation of each of a plurality of layers wherein deposited materials for each layer are planarized to set a boundary level for the respective layer and wherein during formation of at least one layer at least three materials are deposited with a planarization operation occurring before deposition of the last material to set a planarization level above the layer boundary level and wherein a planarization occurs after deposition of the last material level above the layer boundary level and wherein a planarization occurs after deposition of the last material whereby the boundary level for the layer is set. Some
(Continued)

formation processes use electrochemical fabrication techniques (e.g. including selective depositions, bulk depositions, etching operations and planarization operations) and post-deposition processes (e.g. selective etching operations and/or back filling operations).

16 Claims, 49 Drawing Sheets

Related U.S. Application Data continuation of application No. 12/899,071, filed on Oct. 6, 2010, now abandoned, which is a continuation of application No. 11/842,947, filed on Aug. 21, 2007, now Pat. No. 7,830,228, which is a continuation of application No. 10/309,521, filed on Dec. 3, 2002, now Pat. No. 7,259,640.

(60) Provisional application No. 60/338,638, filed on Dec. 3, 2001, provisional application No. 60/340,372, filed on Dec. 6, 2001, provisional application No. 60/379,133, filed on May 7, 2002, provisional application No. 60/379,182, filed on May 7, 2002, provisional application No. 60/379,184, filed on May 7, 2002, provisional application No. 60/415,374, filed on Oct. 1, 2002, provisional application No. 60/379,130, filed on May 7, 2002, provisional application No. 60/392,531, filed on Jun. 27, 2002.

(51) Int. Cl.
*G01P 15/08* (2006.01)
*G01P 15/125* (2006.01)
*H01P 3/06* (2006.01)
*H01P 5/18* (2006.01)
*H01P 11/00* (2006.01)
*C25D 1/00* (2006.01)
*H05K 3/46* (2006.01)

(52) U.S. Cl.
CPC .............. *G01P 15/125* (2013.01); *H01P 3/06* (2013.01); *H01P 5/183* (2013.01); *H01P 11/00* (2013.01); *H01P 11/005* (2013.01); *H01P 11/007* (2013.01); *B81B 2201/042* (2013.01); *H05K 3/4647* (2013.01); *Y10T 29/49002* (2015.01); *Y10T 29/49016* (2015.01); *Y10T 29/49018* (2015.01)

(58) Field of Classification Search
USPC ......................................................... 333/160
See application file for complete search history.

(56) References Cited

U.S. PATENT DOCUMENTS

| | | |
|---|---|---|
| 2,438,913 A | 4/1948 | Hansen et al. |
| 2,483,913 A | 10/1949 | Lampton et al. |
| 2,532,993 A | 12/1950 | Carter et al. |
| 2,976,534 A | 3/1961 | Abe et al. |
| 3,144,624 A | 8/1964 | Rypinski et al. |
| 3,160,826 A | 12/1964 | Marcatili et al. |
| 3,185,944 A | 5/1965 | Turnage et al. |
| 3,240,685 A | 3/1966 | Maissel et al. |
| 3,602,848 A | 8/1971 | Leonard et al. |
| 3,697,401 A | 10/1972 | Lucas et al. |
| 3,729,740 A | 4/1973 | Nakahara et al. |
| 3,745,105 A | 7/1973 | Kosowsky et al. |
| 3,824,504 A | 7/1974 | Parris |
| 3,835,017 A | 9/1974 | Mentone et al. |
| 3,900,693 A | 8/1975 | Wyhof |
| 3,909,755 A | 9/1975 | Kaunzinger |
| 3,926,916 A | 12/1975 | Mastrangelo |
| 3,963,999 A | 6/1976 | Nakajima et al. |
| 4,021,789 A | 5/1977 | Furman et al. |
| 4,043,891 A | 8/1977 | Alkire et al. |
| 4,080,267 A | 3/1978 | Castellani et al. |
| 4,126,533 A | 11/1978 | Lukyanchikov et al. |
| 4,127,831 A | 11/1978 | Riblet |
| 4,155,815 A | 5/1979 | Francis et al. |
| 4,161,704 A | 7/1979 | Schafer |
| 4,187,553 A | 2/1980 | Ahn et al. |
| 4,294,669 A | 10/1981 | Lincoln et al. |
| 4,370,941 A | 2/1983 | Belton |
| 4,376,017 A | 3/1983 | Urion |
| 4,404,080 A | 9/1983 | Jahani |
| 4,452,684 A | 6/1984 | Palnik |
| 4,537,647 A | 8/1985 | Foster |
| 4,575,330 A | 3/1986 | Hull |
| 4,600,555 A | 7/1986 | Shimizu |
| 4,614,922 A * | 9/1986 | Bauman et al. ............... 333/161 |
| 4,647,878 A | 3/1987 | Landis et al. |
| 4,670,724 A | 6/1987 | Riblet et al. |
| 4,673,904 A | 6/1987 | Landis |
| 4,752,352 A | 6/1988 | Feygin |
| 4,764,449 A | 8/1988 | VanIseghem |
| 4,770,754 A | 9/1988 | Meuldijk et al. |
| 4,776,087 A | 10/1988 | Cronin et al. |
| 4,810,982 A | 3/1989 | Wong |
| 4,816,618 A | 3/1989 | Bongianni |
| 4,920,639 A | 5/1990 | Yee |
| 4,921,583 A | 5/1990 | Sewell et al. |
| 4,954,192 A | 9/1990 | Dziekan |
| 4,958,222 A | 9/1990 | Takakura et al. |
| 4,961,154 A | 10/1990 | Pomerantz et al. |
| 4,985,116 A | 1/1991 | Mettler et al. |
| 5,011,580 A | 4/1991 | Pan et al. |
| 5,059,359 A | 10/1991 | Hull et al. |
| 5,190,637 A | 3/1993 | Guckel |
| 5,209,817 A | 5/1993 | Ahmad et al. |
| 5,209,878 A | 5/1993 | Smalley et al. |
| 5,271,822 A | 12/1993 | Nolan et al. |
| 5,273,691 A | 12/1993 | Hull et al. |
| 5,298,687 A | 3/1994 | Rapoport et al. |
| 5,301,415 A | 4/1994 | Prinz et al. |
| 5,369,881 A | 12/1994 | Inaba et al. |
| 5,378,583 A | 1/1995 | Guckel et al. |
| 5,395,508 A | 3/1995 | Jolly et al. |
| 5,413,668 A | 5/1995 | Aslam et al. |
| 5,426,399 A | 6/1995 | Matsubayashi et al. |
| 5,435,902 A | 7/1995 | Andre, Sr. |
| 5,455,545 A | 10/1995 | Garcia |
| 5,478,699 A | 12/1995 | Blessington et al. |
| 5,496,668 A | 3/1996 | Guckel et al. |
| 5,501,784 A | 3/1996 | Lessmollmann et al. |
| 5,512,162 A | 4/1996 | Sachs et al. |
| 5,512,163 A | 4/1996 | Warfield |
| 5,560,837 A | 10/1996 | Trueba |
| 5,576,147 A | 11/1996 | Guckel et al. |
| 5,596,504 A | 1/1997 | Tata et al. |
| 5,605,614 A | 2/1997 | Bornand |
| 5,614,075 A | 3/1997 | Andre, Sr. |
| 5,641,391 A | 6/1997 | Hunter et al. |
| 5,652,557 A | 7/1997 | Ishikawa |
| 5,700,607 A | 12/1997 | Rath et al. |
| 5,718,618 A | 2/1998 | Guckel et al. |
| 5,766,441 A | 6/1998 | Arndt et al. |
| 5,805,971 A | 9/1998 | Akedo |
| 5,832,834 A | 11/1998 | Nishino et al. |
| 5,866,281 A | 2/1999 | Guckel et al. |
| 5,874,011 A | 2/1999 | Ehrlich |
| 5,876,424 A | 3/1999 | O'Phelan et al. |
| 5,908,719 A | 6/1999 | Guckel et al. |
| 5,945,058 A | 8/1999 | Manners et al. |
| 5,999,184 A | 12/1999 | Smalley et al. |
| 6,008,102 A | 12/1999 | Alford et al. |
| 6,019,784 A | 2/2000 | Hines |
| 6,027,630 A | 2/2000 | Cohen |
| 6,140,888 A | 10/2000 | Sarkka et al. |
| 6,197,180 B1 | 3/2001 | Kelly |

(56) References Cited

U.S. PATENT DOCUMENTS

| | | |
|---|---|---|
| 6,333,741 B1 | 12/2001 | Snead et al. |
| 6,338,900 B1 | 1/2002 | Tada et al. |
| 6,417,742 B1 | 7/2002 | Enokuma |
| 6,466,112 B1 | 10/2002 | Kwon et al. |
| 6,475,369 B1 | 11/2002 | Cohen |
| 6,480,163 B1 | 11/2002 | Knop et al. |
| 6,523,252 B1 | 2/2003 | Lipponen |
| 6,572,742 B1 | 6/2003 | Cohen |
| 6,613,972 B2 | 9/2003 | Cohen et al. |
| 6,724,277 B2 | 4/2004 | Holden et al. |
| 6,762,237 B2 | 7/2004 | Glatkowski et al. |
| 7,012,489 B2 | 3/2006 | Sherrer et al. |
| 7,026,697 B2 | 4/2006 | Sherrer |
| 7,129,163 B2 | 10/2006 | Sherrer et al. |
| 7,160,429 B2 | 1/2007 | Cohen et al. |
| 7,229,542 B2 | 6/2007 | Bang |
| 7,239,219 B2 | 7/2007 | Brown et al. |
| 7,250,101 B2 | 7/2007 | Thompson et al. |
| 7,259,640 B2 | 8/2007 | Brown et al. |
| 7,288,178 B2 | 10/2007 | Cohen et al. |
| 7,303,663 B2 | 12/2007 | Cohen et al. |
| 7,430,731 B2 | 9/2008 | Cohen et al. |
| 7,524,427 B2 | 4/2009 | Cohen et al. |
| 7,531,077 B2 | 5/2009 | Cohen et al. |
| 7,623,935 B2 | 11/2009 | Cohen et al. |
| 7,830,228 B2 | 11/2010 | Brown et al. |
| 2003/0127336 A1 | 7/2003 | Cohen et al. |
| 2003/0221968 A1 | 12/2003 | Cohen et al. |
| 2003/0222738 A1 | 12/2003 | Brown et al. |
| 2003/0234179 A1 | 12/2003 | Bang |
| 2004/0000489 A1 | 1/2004 | Zhang et al. |
| 2004/0004001 A1 | 1/2004 | Cohen et al. |
| 2004/0004002 A1 | 1/2004 | Thompson et al. |
| 2004/0007468 A1 | 1/2004 | Cohen et al. |
| 2004/0020782 A1 | 2/2004 | Cohen et al. |
| 2004/0065550 A1 | 4/2004 | Zhang |
| 2004/0065555 A1 | 4/2004 | Zhang |
| 2004/0263290 A1* | 12/2004 | Sherrer .................. H01P 1/08 333/243 |
| 2008/0121343 A1 | 5/2008 | Cohen et al. |
| 2010/0051466 A1 | 3/2010 | Smalley et al. |

FOREIGN PATENT DOCUMENTS

| | | |
|---|---|---|
| GB | 2127855 A | 4/1984 |
| JP | S59191356 A | 10/1984 |
| JP | S61210636 A | 9/1986 |
| JP | H01125956 A | 5/1989 |
| JP | H01255682 A | 10/1989 |
| JP | H04318187 A | 11/1992 |
| JP | H06232217 A | 8/1994 |
| JP | H0722425 A | 1/1995 |
| JP | H08274167 A | 10/1996 |
| JP | 2001142210 A | 5/2001 |
| RU | 2046469 C1 | 10/1995 |
| WO | WO8707538 A1 | 12/1987 |
| WO | WO0039854 A1 | 7/2000 |
| WO | WO03049514 A2 | 6/2003 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

J. A. Bishop, et al., "Monolithic Coaxial Transmission Lines for mm-wave ICs", High Speed Semiconductor Devices and Circuits, 1991., Proceeding IEEE/Cornell Conference on Advanced Concepts in Ithaca, NY, USA Aug. 5-7, 1991, pp. 252-260.

Jeong Inho, et al., "Monolithic Implementation of Air-Filled Rectangular Coaxial Line", Electronics Letters, IEE Stevenage, GB, vol. 36, No. 3, Feb. 3, 2000, pp. 228-230.

John D. Madden, et al., "Three-Dimensional Microfabrication by Localized, Electrochemical Deposition", J. of Micro. Sys., Mar. 1996, 5(1):24-32.

Taylor, et al., "'Spatial Forming' A Three Dimensional Printing Process", IEEE, 1995, pp. 203-208.

Kumar, et al., "Features of gold having micrometer to centimeter dimensions can be formed through a combination of stamping with an elastomeric stamp . . . " Appln. Phys. Lett., Jul. 1993, 63(14):2002-2004.

Marques, et al., "Fabrication of High-Aspect-Ratio Microstructures on Planar and Nonplanar Surfaces Using a Modified LIGA Process", Dec. 1997, 6(4):329-336.

Osterberg, Peter M., et al., "MEMBUILDER: An Automated 3D Solid Model Construction Program for Microelectromechanical Structures", The 8th Int'l Conference on Solid-State Sensors and Actuators, and Eurosensors IX; Jun. 25-29, 1995; pp. 21-24; Stockholm, Sweden.

Dr. Steve Hill, "An E-FAB Way for Making the Micro World", Materials World is the journal of The Institute of Materials, Sep. 1999, vol. 7, No. 9, pp. 538-539.

* cited by examiner

METHOD FOR FABRICATING MINIATURE STRUCTURES OR DEVICES SUCH AS RF AND MICROWAVE COMPONENTS

RELATED APPLICATIONS

The below table sets forth the priority claims for the instant application along with filing dates, patent numbers, and issue dates as appropriate. Each of these applications is incorporated herein by reference as if set forth in full herein.

| App. No. | Continuity Type | App. No. | Which was Filed (YYYY-MM-DD) | Which is now | Which issued on |
|---|---|---|---|---|---|
| This application | is a continuation of | 13/205,357 | 2011-08-08 | Pending | — |
| 13/205,357 | is a continuation of | 12/899,071 | 2010-10-06 | Abandoned | — |
| 12/899,071 | is a continuation of | 11/842,947 | 2007-08-21 | U.S. Pat. No. 7,830,228 | 2010-10-09 |
| 11/842,947 | is a continuation of | 10/309,521 | 2002-12-03 | U.S. Pat. No. 7,259,640. | 2007-08-21 |
| 10/309,521 | claims benefit of | 60/338,638 | 2001-12-03 | Abandoned | — |
| 10/309,521 | claims benefit of | 60/340,372 | 2002-05-07 | Abandoned | — |
| 10/309,521 | claims benefit of | 60/379,133 | 2002-05-07 | Abandoned | — |
| 10/309,521 | claims benefit of | 60/379,182 | 2002-05-07 | Abandoned | — |
| 10/309,521 | claims benefit of | 60/379,184 | 2002-05-07 | Abandoned | — |
| 10/309,521 | claims benefit of | 60/415,374 | 2002-10-01 | Abandoned | — |
| 10/309,521 | claims benefit of | 60/379,130 | 2002-05-07 | Abandoned | — |
| 10/309,521 | claims benefit of | 60/392,531 | 2002-06-27 | Abandoned | — |

FIELD OF THE INVENTION

Embodiments of this invention relate to the field of electrical devices and their manufacture while specific embodiments relate to RF and microwave devices and their manufacture. More particularly embodiments of this invention relate to miniature passive RF and microwave devices (e.g. filters, transmission lines, delay lines, and the like) which may be manufactured using, at least in part, a multi-layer electrodeposition technique known as Electrochemical Fabrication.

BACKGROUND OF THE INVENTION

A technique for forming three-dimensional structures/devices from a plurality of adhered layers was invented by Adam Cohen and is known as Electrochemical Fabrication. It is being commercially pursued by Microfabrica® Inc. (formerly MEMGen Corporation) of Van Nuys, Calif. under the trade name EFAB®. This technique was described in U.S. Pat. No. 6,027,630, issued on Feb. 22, 2000. This electrochemical deposition technique allows the selective deposition of a material using a unique masking technique that involves the formation of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the conformable portion inhibits deposition at selected locations. For convenience, these masks might be generically called conformable contact masks; the masking technique may be generically called a conformable contact mask plating process, and the like. More specifically, in the terminology of Microfabrica® Inc. (formerly MEMGen Corporation) of Van Nuys, Calif. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

1. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.
2. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.
3. Cohen, "3-D Micromachining by Electrochemical Fabrication", Micromachine Devices, March 1999.
4. G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.
5. F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio Microstructure Technology (HARMST'99), June 1999.
6. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.
7. F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.
8. Cohen, "Electrochemical Fabrication (EFAB™)", Chapter 19 of The MEMS Handbook, edited by Mohamed Gad-El-Hak, CRC Press, 2002.

9. "Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is being formed:

1. Selectively depositing at least one material by electrodeposition upon desired region(s) of a substrate.
2. Then, blanket depositing at least one additional material by electrodeposition so that the additional deposit covers both the region(s) that were previously selectively deposited onto and the region(s) of the substrate that did not receive any previously applied selective deposition(s).
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more additional times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a portion of a layer) on which deposition is to occur. The pressing together of the CC mask and substrate occur in such a way that all openings, in the conformable portions of the CC mask contain plating solution. The Conformable material of the CC mask that contacts the substrate acts as a barrier to electrodeposition in those locations while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through mask plating process the separation of the masking material from the substrate would occur destructively. As with through-mask plating, CC mask plating deposits material simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown) to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

Electrochemical Fabrication provides the ability to form prototypes and commercial quantities of miniature objects (e.g. mesoscale and microscale objects), parts, structures, devices, and the like at reasonable costs and in reasonable times. In fact, Electrochemical Fabrication is an enabler for the formation of many structures that were hitherto impossible to produce. Electrochemical Fabrication opens a new design and product spectrum in many industrial fields. Even though electrochemical fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art within the field or fields of a specific application.

A need exists in the field of electrical components and systems and particularly within the field of RF and microwave components and systems for devices having reduced size, reduced manufacturing cost, enhanced reliability, application to different frequency ranges, and/or other enhanced features, and the like.

SUMMARY OF THE INVENTION

An object of various aspects of the invention is to provide RF components having reduced size.

An object of various aspects of the invention is to provide RF components producible with decreased manufacturing cost.

An object of various aspects of the invention is to provide RF components with enhanced reliability.

An object of various aspects of the invention is to provide RF components with design features making them applicable for use within more frequency bands.

An object of various aspects of the invention is to provide RF components with features that provide enhanced capability, such as greater bandwidth.

Other objects and advantages of various aspects of the invention will be apparent to those of skill in the art upon review of the teachings herein. The various aspects of the invention, set forth explicitly herein or otherwise ascertained from the teachings herein, may address any one of the above objects alone or in combination, or alternatively may address some other object of the invention ascertained from the teachings herein. It is not intended that all of these objects be addressed by any single aspect of the invention even though that may be the case with regard to some aspects.

It is an aspect of the invention to provide a microminiature RF or microwave coaxial component, that includes an inner conductor that has an axis which is substantially coaxial with an axis an outer conductor wherein the inner and outer conductors are spaced from one another by a dielectric gap wherein a minimum cross-sectional dimension from an inside wall of the outer conductor to an opposing inside wall of the outer conductor is less than about 200 µm. In a specific variation of this aspect of the invention the outer conductor has a substantially rectangular cross-sectional configuration.

It is an aspect of the invention to provide a coaxial RF or microwave component that preferentially passes a radiation in a desired frequency band, including: at least one RF or microwave radiation entry port in a conductive structure; at least one RF or microwave radiation exit port in the conductive structure; at least one passage, substantially bounded on the sides by the conductive structure, through which RF or microwave radiation passes when traveling from the at least one entry port to the at least one exit port; a central conductor extending along the at least one passage from the entry port to the exit port; and at least one conductive spoke extending between the central conductor and the conductive structure at each of a plurality of locations where successive locations along the length of the passage are spaced by approximately one-half of a propagation wavelength, or an integral multiple thereof, within the passage for a frequency to be passed by the component, wherein one or more of the following conditions are met (1) the central conductor, the conductive structure, and the conductive spokes are monolithic, (2) a cross-sectional dimension of the passage perpendicular to a propagation direction of the radiation along the passage is less than about 1 mm, more preferably less than about 0.5 mm, and most preferably less than about 0.25 mm, (3) more than about 50% of the passage is filled with a gaseous medium, more preferably more than about 70% of the passage is filled with a gaseous medium, and most preferably more than about 90% of the passage is filled with a gaseous medium, (4) at least a portion of the conductive portions of the component are formed by an electrodeposition process, (5) at least a portion of the conductive portions of the component are formed from a plurality of successively deposited layers, (6) at least a portion of the passage has a generally rectangular shape, (7) at least a portion of the central conductor has a generally rectangular shape, (8) the passage extends along a two-dimensional non-linear path, (9) the passage extends along a three-dimensional path, (10) the passage includes at least one curved region and a side wall of the passage in the curved region has a nominally smaller radius than an opposite side of the passage in the curved region and is provided with a plurality of surface oscillations having smaller radii, (11) the conductive structure is provided with channels at one or more locations where the electrical field at a surface of the conductive structure, if it were there, would have been less than about 20% of its maximum value within the passage, more preferably less than 10% of its maximum value within the passage, even more preferably less than 5% of its maximum value within the passage, and most preferably where the electrical field would have been approximately zero, (12) the conductive structure is provided with patches of a different conductive material at one or more locations where the electrical field at the surface of the conductive structure, if it were there, would have been less than about 20% of its maximum value within the passage more preferably less than about 10% of its maximum value within the passage, even more preferably less than about 5% of its maximum value within the passage, and most preferably where the electrical field would have been approximately zero, (13) mitered corners are used at least some junctions for segments of the passage that meet at angles between 60° and 120°, and/or (14) the conductive spokes are spaced at an integral multiple of one-half the wavelength and bulges on the central conductor or bulges extending from the conductive structure extend into the passage at one or more locations spaced from the conductive spokes by an integral multiple of approximately one-half the wavelength.

It is an aspect of the invention to provide a coaxial RF or microwave component that preferentially passes a radiation in a desired frequency band, including: at least one RF or microwave radiation entry port in a conductive structure; at least one RF or microwave radiation exit port in the conductive structure; at least one passage, substantially bounded on the sides by the conductive structure, through which RF or microwave radiation passes when traveling from the at least one entry port to the at least one exit port; a central conductor extending along the at least one passage from the entry port to the exit port; and at a plurality of locations along a length of the passage, a pair of conductive stubs extending from approximately the same position along a length of the passage, one having an inductive property and the other having a capacitive property, each extending into a closed channel that extends from a side of the passage, wherein the successive locations along the length of the passage are spaced by approximately one-quarter of a propagation wavelength, or an integral multiple thereof, within the passage for a frequency to be passed by the component, wherein one or more of the following conditions are met (1) the central conductor, the conductive structure, and the conductive stubs are monolithic, (2) a cross-sectional dimension of the passage perpendicular to a propagation direction of the radiation along the passage is less than about 1 mm, more preferably less than about 0.5 mm, and most preferably less than about 0.25 mm, (3) more than about 50% of the passage is filled with a gaseous medium, more preferably more than about 70% of the passage is filled with a gaseous medium, and most preferably more than about 90% of the passage is filled with a gaseous medium, (4) at least a portion of the conductive portions of the component are formed by an electrodeposition process, (5) at least a portion of the conductive portions of the component are formed from a plurality of successively deposited layers, (6) at least a portion of the passage has a generally rectangular shape, (7) at least a portion of the central conductor has a generally rectangular shape, (8) the passage extends along a two-dimensional non-linear path, (9) the passage extends along a three-dimensional path, (10) the passage includes at least one curved region and a side wall of the passage in the curved region has a nominally smaller radius than an opposite side of the passage in the curved region and is provided with a plurality of surface oscillations having smaller radii, (11) the conductive structure is provided with channels at one or more locations where the electrical field at a surface of the conductive structure, if it were there, would have been less than about 20% of its maximum value within the passage, more preferably less than 10% of its maximum value within the passage, even more preferably less than 5% of its maximum value within the passage, and most preferably where the electrical field would have been approximately zero, (12) the conductive structure is provided with patches of a different conductive material at one or more locations where the electrical field at the surface of the conductive structure, if it were there, would have been less than about 20% of its maximum value within the passage more preferably less than about 10% of its maximum value within the passage, even more preferably less than about 5% of its maximum value within the passage, and most preferably where the electrical field would have been approximately zero, (13) mitered corners are used at least some junctions for segments of the passage that meet at angles between 60° and 120°, and/or (14) the conductive stubs are spaced at an integral multiple of one-quarter the wavelength and bulges on the central conductor or bulges extending from the conductive structure extend into the passage at one or more locations spaced from the conductive stubs by an integral multiple of approximately one-half the wavelength.

It is an aspect of the invention to provide a coaxial RF or microwave component that guides or controls radiation, including: at least one RF or microwave radiation entry port in a conductive structure; at least one RF or microwave radiation exit port in the conductive structure; at least one passage substantially bounded on the sides by the conductive structure through which RF or microwave radiation passes when traveling from the at least one entry port to the at least one exit port; a central conductor extending along a length of the at least one passage from the entry port to the exit port; and a branch in the passage down which a branch of the central conductor runs and in which the central conductor shorts against the conductive structure, wherein at least one of the following conditions is met (1) the branch of the central conductor, the conductive structure surrounding the branch, and a location of shorting between the central conductor and the conductive structure are monolithic, (2) at least a portion of the central conductor or the conductive structure includes material formed from a plurality of successively deposited layers, and/or (3) at least a portion of the central conductor or the conductive structure includes material formed by a plurality of electrodeposition operations.

It is an aspect of the invention to provide an RF or microwave component that guides or controls radiation, including: at least one RF or microwave radiation entry port in a conductive metal structure; at least one RF or microwave radiation exit port in the conductive metal structure; at least one passage substantially bounded on the sides by the conductive metal structure through which RF or microwave energy passes when traveling from the at least one entry port to the at least one exit port; and wherein at least one the following conditions are met: (1) at least a portion of the conductive metal structure includes a metal formed by a plurality of electrodeposition operations, and/or (2) at least a portion of the conductive metal structure includes a metal formed from a plurality of successively deposited layers.

It is an aspect of the invention to provide an RF or microwave component that guides or controls radiation, including: at least one RF or microwave energy entry port in a conductive metal structure; and at least one passage substantially bounded on the sides by the conductive metal structure through which RF or microwave energy passes when traveling from the at least one entry port; and wherein at least a portion of the metal structure includes a metal formed by a plurality of electrodeposition operations and/or from a plurality of successively deposited layers.

It is an aspect of the invention to provide an RF or microwave component that guides or controls radiation, that includes at least one RF or microwave radiation entry port and at least one exit port within a conductive metal structure; and at least one passage substantially bounded on the sides by the conductive metal structure through which RF or microwave energy passes when traveling from the at least one entry port; and at least one branching channel along the at least one passage, wherein the conductive metal structure surrounding the passage and the channel in proximity to a branching region of the channel from the passage is monolithic.

In a specific variation of each aspect of the invention the production includes one or more of the following operations: (1) selectively electrodepositing a first conductive material and electrodepositing a second conductive material, wherein one of the first or second conductive materials is a sacrificial material and the other is a structural material; (2) electrodepositing a first conductive material, selectively etching the first structural material to create at least one void, and electrodepositing a second conductive material to fill the at least one void; (3) electrodepositing at least one conductive material, depositing at least one flowable dielectric material, and depositing a seed layer of conductive material in preparation for formation of a next layer of electrodeposited material, and/or (4) selectively electrodepositing a first conductive material, then electrodepositing a second conductive material, then selectively etching one of the first or second conductive materials, and then electrodepositing a third conductive material, wherein at least one of the first, second, or third conductive materials is a sacrificial material and at least one of the remaining two conductive materials is a structural material.

In a another specific variation of each aspect of the invention the production includes one or more of the following operations: (1) separating at least one sacrificial material from at least one structural material; (2) separating a first sacrificial material from (a) a second sacrificial material and (b) at least one structural material to create a void, then filling at least a portion of the void with a dielectric material, and thereafter separating the second sacrificial material from the structural material and from the dielectric material; and/or (3) filling a void in a structural material with a magnetic or conductive material embedded in a flowable dielectric material and thereafter solidifying the dielectric material.

In another specific variation of each aspect of the invention the component includes one or more of a microminiature coaxial component, a transmission line, a low pass filter, a high pass filter, a band pass filter, a reflection-based filter, an absorption-based filter, a leaky wall filter, a delay line, an impedance matching structure for connecting other functional components, a directional coupler, a power combiner (e.g., Wilkinson), a power splitter, a hybrid combiner, a magic TEE, a frequency multiplexer, or a frequency demultiplexer, a pyramidal (i.e., smooth wall) feedhorn antenna, and/or a scalar (corrugated wall) feedhorn antenna.

It is an aspect of the invention to provide an electrical device, including: a plurality of layers of successively deposited material, wherein the pattern resulting from the depositions provide at least one structure that is usable as an electrical device.

It is an aspect of the invention to provide a method of manufacturing an RF device, including: depositing a plurality of adhered layers of material, wherein the deposition of each layer of material comprises, selective deposition of at least a first material; deposition of at least a second material; and planarization of at least a portion of the deposited material; removal of at least a portion of the first or second material after deposition of the plurality of layers; wherein a structural pattern resulting from the deposition and the removal provides at least one structure that is usable as an electrical device It is an aspect of the invention to provide a method of manufacturing a microdevice, including: depositing a plurality of adhered layers of material, wherein the deposition of each layer of material comprises, deposition of at least a first material; deposition of at least a second material; and removing of at least a portion of the first or second material after deposition of the plurality of layers; wherein a structure resulting from the deposition and the removal provides at least one structure that can function as (1) a toroidal inductor, (2) a switch, (3) a helical inductor, or (4) an antenna.

It is an aspect of the invention to provide an apparatus for manufacturing a microdevice, including: means for depositing a plurality of adhered layers of material, wherein the deposition of each layer of material comprises utilization of, a means for selective deposition of at least a first material; a means for deposition of at least a second material; and means for removing at least a portion of the first or second material after deposition of the plurality of layers; wherein a structure resulting from use of the means for depositing and the means for removing provides at least one structure that can function as (1) a toroidal inductor, (2) a switch, (3) a helical inductor, or (4) an antenna.

It is an aspect of the invention to provide a microtoroidal inductor, including: a plurality of conductive loop elements configured to form at least a portion of a toroidal pattern wherein the toroidal pattern may be construed to have an inner diameter and an outer diameter and wherein at least a portion of the plurality of loops have a larger cross-sectional dimension in proximity to the outer diameter than in proximity to the inner diameter.

It is an aspect of the invention to provide a microantenna, including: an antenna that is at least in part separated from a substrate.

It is an aspect of the invention to provide a method of manufacturing an RF device, including: depositing a plurality of adhered layers of material, wherein the deposition of each layer of material comprises, selective deposition of at least a first material; deposition of at least a second material; and planarization of at least a portion of the deposited material; removing at least a portion of the first or second material after deposition of a plurality of layers; wherein a structural pattern resulting from the deposition and the removal provides at least one structure that is usable as an RF device.

Further aspects of the invention will be understood by those of skill in the art upon reviewing the teachings herein. Other aspects of the invention may involve combinations of the above noted aspects of the invention. Other aspects of the invention may involve methods and/or apparatus that can be used in implementing one or more of the above aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 1A-10 schematically depict side views of various stages of a CC mask plating process.

FIG. 5 depicts a plan view of the central portion of a coaxial filter element showing five sets of filtering spokes (two per set) along the length of the filter.

DETAILED DESCRIPTION OF EMBODIMENTS OF THE INVENTION

Figure 1A:
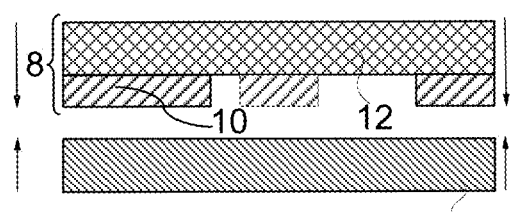
Figure 1B:
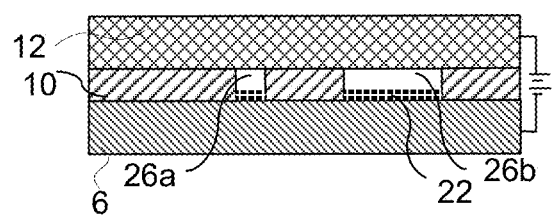
Figure 1C:
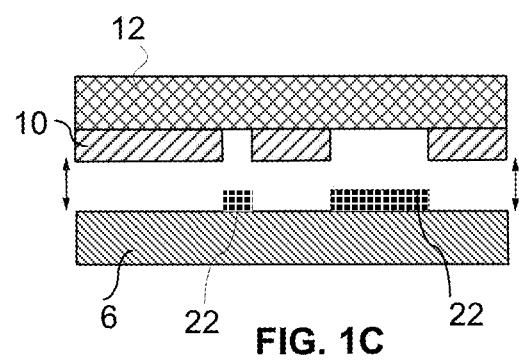
Figure 2A:
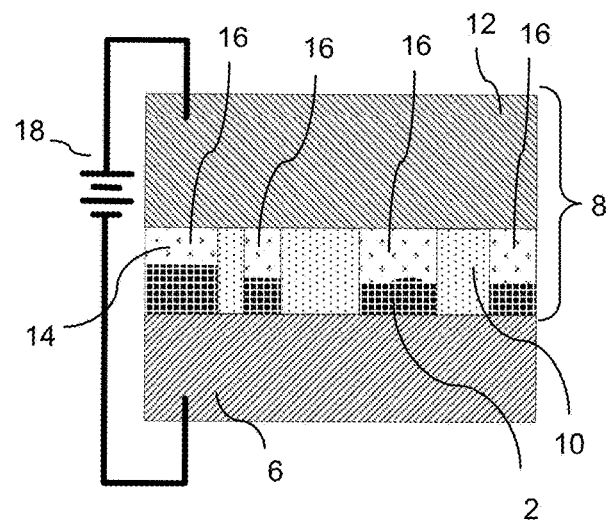
FIGS. 2A-2F schematically depict side views of various stages of an electrochemical fabrication process as applied to the formation of a particular structure where a sacrificial material is selectively deposited while a structural material is blanket deposited.
Figure 2B:
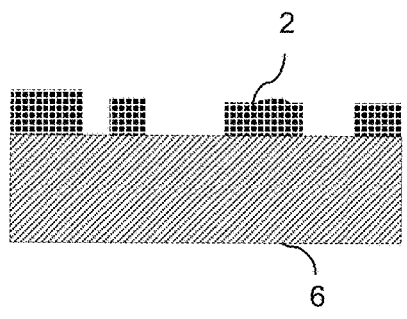
Figure 2C:
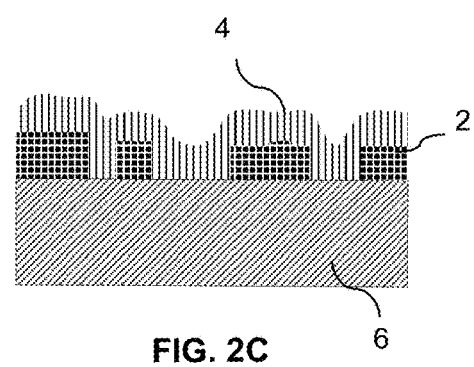
Figure 2D:
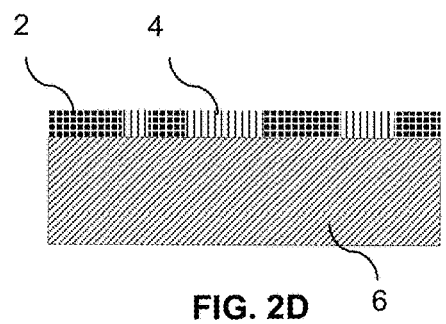
Figure 2E:
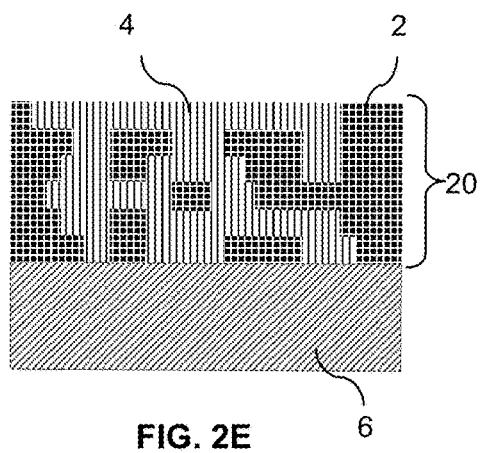
Figure 2F:
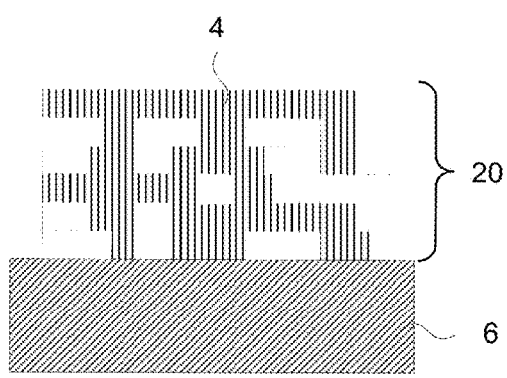
Figure 3A:
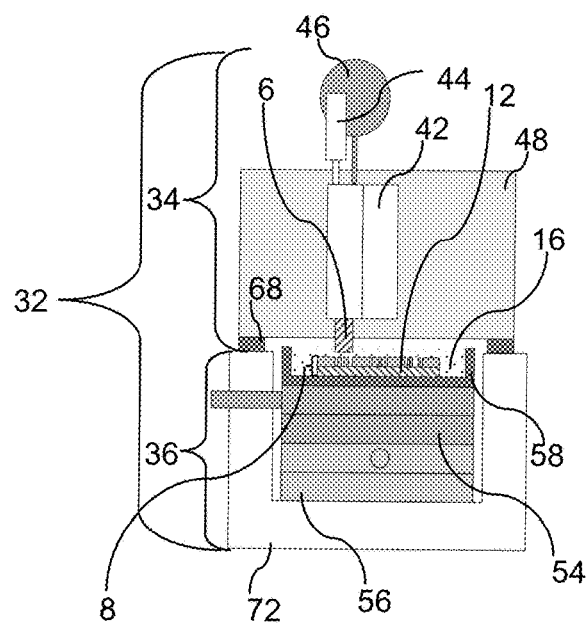
FIGS. 3A-3C schematically depict side views of various example subassemblies that may be used in manually implementing the electrochemical fabrication method depicted in FIGS. 2A-2F.
Figure 3B:
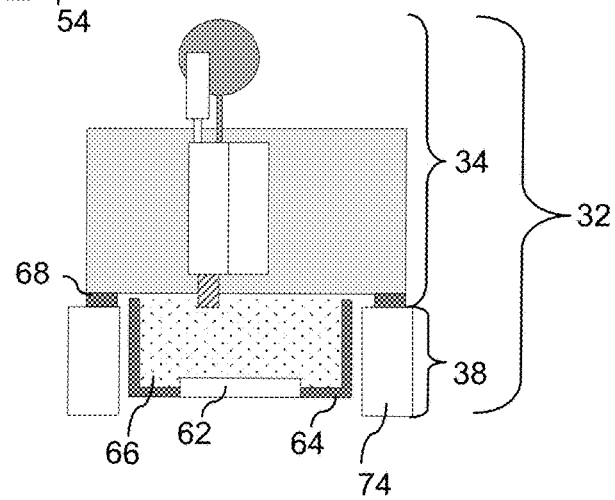
Figure 3C:
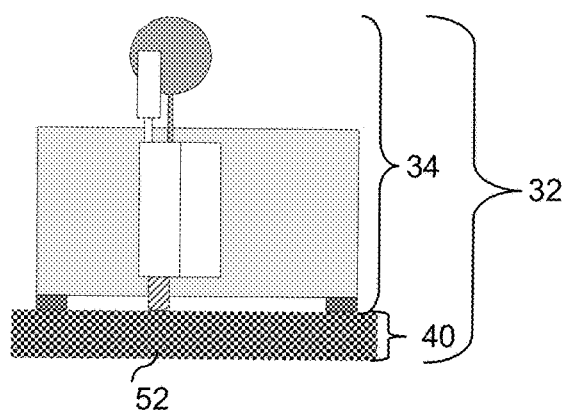

A basic process of electrochemically forming layers of multilayer three-dimensional structures was presented in FIGS. 1A-10, while FIGS. 2A-2F applied the layer forming technique to a plurality of overlaid layers (i.e. face-to-face contacting of layers regardless of whether successive layers are formed above, below, or beside previously formed layers). Various possible apparatus components were discussed with the aid of FIGS. 3A-3C. This apparatus and these processes may be used in forming structures according to some embodiments of the invention. Other apparatus and processes may also be used.

For example, in some embodiments, process variations may be used to yield cavities within the conductive structures that are filled completely or partially with a dielectric material, a conductive material embedded in a dielectric, or a magnetic material (e.g. a powdered ferrite material embedded in a dielectric binder or sintered after placement). The dielectric material(s) may be used as support structures to hold conducting elements separate from one another and/or they may be used to modify the microwave transmission or absorption properties of particular devices. A dielectric may be incorporated into the structures during a layer-by-layer buildup of the structures or may be back-filled in bulk or selectively into the structures after all layers have been formed.

As a further example, in other embodiments, it may be desirable to have a structure composed of more than one conductive material (e.g. nickel and gold or copper and gold) and as such the process variations may be implemented to accomplish this result.

Some preferred embodiments of the invention provide microminiature RF or microwave transmission lines. Such transmission lines may be used as building blocks for RF and microwave components. A preferred transmission line has a rectangular coaxial structure that includes a rectangular solid-metal center conductor and a solid metal outer conductor. When used herein, a microminiature coaxial component or line shall mean a component having a minimum cross-sectional dimension from one inside wall of the outer conductor to the opposite inside wall of the outer conductor is less than about 200 µm. Coaxial transmission line is well suited to such microminiaturization because it supports a transverse electromagnetic (TEM) fundamental mode. From fundamental electromagnetic theory, a TEM mode is known to have a zero cut-off frequency. So the TEM mode continues to propagate at any practical frequency no matter how small the dimensions of the structure.

Three benefits of microminiaturized coaxial line are size, microwave bandwidth, and phase linearity. In general, the physical length of passive transmission-line components must be of the order of one free-space wavelength at the operating frequency which is, for example, 30 cm at 1 GHz. With conventional coaxial transmission line or waveguide, this results in a component having a linear dimension of this order. With microminiature coaxial line, the component can be made much shorter by wrapping the line back and forth in a serpentine fashion and even by stacking the multiple serpentine levels of the line.

A second benefit of microminiature coax is excellent bandwidth performance. In any coaxial transmission line this is defined maximally by the cut-on frequency of the first higher-order mode, which is usually a transverse-electric (TE) mode. From fundamental electromagnetics, it is known that this cut-on frequency scales inversely with the largest dimension of the outer conductor. In conventional coax this cut-on generally occurs between 10 and 50 GHz. In microminiature coax this cut-on can easily be extended to well above 100 GHz, giving it the bandwidth to handle the highest frequencies in near-term analog systems and the sharpest pulses in digital systems.

A third benefit of microminiature coax is its degree of phase linearity. From fundamental electromagnetics, it is known that the TEM mode is the only mode on a transmission line that can propagate with zero dispersion. In other words, all frequencies within the operational bandwidth have the same phase velocity, so the dependence of relative phase between two arbitrary points on the line is perfectly linear with frequency. Because of this property, sharp nonsinusoidal features, such as sharp digital edges or short digital pulses propagate without distortion. All of the other known transmission line media at the size scale of microminiature coax (i.e., less than 200 µm) do not propagate a pure TEM mode but rather a quasi-TEM mode. A good example is the strip line commonly used in Si digital ICs or the microstrip commonly used in GaAs or InP MMICs (monolithic microwave integrated circuits).

Beside the dimension, another feature of some preferred microminiature coaxial lines is their rectangular shape cross-sectional shape. Conventional coaxial lines are generally made of circular center and outer conductors because of the relative simplicity in fabricating a circular shape (e.g., round wire) for the center conductor and a hollow tube (e.g., catheter) as the outer conductor. Fundamental electromagnetic theory shows that rectangular coax can provide very similar performance to circular coax, although analytic methods of design are lacking. Fortunately, numerical tools (e.g., high-frequency structure simulator, or HFSS, software) are now readily available which can aid in the design of components such as rectangular microminiature coax of any shape or size.

In some preferred embodiments microminiature coaxial line is used in producing ultra-compact microwave components by, at least in part, utilization of the electrochemical fabrication techniques and particularly electrochemical fabrications techniques using conformable contact masks. There is an entire family of passive microwave functions that cannot be realized in semiconductor ICs, or that can be realized only with a significant penalty in performance. A good example of a function that cannot be realized on a semiconductor IC is circulation—i.e., the nonreciprocal transmission of microwave power between neighboring ports around a loop. An example of a function with inferior IC performance is frequency multiplexing—i.e., the routing of microwave power from one input port into a number of different output ports depending on frequency. Microminiature coaxial lines may be used in forming components that can provide such functionality particularly when combined with the versatility of electrochemical fabrication processes.

In some preferred embodiments, microminiature coaxial line is integrated with active semiconductor devices, particularly RF and high-speed digital ICs. Such integration addresses a growing problem in the IC industry which is the interconnecting and routing of high-frequency analog and digital signals within chips. A good example of where such integration would be useful is in clock distribution in high speed microprocessors. Transmission of very sharp edges down conventional (stripline) transmission lines on Si invariably distorts, or spreads out, the edge because of dispersion and losses on the line. With microminiature coaxial lines, the clock signal could be coupled immediately into a single-mode coaxial structure in which the fundamental and all Fourier components of the clock pulse would propagate for long distances with the same velocity. As such, the clock pulse distortion, and associated clock skew, could be mitigated.

Figure 4A:
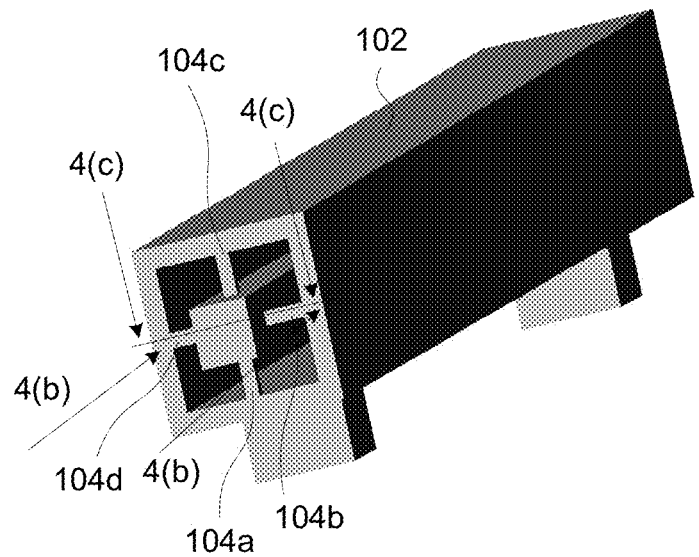
FIG. 4A depicts a perspective view of a coaxial filter element that includes shorting spokes.
Figure 4B:
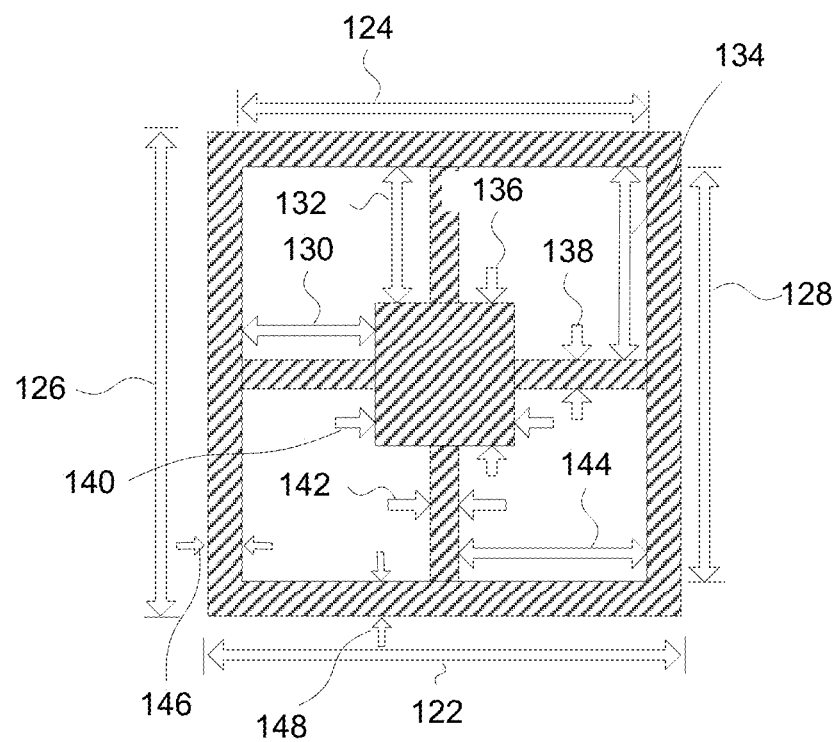
FIG. 4B depicts a plan view of the coaxial filter of FIG. 4A along lines 4B-4B
Figure 4C:
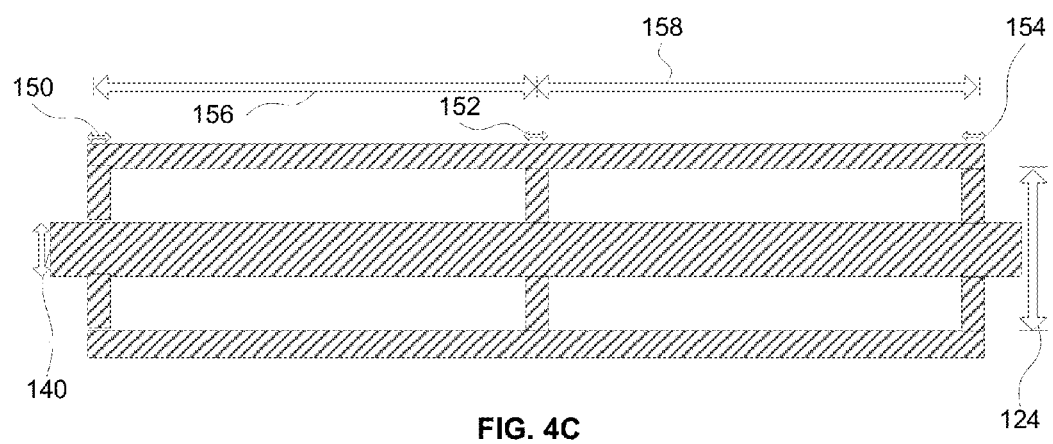
FIG. 4C depicts a plan view of the coaxial filter of FIG. 4A along lines 4C-4C.

FIGS. 4A-4C illustrate an RF/microwave filter 102 of an embodiment of the present invention. FIG. 4A depicts a perspective view of a coaxial filter element including a first set 104 of spokes 104a-104d. FIG. 4B depicts a plan view of filter 102 as viewed from lines 4(b)-4(b) of FIG. 4A. FIG. 4C depicts a plan view of the coaxial filter along lines 4(c)-4(c) of FIG. 4A. FIG. 4C illustrates that the filter of FIG. 4A includes three sets of spokes spaced apart by one-half (½) of the wavelength ($\lambda_o$) of an approximately central frequency in a band of frequencies that will be passed by the filter. In this configuration, the filter may be considered a Bragg-type filter having 2 poles (each adjacent pair of sets forming a single pole). In one example, the filter can take on the dimensions set forth in TABLE 1.

TABLE 1

| Reference | Dimension | Reference | Dimension | Reference | Dimension |
|---|---|---|---|---|---|
| 122 | 520 µm | 124 | 400 µm | 126 | 520 µm |
| 128 | 400 µm | 130 | 116 µm | 132 | 116 µm |

TABLE 1-continued

| Reference | Dimension | Reference | Dimension | Reference | Dimension |
|---|---|---|---|---|---|
| 134 | 180 µm | 136 | 168 µm | 138 | 40 µm |
| 140 | 168 µm | 142 | 40 µm | 144 | 180 µm |
| 146 | 60 µm | 148 | 60 µm | 150 | 40 µm |
| 152 | 40 µm | 154 | 40 µm | 156 | $\lambda_o/2$ |
| 158 | $\lambda_o/2$ | | | | |

In other embodiments the dimensions may be varied to change the insertion loss of the filter in the pass band, the attenuation in the stop band, and the characteristics in the transition region. In other embodiments various parameters may also be modified by varying the material or materials from which the filter and/or filter components are made. For example, the entire filter may be formed from nickel or copper, or it may be partially or entirely plated with silver or gold.

Figure 5:
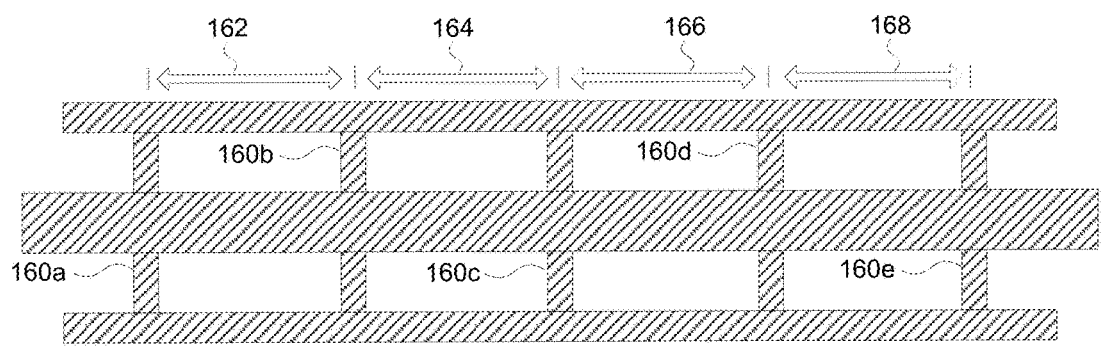

FIG. 5 depicts a plan view of the central portion of a coaxial filter of an alternative embodiment where the filter contains five sets of spokes 160a-160e (two spokes per set are depicted in this view) each spaced at about one-half the central frequency of the pass band (i.e. 162, 164, 166, and 168=$\lambda_o/2$). This figure illustrates a four pole embodiment.

In alternative embodiments other numbers of poles may be used in forming the filter (e.g. three poles or five or more poles).

Figure 6A:
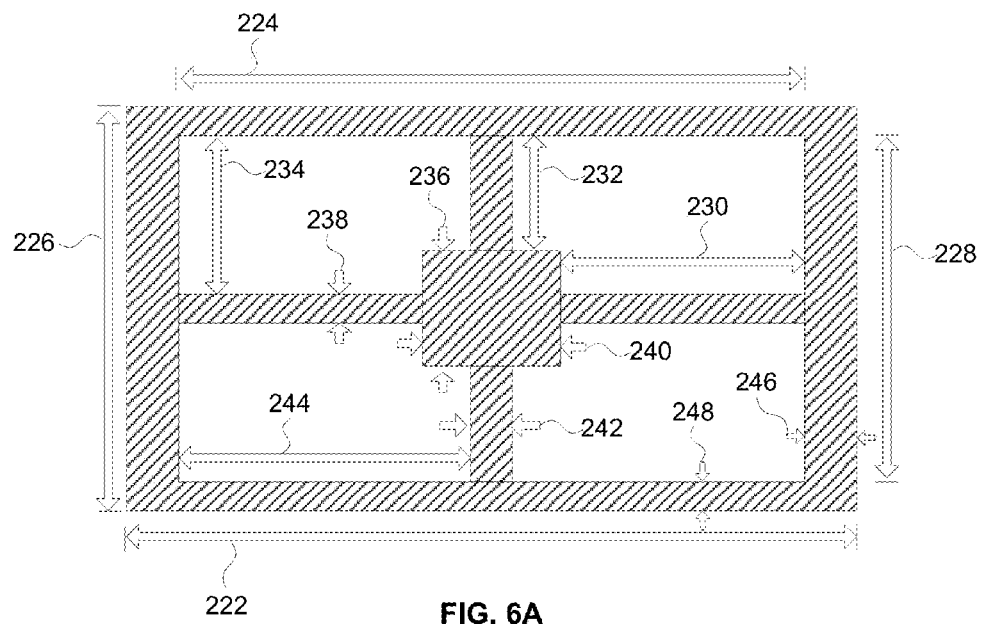
FIGS. 6A-6C depict end views, respectively, of rectangular, circular, and elliptical filter elements each using sets of spokes (four spokes per set).

FIG. 6A depicts end views of a rectangular filter that uses multiple sets of spokes with four spokes per set. In one example, the filter can take on the dimensions set forth in TABLE 2.

TABLE 2

| Reference | Dimension | Reference | Dimension | Reference | Dimension |
|---|---|---|---|---|---|
| 222 | 920 µm | 224 | 800 µm | 226 | 320 µm |
| 228 | 200 µm | 230 | 316 µm | 232 | 59 µm |
| 234 | 80 µm | 236 | 88 µm | 238 | 40 µm |
| 240 | 168 µm | 242 | 76 µm | 244 | 362 µm |
| 246 | 60 µm | 248 | 60 µm | | |

As with the square coaxial filter of FIGS. 4A-4C, the dimensions set forth above for the rectangular coaxial filter may be varied. In the most preferred embodiments of this rectangular filter the sets of spokes are spaced at about $\lambda_o/2$.

Figure 6B:
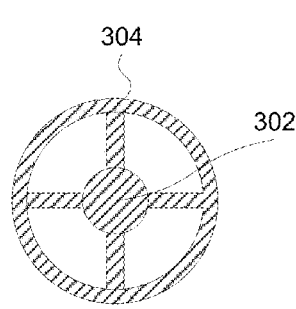
Figure 6C:
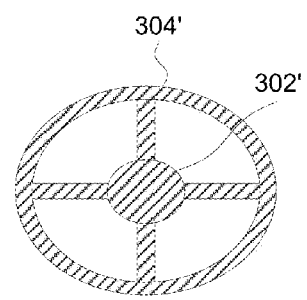

FIGS. 6B and 6C illustrate examples of two alternative cross-sectional configurations for coaxial filters of the type illustrated (i.e. a circular configuration and an elliptical configuration, respectively). In other embodiments other cross-sectional configurations are possible and even the cross-sectional configurations of the inner conductors 302 and 302' may be different from that of the outer conductors 304 and 304'. In still other embodiments the spokes may take on different cross-sectional configurations (square, rectangular, circular, elliptical, and the like).

Figure 7A:
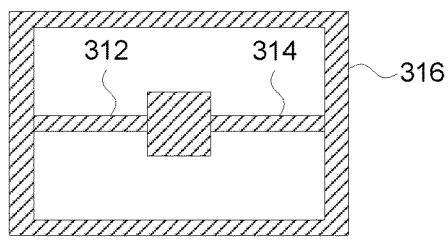
FIG. 7A-7D depict examples of alternative spoke configurations that may be used in filtering components.
Figure 7B:
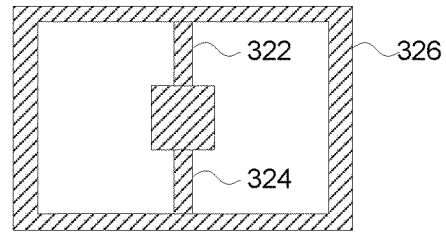
Figure 7C:
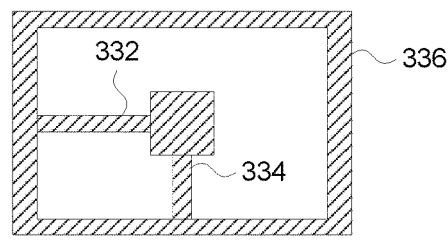
Figure 7D:
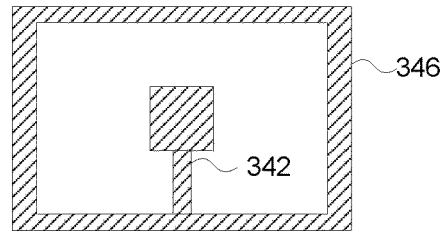

FIGS. 7A-7D depict examples of alternative spoke configurations that may be used in coaxial filters. FIG. 7A illustrates an embodiment where only two spokes 312 and 314 are used and extend in the longer cross-sectional dimension of the rectangular outer conductor 316 and maintain the symmetry of the configuration. FIG. 7B illustrates a similar two spoke embodiment to that of FIG. 7A with the exception that the spokes 322 and 324 extend in smaller cross-sectional dimension of the outer conductor 326. FIG. 7C illustrates an embodiment where two spokes are still used as in FIGS. 7A and 7B where one spoke 332 extends in the horizontal dimension (i.e. the major dimension of the rectangular outer conductor 336) and one spoke 334 extends in the vertical dimension (i.e. the minor dimension of the rectangular outer conductor 336). In FIG. 7D only a single spoke 342 makes up each set.

As an example, the embodiment of FIG. 7A may take on the dimensions set forth in TABLE 2 above with the exception of dimensions 242, and 244 that do not exist in this configuration. As another example, the embodiment of FIG. 7A may take on the dimensions set forth in TABLE 3 where the reference numerals have been modified to include apostrophes.

TABLE 3

| Reference | Dimension | Reference | Dimension | Reference | Dimension |
|---|---|---|---|---|---|
| 222' | 720 μm | 224' | 600 μm | 226' | 420 μm |
| 228' | 300 μm | 230' | 175 μm | 232' | 87 μm |
| 234' | 130 μm | 236' | 125 μm | 238' | 40 μm |
| 240' | 250 μm | 246' | 60 μm | 248' | 60 μm |

In alternative embodiments, other spoke numbers (e.g. three or five) and configurations (e.g. multiple spokes extending from a single side of the conductor, not all spokes extending radically outward from the inner conductor to the outer conductor) may exist.

Figure 8A:
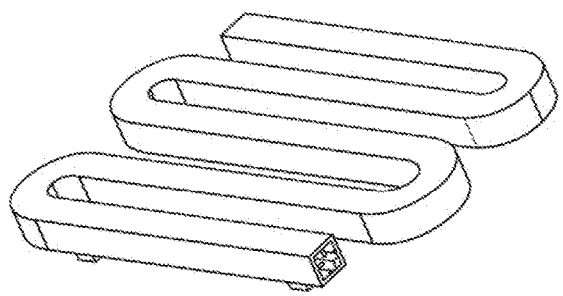
FIGS. 8A and 8B illustrate perspective views of curved coaxial filter components.
Figure 8B:
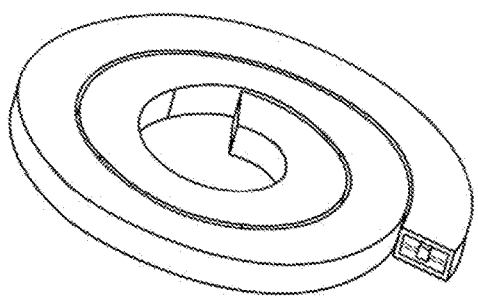

FIGS. 8A and 8B illustrate perspective views of non-liner coaxial filter components according to other embodiments of the invention. FIG. 8A depicts an extended serpentine shape while FIG. 8B depicts a spiraled configuration. In still other alternative embodiments other configurations may be used that take an entry and exit port out of the plane of the winding structure or even cause the winding in general to be stacked or extend in three-dimensions. Such three dimensional stacking may lead to more compact filter designs than previously obtainable.

Figure 9A:
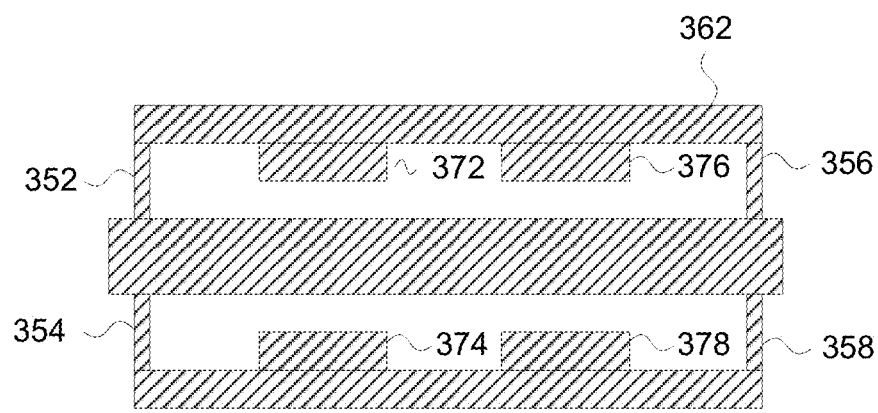
FIGS. 9A-9C depict alternative coaxial filter components that use protrusions along the inner or outer conductor to aid in filtering of signals.
Figure 9B:
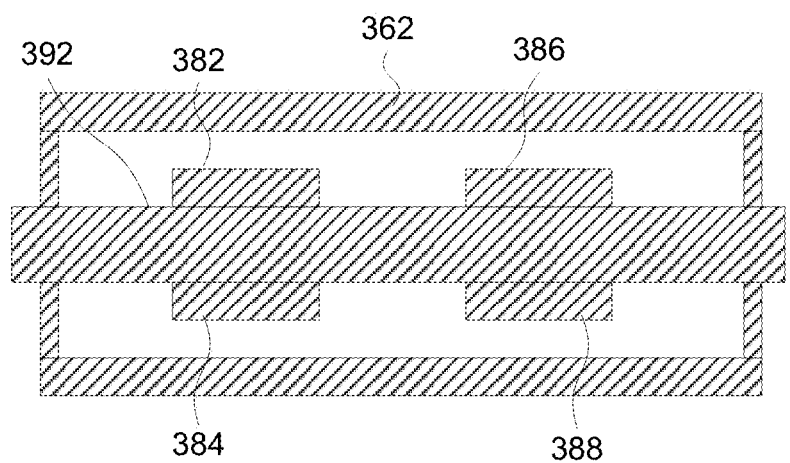
Figure 9C:
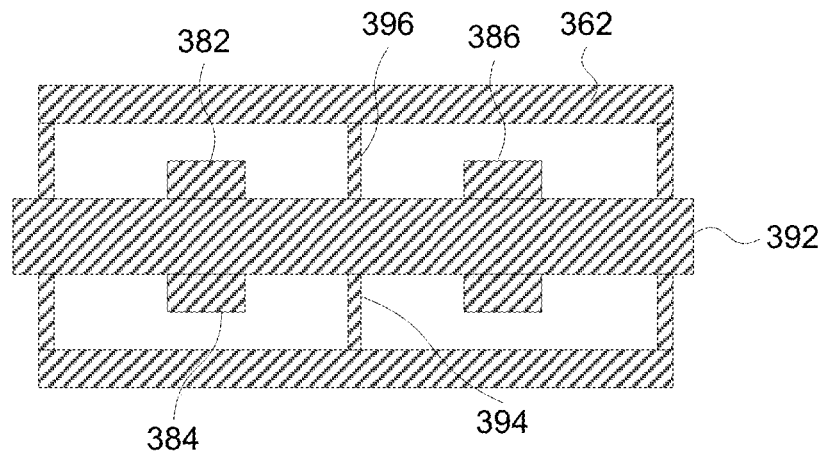

FIGS. 9A-9C depict alternative embodiments of coaxial filter components that use a combination of spokes and either protrusions along the inner or outer conductor to aid in filtering RF or microwave signals. In particular FIG. 9A illustrates an embodiment where spokes 352, 354, 356, and 358 are included at the end of the outer conductor 362 while intermediate to the ends of the outer conductor protrusions 372, 374, 376, and 378 are included on the interior surface of the outer conductor and are preferably about one-quarter of the wavelength (λo/4) in length and spaced by about one-half the wavelength (λo/2). In alternative embodiments, the recesses in the outer conductor 362 may be considered as opposed to protrusions. In the embodiment of FIG. 9A the spokes are not spaced from each other by λo/2 as in previous embodiments but instead are spaced by an integral multiple of λo/2. In the embodiment depicted the integral multiple is three.

FIG. 9B illustrates another alternative embodiment where the spacing between spokes are a non-unity integral multiple of λo/2 and at the intermediate λo/2 positions protrusions 382, 384, 386, and 388 (of length approximating λo/2) are included on the inner conductor 392.

FIG. 9C illustrates a third alternative embodiment where not only are protrusions included on the inner conductor but an additional intermediate set of spokes 394 and 396 is also included. The most preferred spacing between each successive set of filter elements remains approximately λo/2.

In further embodiments other configurations of spokes, protrusions, and/or indentations are possible. In some embodiments, it may be acceptable to space the successive filter elements (e.g. spokes, protrusions, and/or indentations) at integral multiples of λo/2.

In the embodiments of FIGS. 4A-9D, the spokes provided in the structures may provide sufficient support for the inner conductor such that no dielectric or other support medium is needed. As such, in the most preferred embodiments the inner conductor is separated from the outer conductor by an air gap or other gaseous medium or by an evacuated space. In other embodiments a solid or even liquid dielectric material may be inserted partially within or completely within the gap between the inner and outer conductors. The insertion of the dielectric may occur after formation of the conductors or may be formed in situ with the formation of the conductors. Various example implementation processes will be discussed hereafter.

Figure 9D:
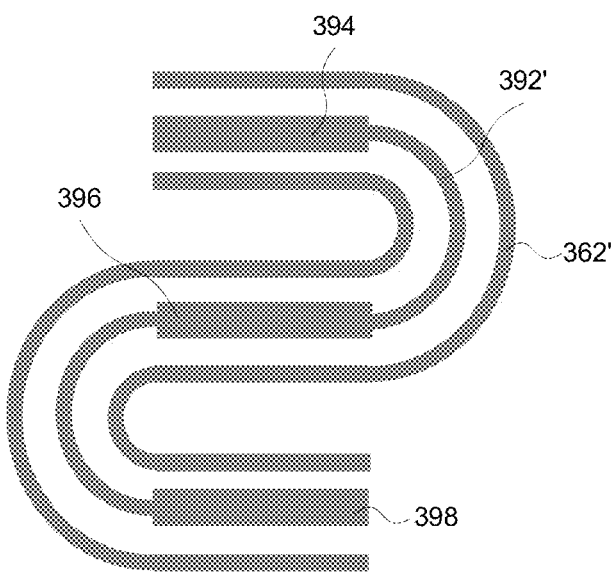
FIG. 9D depicts a plan view of the central portion, along the length, of an S-shaped two pole coaxial filter.

FIG. 9D depicts a plan view of the central portion, along the length, of a serpentine-shaped two pole coaxial filter. In this embodiment no spokes are used but only protrusions 394, 396, and 398 on the inner conductor 392' are used to provide the filtering effect. In alternative embodiments protrusions on the inside of portion of the outer conductor 362' may be used or a combination of protrusions on the inside and outside conductor may be used. As no spokes are used, the inner conductor's position is not fixed relative to the outer conductor. Various embodiments will be discussed hereafter that will allow for the formation of a dielectric between the inner and outer conductors during buildup of the conductive materials. Various other embodiments will also be discussed that allow for the transition from a conductive support used during layer-by-layer build up to a complete or partial formation of a solid dielectric in between the inner and outer conductors.

Figure 10A:
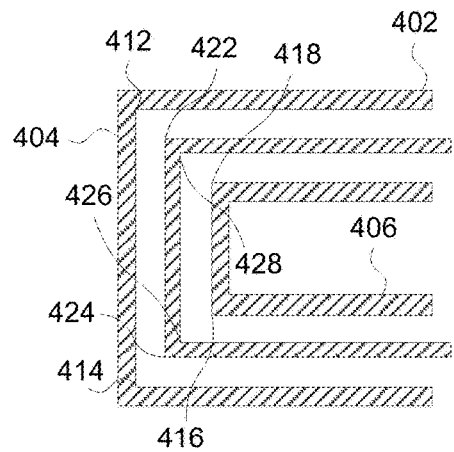
FIGS. 10A-10D depict plan views of the central portion, along the length of horseshoe-shaped coaxial transmission lines with varying degrees of mitering.
Figure 10B:
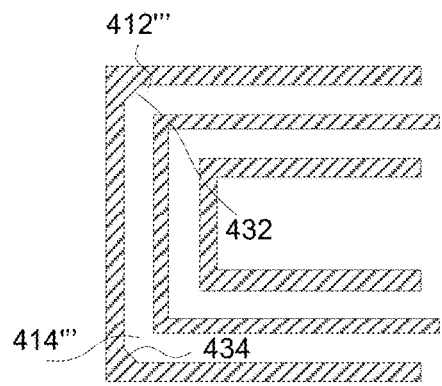
Figure 10C:
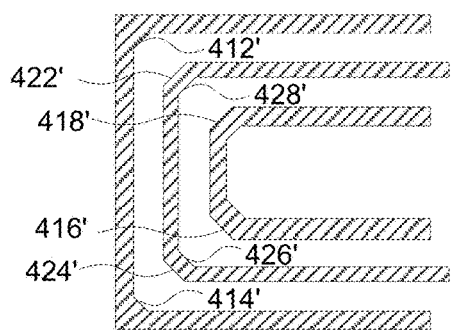
Figure 10D:
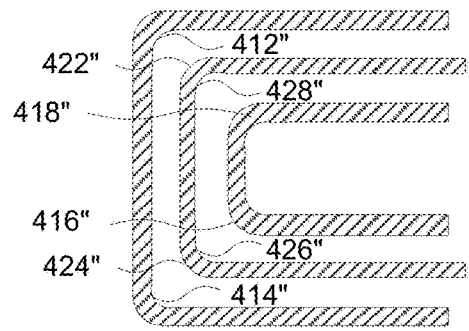

FIGS. 10A-10D depict plan views of the central portion, along the length of coaxial elements that include sharp transitions in direction of radiation propagation. According to the production methods of the present invention miter bends of varying degrees can be inserted into coaxial components as well as waveguide components with little concern for the geometric complexity of the design or for the accessibility of tooling to reach the locations to be mitered. FIG. 10A depicts transitions from one coaxial segment 402 to another coaxial segment 404 and then again to another coaxial segment. In this Figure the transitions 412, 414, 416, 418, 422, 424, 426, and 428 are shown as 90° transitions and it is anticipated that significant reflection could result from these sharp turns. FIG. 10B illustrates the use of mitered facets 432 and 434 at transitions 412''' and 414''' to help reduce the losses (e.g. reflections). FIG. 10C depicts mitered facets for all transitions 412', 414', 416', 418', 422', 424', 426', and 428' which are believed to help further reduce losses. In still further embodiments the facet length can be extended (e.g. the lengths of the facets at 412 and 414) to ensure that a larger portion of the impinging radiation strikes with a non-90° incident angle. FIG. 10D illustrates that multiple facets may be applied to each transition region 412'', 414'', 416'', 418'', 422'', 424'', 426'', and 428''. The mitering effects according to the present production methods are not only applicable to coaxial components (e.g. transmission lines, filters, and the like) but are also applicable to waveguides (e.g. waveguides with internal dimensions under 800 μm, under 400 μm, or even with smaller dimensions, or larger waveguides where propagation paths are complex and monolithic structures are desired to reduce size and or assembly difficulties).

Figure 11A:
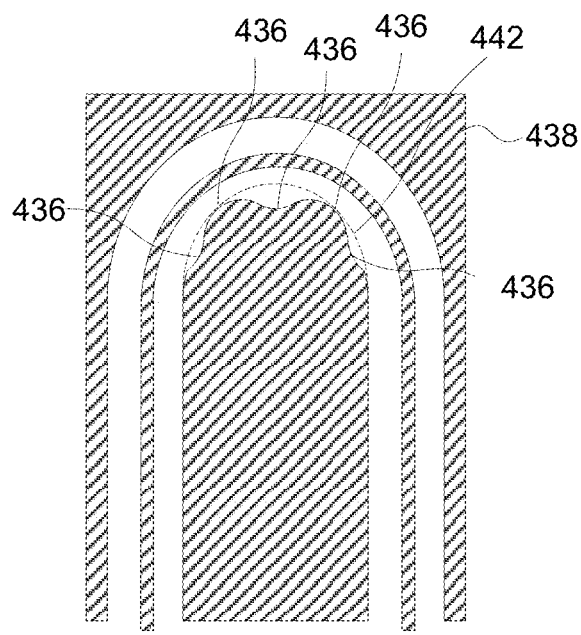
FIGS. 11A and 11B depict, respectively, plan views along the central portions of a coaxial transmission line and a coaxial filter component where wave-like oscillations are included on the inside surface of the smaller radius side of the coaxial line.
Figure 11B:
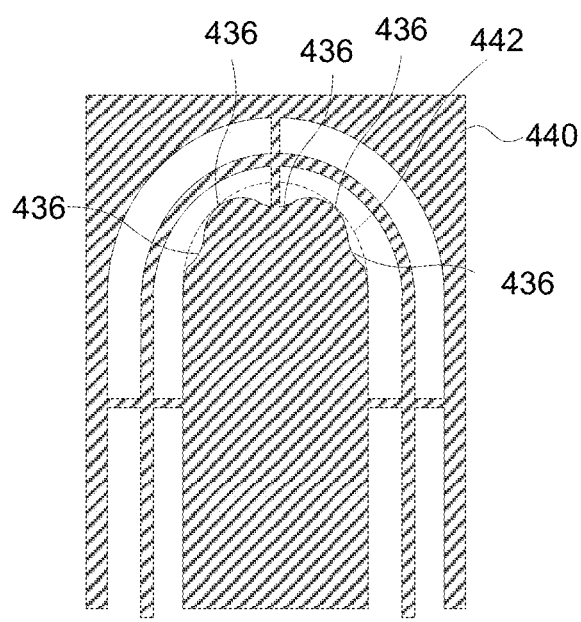

FIGS. 11A and 11B depict, respectively, plan views along the central portions of a coaxial transmission line 438 and a coaxial filter component 440 where perturbations 436 are included on the inside surface of the smaller radius side of the coaxial line. The perturbations may be smooth and wave-like or they may be of a more discontinuous configuration. It is intended that the perturbations increase the path length along the side having the smaller nominal radius such that the path length is closer to that of the path length along the outer wall then it would be if the surface having the smaller nominal radius were a simple curve 442. In alternative embodiments the central conductor may also be modified with path length perturbations.

Figure 12A:
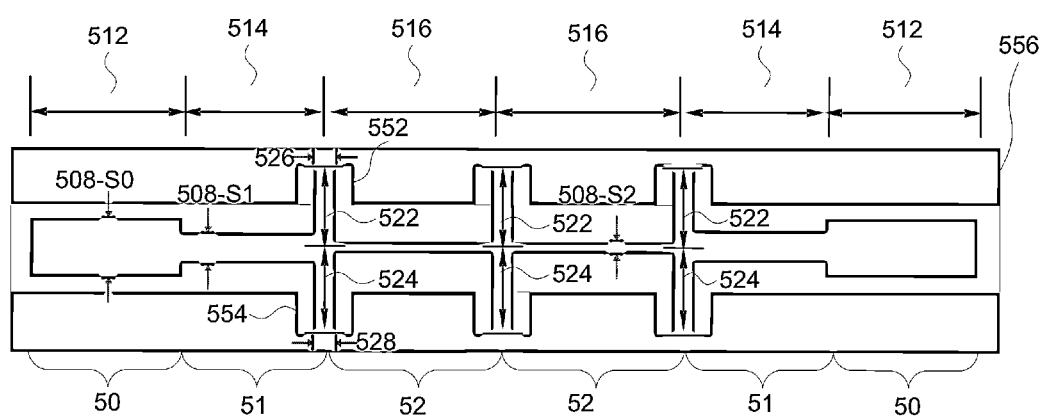
FIG. 12A depicts a plan view (from the top) of the central portion, along the length, of a linear three-pole band pass coaxial filter using pairs of stubs to form each pole.
Figure 12B:
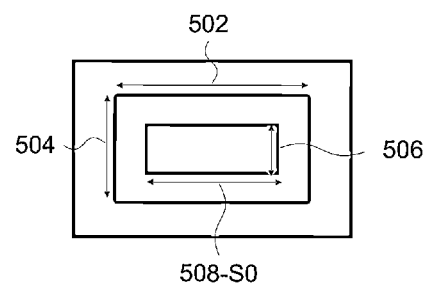
FIG. 12B depicts an end view of the filter of FIG. 12A illustrating the rectangular configuration of the structure.
Figure 12C:
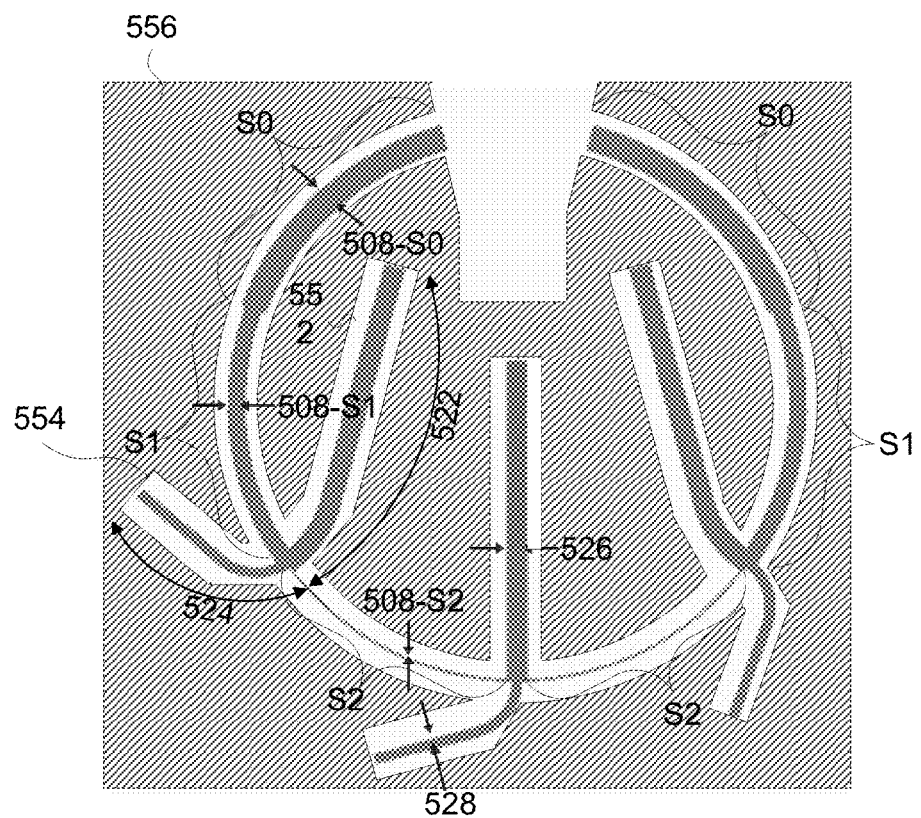
FIG. 12C depicts a plan view (from the top) of the central portion, along the length of a curved three-pole band pass coaxial filter with stub supports.

FIGS. 12A-12C depict a coaxial three-pole stub-based filter of an alternative embodiment of the invention. FIG. 12A depicts a plan view (from the top) of the central portion, along the length of the filter. FIG. 12(b) depicts an end view of the filter of FIG. 12A illustrating the rectangular configuration of the structure. FIG. 12C depicts a plan view of a circular version of the filter of FIGS. 12A and 12B. In one example, the filter of FIGS. 12A-12C can take on the dimensions set forth in TABLE 4.

TABLE 4

| Reference | Dimension | Reference | Dimension | Reference | Dimension |
|---|---|---|---|---|---|
| 502 | 300 μm | 504 | 300 μm | 506 | 25 μm |
| 508-S0 | 245 μm | 508-S1 | 165 μm | 508-S2 | 25 μm |
| 512 | $\lambda_o/4$ (250 mm) | 514 | $\lambda_o/4$ (250 mm) | 516 | $\lambda_o/4$ (250 mm) |
| 522 | 3.00 mm | 524 | 1.64 mm | 526 | 200 μm |
| 528 | 100 μm | | | | |

Each pair of stubs 522 and 524 provide a capacitive and an inductive reactance, respectively, whose combination provides a pole of the filter. Each stub is shorted to the outside conductor 556 at the end of its side channel 552 and 554 respectively. The spacing between the poles preferably approximates one-quarter of the wavelength ($\lambda_o/4$) of the central frequency of the desired pass band of the filter. The lengths of the stubs are selected to provide a capacitive reactance (e.g. something longer than $\lambda_o/4$) and an inductive reactance (something shorter than $\lambda_o/4$). In alternative embodiments it is believed that spacing between the poles may be expanded to an integral multiple of $\lambda_o/4$, other filtering elements may be added into the component (e.g. spokes, protrusions, and the like).

In other embodiments the dimensions may be varied to change the insertion loss of the filter in the pass band, the attenuation in the stop band, and the characteristics in the transition region as well as in the pass band regions. In this other embodiments various parameters may also be modified by varying the material or materials from which the filter and/or filter components are made. For example, the entire filter may be formed from nickel or copper, or it may be partially or entirely plated with silver or gold.

In alternative embodiments it may be possible to form each pole from one shorted stub (providing a shunt inductance) and one open stub (providing a shunt capacitance) that terminates short of the end of the channel (e.g. into a dielectric) wherein the capacitive stub may be able to be shortened due to its open configuration.

Figure 13:
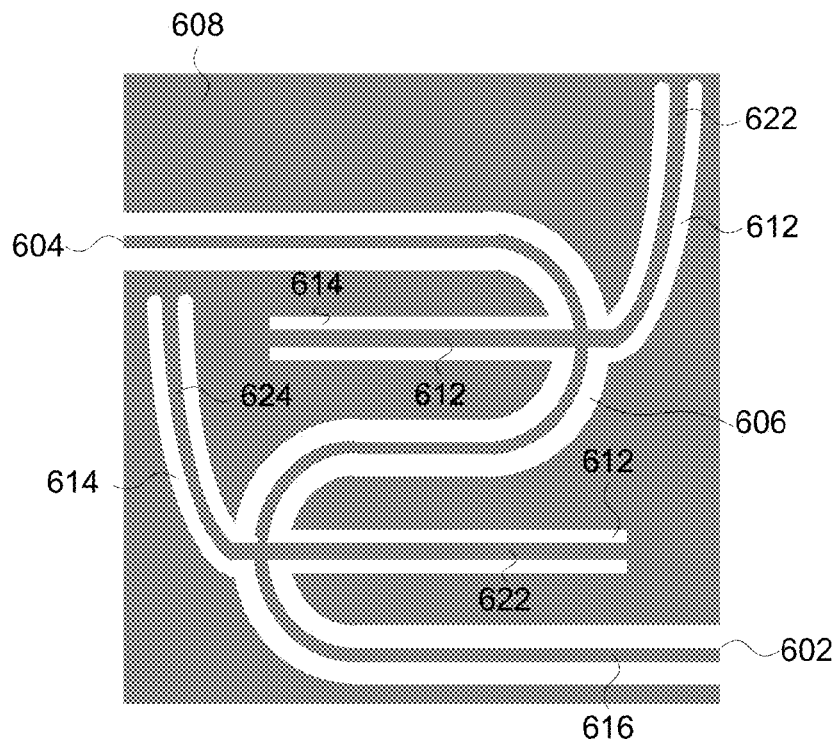
FIG. 13 depicts a plan view (from the top) of the central portion, along the length of an S-shaped two-pole band pass coaxial filter with stub supports.

FIG. 13 depicts a plan view (from the top) of the central portion, along the length of an S-shaped two-pole stub based band pass coaxial filter. Entry port 602 and exit port 604 are connected by a passage 606 in outer conductor 608 from which two pairs of channels 612 and 614 extend. Down the center of passage 606 an inner conductor 616 extends and from which two pairs of stubs 622 and 624 extend until they short into the outer conductor 608 at the ends of channels 612 and 614 respectively.

Figure 14A:
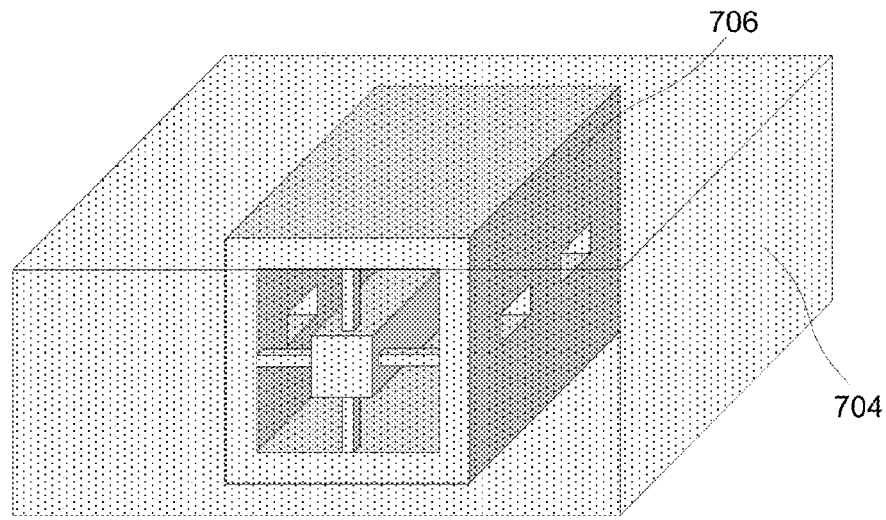
FIGS. 14A and 14B depict perspective views of coaxial filter elements embedded in sacrificial material and released from the sacrificial material, respectively, where the outer conductor of the coaxial components includes holes (in other than the intended microwave entrance and exit openings).
Figure 14B:
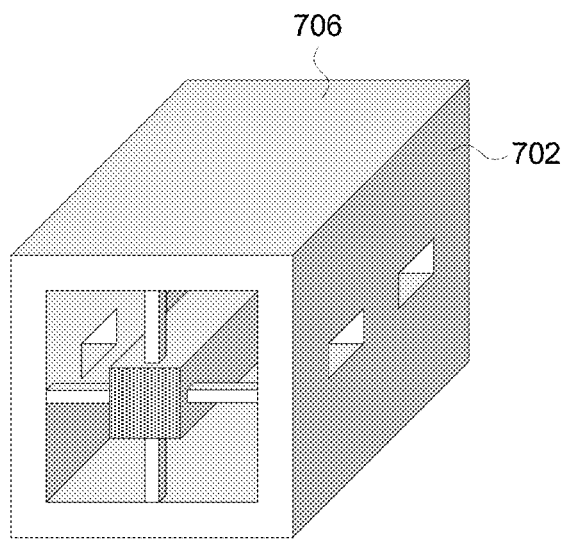

FIGS. 14A and 14B depict perspective views of coaxial filter elements having a modified design that includes openings (e.g. channels) along the length of the outer conductor where the openings are not intended to provide radiation entry or exit ports. In some of the production embodiments of the present invention such openings can aid in the release of a structural material 702 from a sacrificial material 704 that may have been deposited within the small cavities and channels within the outer conductor. In certain embodiments where chemical etching of the sacrificial material 704 is to occur, such holes may aid in allowing the etchant to get into the small cavities and channels. In other embodiments where a sacrificial material is to be separated from a structural material by melting and flowing the opening may not be needed but if located at selected locations (e.g. near the ends of blind channels and the like) the openings may allow appropriately supplied pressure to aid in the removal of the sacrificial material. FIG. 14A depicts a perspective view of the component 706 formed from structural material embedded in and filled by sacrificial material. FIG. 14B depicts a perspective view of the component 706 separated from the sacrificial material.

Figure 15A:
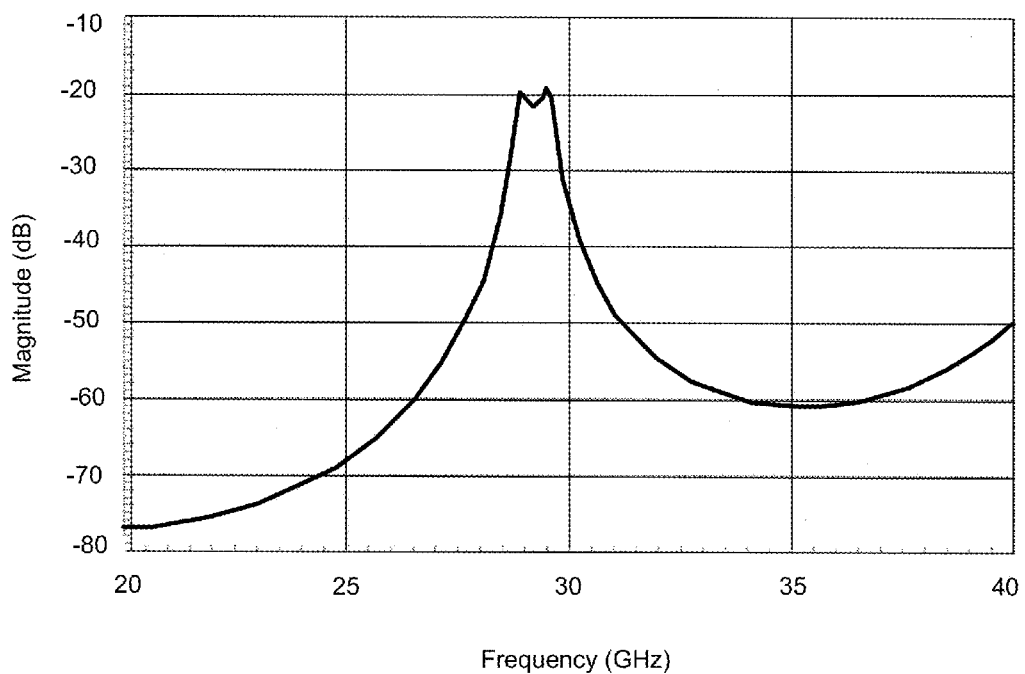
FIGS. 15A-15D illustrate plots of transmission versus frequency according to mathematical models for various filter designs.

FIGS. 15A-15D illustrate plots of transmission versus frequency according to mathematical models for various filter designs discussed above. FIG. 15A depicts a modeled transmission plot for a 2 pole filter (three sets of spokes) having a configuration similar to that of FIG. 7A and made from nickel. The dimensions of the component are set forth in Table 5. As can be seen from the FIG. 15A the band pass of the filter is centered around 28 GHz with an insertion loss of about 20-22 dB in the pass band and an insertion loss in the stop band ranging from about 61-77 dB.

TABLE 5

| Feature | Dimension |
|---|---|
| Inside width of the outer conductor | 600 μm |
| Inside Height of the outer conductor | 300 μm |
| Width of the central (i.e. inner) conductor | 250 μm |
| Height of the central (i.e. inner) conductor | 75 μm |
| Height of the horizontally extending spokes | 40 μm |
| Thickness (i.e. dimension into the page) of he horizontally extending spokes | 100 μm |
| Spacing between successive sets of spokes | ~5-5.5 mm |

Figure 15B:
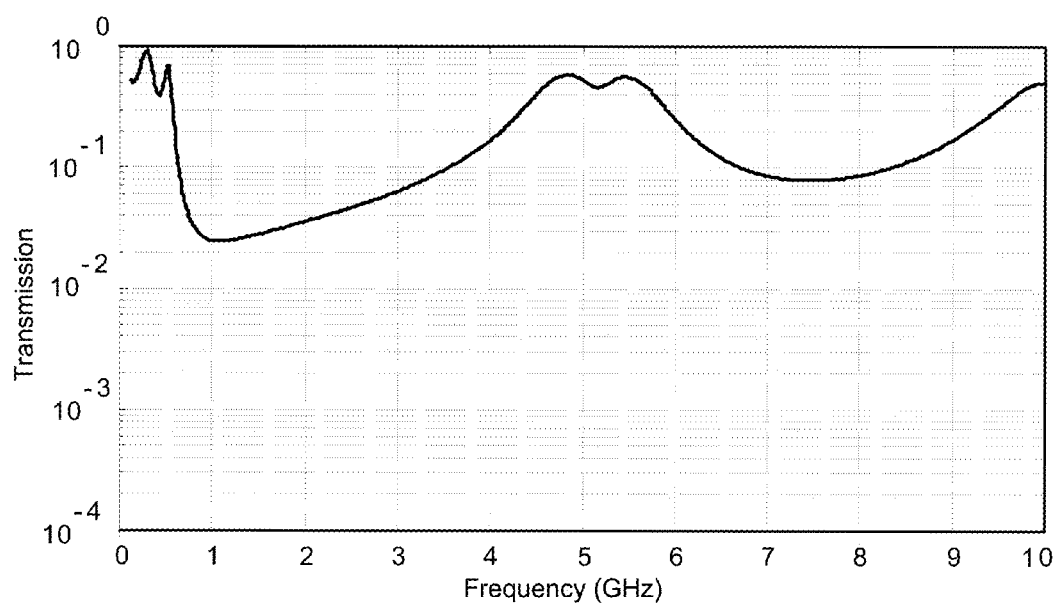

FIG. 15B depicts a model transmission plot for a 2 pole filter (three sets of protrusion on the inner conductor) as shown in FIG. 9D where the length of each protrusion is approximately $\lambda_o/4$ and the center-to-center spacing of the protrusions is approximately $\lambda_o/4$ having a configuration similar to that of FIG. 7A and made from nickel. The inside diameter of the outer conductor is about 240 μm, the diameter of the central conductor transitions between 20 μm and 220 μm with the protrusions having a length of about 15 mm and a center-to-center spacing of about 30 mm. From FIG. 15B the band pass is centered around 5 GHz with an insertion loss of 5-6 dB and an insertion loss in the stop band of about 13-18 dB.

Figure 15C:
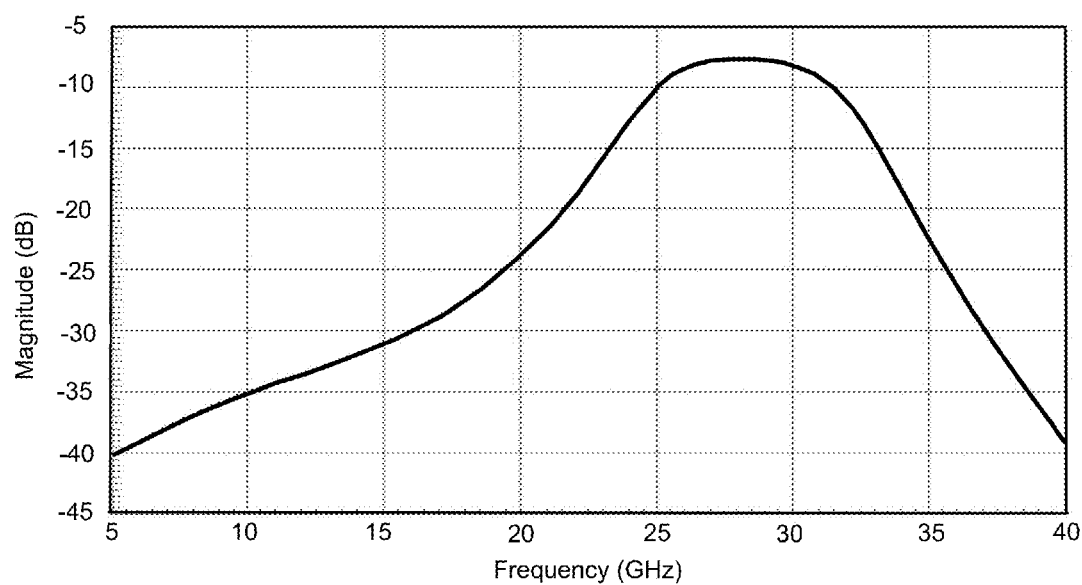
Figure 15D:
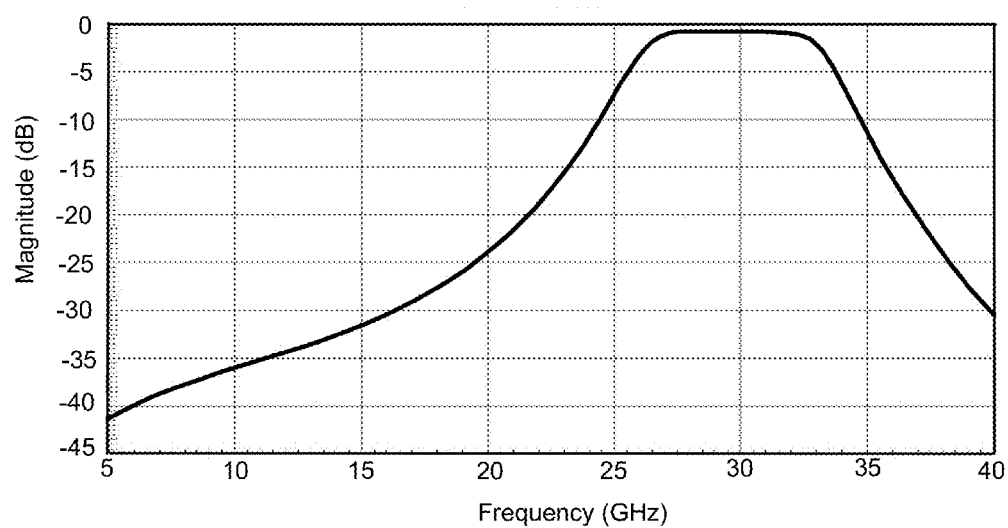

FIGS. 15C and 15D depict model transmission plots for filters configured according to structures and dimensions for FIGS. 12A-12C where the structural material is nickel for FIG. 15C and is gold plated nickel for FIG. 15D. FIG. 15C indicates an insertion loss on the order of 7-8 dB in the band pass region while FIG. 15D indicates a corresponding 1-2 dB insertion loss.

Figure 16:
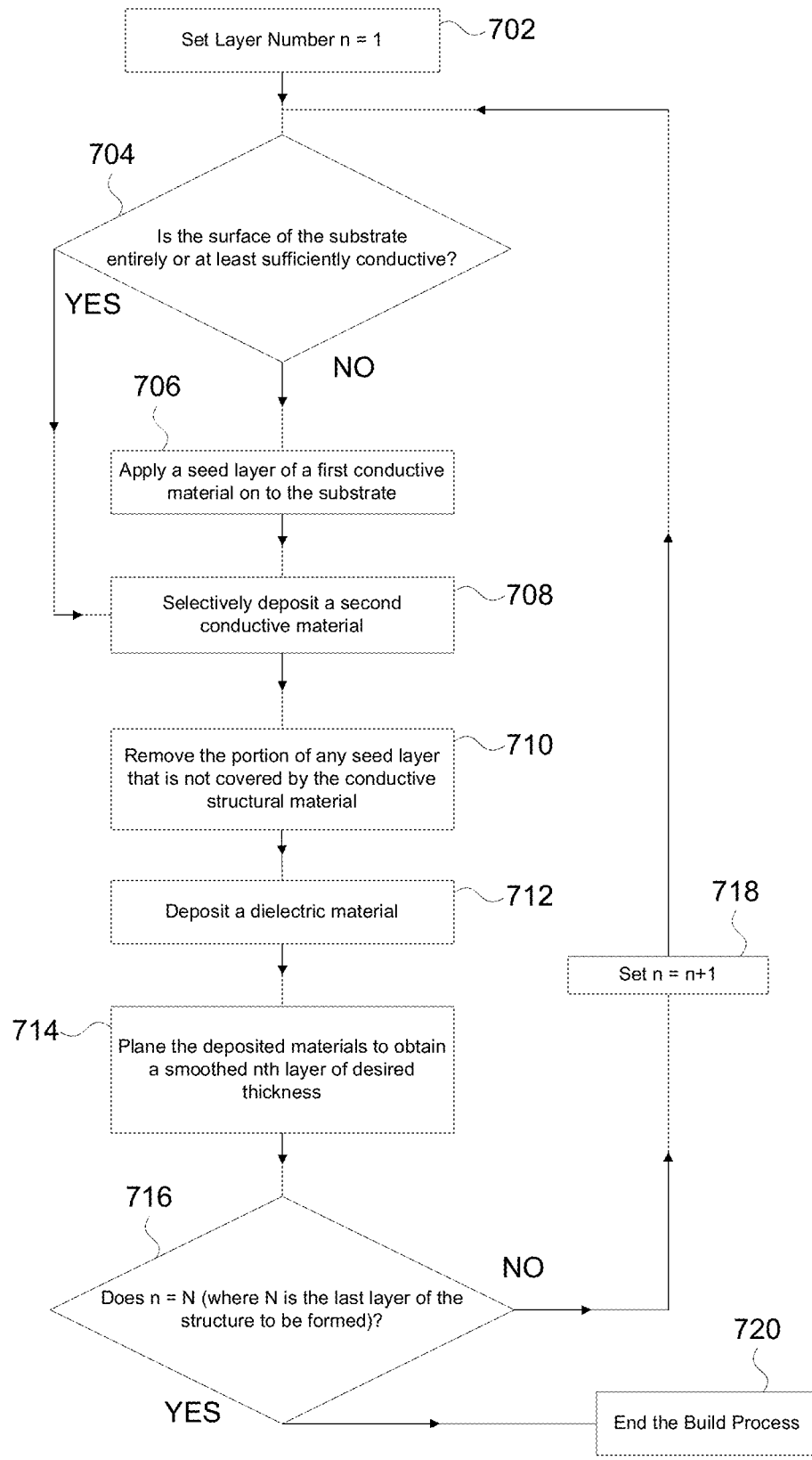
FIG. 16 depicts a flowchart of a sample electrochemical fabrication process that uses a single conductive material and a single dielectric material in the manufacture of a desired device/structure.

FIG. 16 provides a flow chart of an electrochemical fabrication process that builds up three-dimensional structures from a single conductive material and a single dielectric material that are deposited on a layer-by-layer basis.

The process of FIG. 16 begins with block 702 where a current layer number, n is set to a value of 1. The formation of the structure/device will begin with layer 1 and end with a final layer, N.

After setting the current layer number, the process moves forward to decision block 704 where an inquiry is made as to whether or not the surface of the substrate is entirely conductive or at least sufficiently conductive to allow electrodeposition of a conductive material in desired regions of the substrate. If material is only going to be deposited in a region of the substrate that is both conductive and has continuity with a portion of the substrate that receives electrical power, it may not be necessary for the entire surface of the substrate to be conductive. In the present embodiment, the term substrate is intended to refer to the base on which a layer of material will be deposited. As the process moves forward the substrate is modified and added to by the successive deposition of each new layer.

If the answer to the inquiry is "yes", the process moves forward to block 708, but if the answer is "no" the process first moves to block 706 which calls for the application of a seed layer of a first conductive material on to the substrate. The application of the seed layer may occur in many different ways. The application of the seed layer may be done in a selective manner (e.g. by first masking the substrate and then applying the seed layer and thereafter removing the mask and any material that was deposited thereon) or in a bulk or blanket manner. A conductive layer may be deposited, for example, by a physical or chemical vapor deposition process. Alternatively it may take the form of a paste or other flowable material that can be solidified or otherwise bonded to the substrate. In a further alternative it may be supplied in the form of a sheet that is adhered to or otherwise bonded to the substrate. The seed layer is typically very thin compared to the thickness of electrodeposition that will be used in forming the bulk of a layer of the structure.

After application of the seed layer, the process moves forward to block 708 which calls for the deposition of a second conductive material. The most preferred deposition process is a selective process that uses a dielectric CC mask that is contacted to the substrate through which one or more openings exist and through which openings the conductive material can be electrodeposited on to the substrate (e.g. by electroplating). Other forms of forming a net selective deposit of material may also be used. In various alternatives of the process, the first and second conductive materials may be different or they may be the same material. If they are the same the structure formed may have more isotropic electrical properties, whereas if they are different a selective removal operation may be used to separate exposed regions of the first material without damaging the second material.

The process then moves forward to block 710 which calls for removing the portion of the seed layer that is not covered by the just deposited conductive material. This is done in preparation for depositing the dielectric material. In some embodiments, it may be unnecessary to remove the seed layer in regions where it overlays the conductive material deposited on an immediately preceding layer but for simplicity in some circumstances a bulk removal process may still be preferred. The seed layer may be removed by an etching operation that is selective to the seed layer material (if it is different from the second conductive material). In such an etching operation, as the seed layer is very thin, as long as reasonable etching control is used, little or no damage should result to the seed layer material that is overlaid by the second conductive material. If the seed layer material (i.e. the first conductive material) is the same as the second conductive material, controlled etching parameters (e.g. time, temperature, and/or concentration of etching solution) should allow the very thin seed layer to be removed without doing any significant damage to the just deposited second conductive material.

Next the process moves forward to block 712 which calls for the deposition of a dielectric material. The deposition of the dielectric material may occur in a variety of ways and it may occur in a selective manner or in a blanket or bulk manner. As the process of the present embodiment forms planarized composite layers that include distinct regions of conductive material and distinct regions of the dielectric material, and as any excess material will be planed away, it does no harm (other than that associated with potential waste) to blanket deposit the dielectric material and in fact will tend to offer broader deposition possibilities. The deposition of the dielectric material may occur by spraying, sputtering, spreading, jetting or the like.

Next, the process proceeds to block 714 which calls for planarization of the deposited material to yield an nth layer of the structure having desired net thickness. Planarization may occur in various manners including lapping and/or CMP.

After completion of the layer by the operation of block 714, the process proceeds to decision block 716. This decision block inquires as to whether the nth layer (i.e. the current layer is the last layer of the structure (i.e. the Nth layer), if so the process moves to block 720 and ends, but if not, the process moves to block 718.

Block 718 increments the value of "n", after which the process loops back to block 704 which again inquires as to whether or not the substrate (i.e. the previous substrate with the addition of the just formed layer) is sufficiently conductive.

The process continues to loop through blocks 704-718 until the formation of the Nth layer is completed.

Figure 17A:
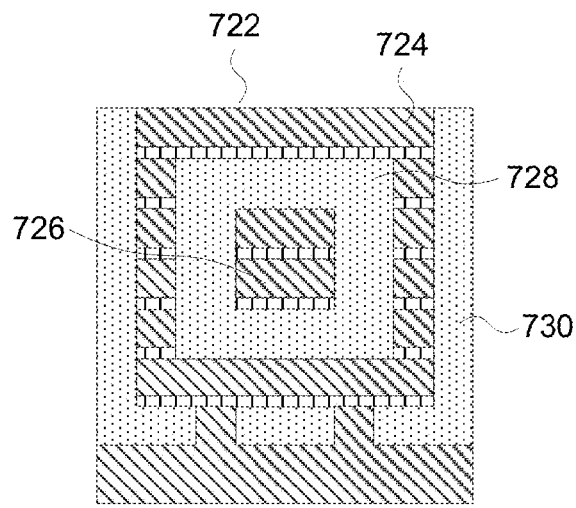
FIG. 17A depicts an end view of a coaxial structure that can be produced using the process of FIG. 16.

FIG. 17A depicts an end view of a coaxial structure 722 that includes an outer conductive element 724, and inner conductive element 726, an embedded dielectric region 728 and an external dielectric region 730. In some embodiments that extend the process of FIG. 16, it may be possible to use post-process (i.e. process that occur after the deposition of all layers) operations to remove a portion or all of the dielectric from region 730 and a portion or all of the dielectric from region 728 under the assumption that such removal from region 728 would be done in such a way as to ensure adequate support for the inner conductive element 726.

Figure 17B:
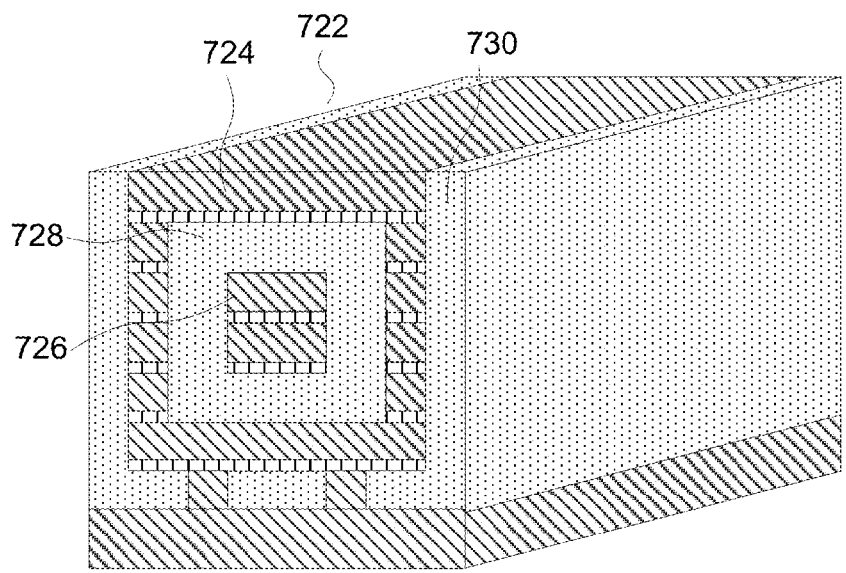
FIG. 17B depicts a perspective view of the coaxial structure of FIG. 17A
Figure 18A:
FIGS. 18(*a*)-18(*j*) illustrate application of the process flow of FIG. 16 to form the structure of FIGS. 17A and 17B.
Figure 18B:
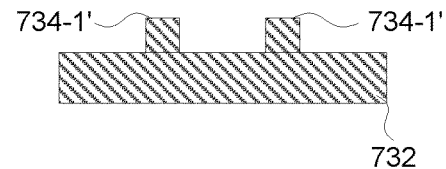
Figure 18C:
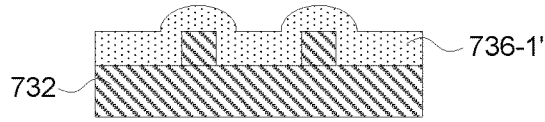
Figure 18D:
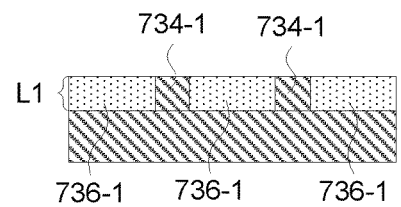

FIGS. 18A-18J illustrate application of the process flow of FIG. 16 to form a structure similar to that depicted in FIGS. 17A and 17B. FIGS. 18A-18J depict vertical plan views displaying a cross-section of the structure as it is being built up layer-by-layer. FIG. 18A depicts the starting material of the process (i.e. a blank substrate 732 onto which layers will be deposited). FIG. 18B depicts the resulting selectively deposited second conductive material 734-1' for the first layer. In beginning this process it was assumed that the supplied substrate was sufficiently conductive to allow deposition without the need for application of a seed layer. FIG. 18C illustrates the result of a blanket deposition of the dielectric material 736-1' (according to operation/block 712) while FIG. 18D illustrates the formation of the completed first layer L1 as a result of the planarization operation of operation/block 714. The first completed layer has a desired thickness and distinct regions of conductive material 734-1 and dielectric material 736-1.

Figure 18E:
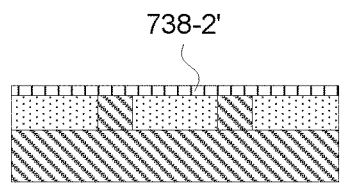
Figure 18F:
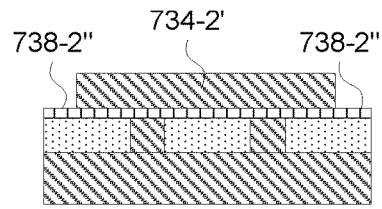
Figure 18G:
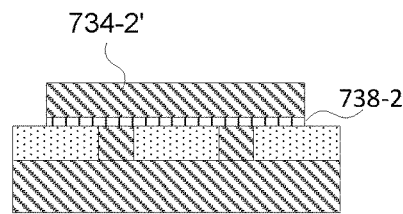
Figure 18H:
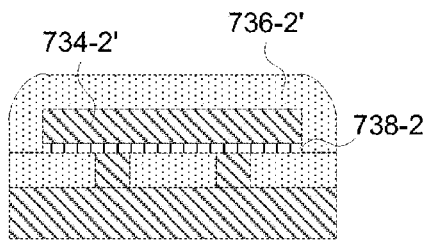
Figure 18I:
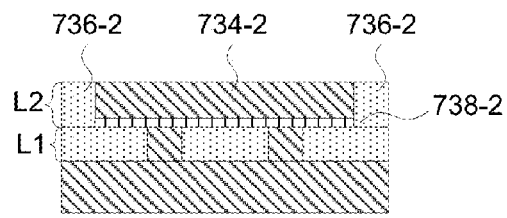

FIG. 18E illustrates the result of the initial operation (block 706) associated with the formation of the second layer. The application of a seed layer 738-2' was necessary for the second layer as a significant portion of the first layer is formed of a dielectric material and furthermore the center conductive region is isolated from the two outer conductive regions. FIG. 18F illustrates the result of the selective deposition of the second conductive material 734-2' (operation 708) for the second layer and further illustrates that some portions 738-2" of the seed layer 738-2' are not covered by the second conductive material 734-2', while FIG. 18G illustrates the result of the removal of the uncovered portions of the seed layer 738-2'(operation 710) which yields the net seed layer for the second layer 738-2. FIG. 18H illustrates the result of the blanket deposition of the dielectric material 736-2' for the second layer (operation 712). FIG. 18I illustrates the completed second layer L2 that results from the planarization process (operation 714) and that includes distinct regions of conductive material 734-2 and dielectric material 736-2.

Figure 18J:
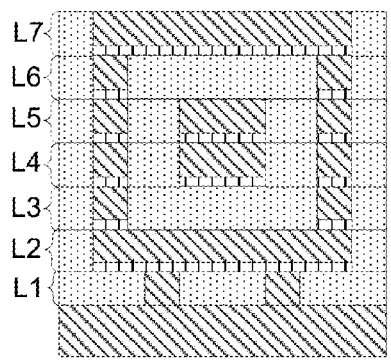

FIG. 18J illustrates the formation of the completed structure from layers L1-L7. The operations for forming layers L3-L7 are similar to those used during the formation of L2. The structure device of FIG. 18J may be put to use or it may undergo additional processing operations to prepare it for its ultimate use.

Various alternatives to the embodiment of FIG. 16 are possible. In one alternative, the order of deposition could be reversed. In another process instead of depositing material selectively, each material may be deposited in bulk, and selective etching operations used to yield the "net" selective locating of materials.

Figure 19:
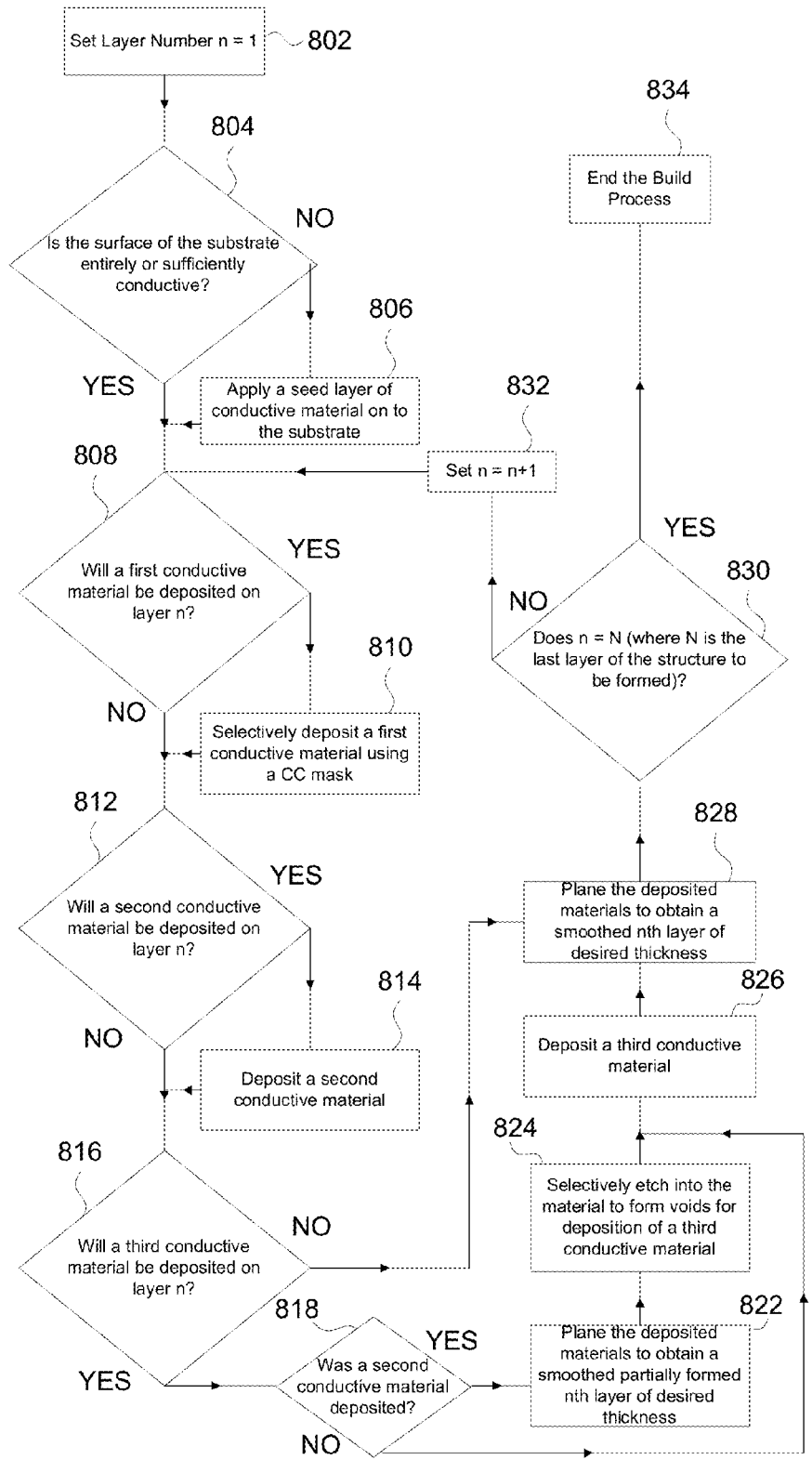
FIG. 19 depicts a flowchart of a sample electrochemical fabrication process that includes the use of three conductive materials.

FIG. 19 provides a flow chart of an electrochemical fabrication process that is somewhat more complex than the process of FIG. 16. The process of FIG. 19 builds up three-dimensional structures/devices using three conductive materials that are deposited on a layer-by-layer basis. As all materials in this process are conductors with the possible exception of the initial substrate, a simplification of the layer formation process results as compared to the process of FIG. 16. However, as three materials may or may not be deposited on each layer, this process adds not only complexity of the process but also can yield structures of enhanced functionality and versatility.

The process starts with block 802 where a current layer number is set to one (n=1). The process then moves to decision block 804 where the inquiry is made as to whether the surface of the substrate is entirely or at least sufficiently conductive. If the answer to this inquiry is "yes" the process moves forward to block 808. On the other hand if the answer is "no", the process moves to block 806 which calls for the application of a seed layer of a conductive material on to the substrate. The process then loops to decision block 808.

In block 808, the inquiry is made as to whether or not a first conductive material will be deposited on the nth layer (i.e. on the current layer). If the answer to this inquiry is "no" the process moves forward to block 812. On the other hand if the answer is "yes", the process moves to block 810 which calls for the selective deposition of the first conductive material. The process then loops to decision block 812.

In block 812, the inquiry is made as to whether or not a second conductive material will be deposited on the nth layer (i.e. on the current layer). If the answer to this inquiry is "no" the process moves forward to block 816. On the other hand if the answer is "yes", the process moves to block 814 which calls for the deposition of the second conductive material (which may be done selectively or in bulk). The process then loops to decision block 816.

In block 816, the inquiry is made as to whether or not a third conductive material will be deposited on the nth layer (i.e. on the current layer). If the answer to this inquiry is "no" the process moves forward to block 828. On the other hand if the answer is "yes", the process moves to decision block 818.

In block 818 the inquiry is made as to whether or not a second conductive material was deposited on the nth layer (i.e. on the current layer). If the answer to this inquiry is "no" the process moves forward to block 826. On the other hand if the answer is "yes", the process moves to block 822 which calls for the planarization of the partially formed layer at a desired level which may cause an interim thickness of the layer to be slightly more than the ultimate desired layer thickness for the final layer. The process then moves to block 824 which calls for selectively etching into the deposited material(s) to form one or more voids into which the third material will be deposited. The process then completes the loop to block 826.

Block 826 calls for the deposition of the third conductive material. The deposition of the third conductive material may occur selectively or in bulk. The process then loops to block 828.

Block 828 calls for planarization of the deposited materials to obtain a final smoothed nth layer of desired thickness.

After completion of the formation of the nth layer by the operation of block 828, the process proceeds to decision block 830. This decision block inquires as to whether the nth layer (i.e. the current layer) is the last layer of the structure (i.e. the Nth layer), if so the process moves to block 834 and ends, but if not, the process loops to block 832.

Block 832 increments the value of "n", after which the process loops back to block 808 which again inquires as to whether or not a first conductive material is to be deposited on the nth layer. The process then continues to loop through blocks 808-832 until the formation of the Nth layer is completed.

Figure 20A:
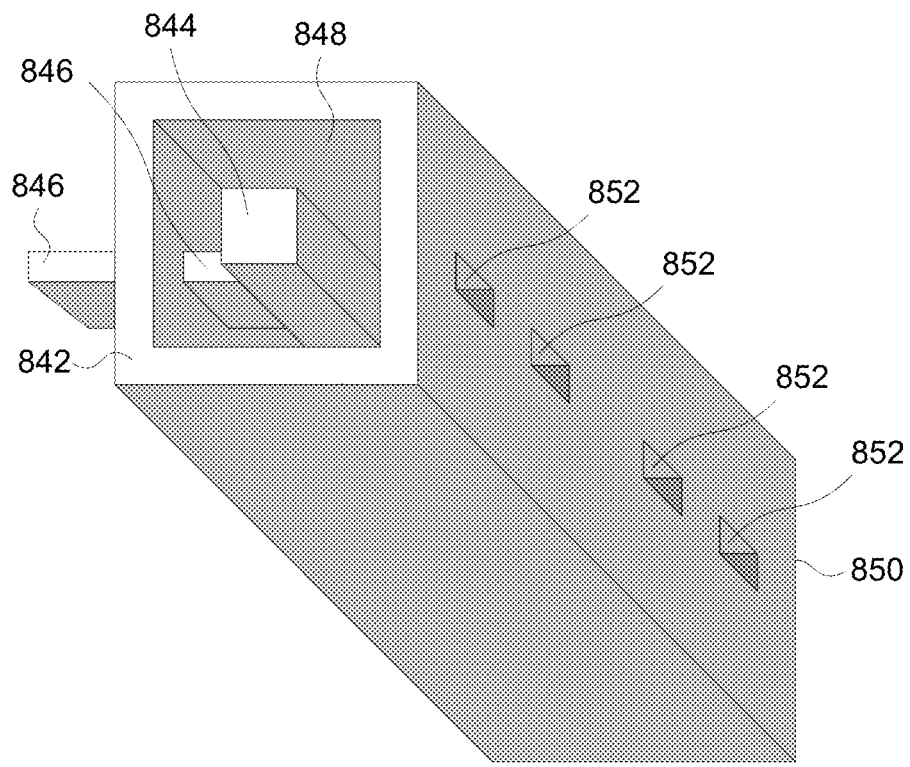
FIGS. 20A and 20B depict perspective views of structures that include conductive elements and dielectric support structures that may be formed according to extensions of the process of FIG. 19.
Figure 20B:
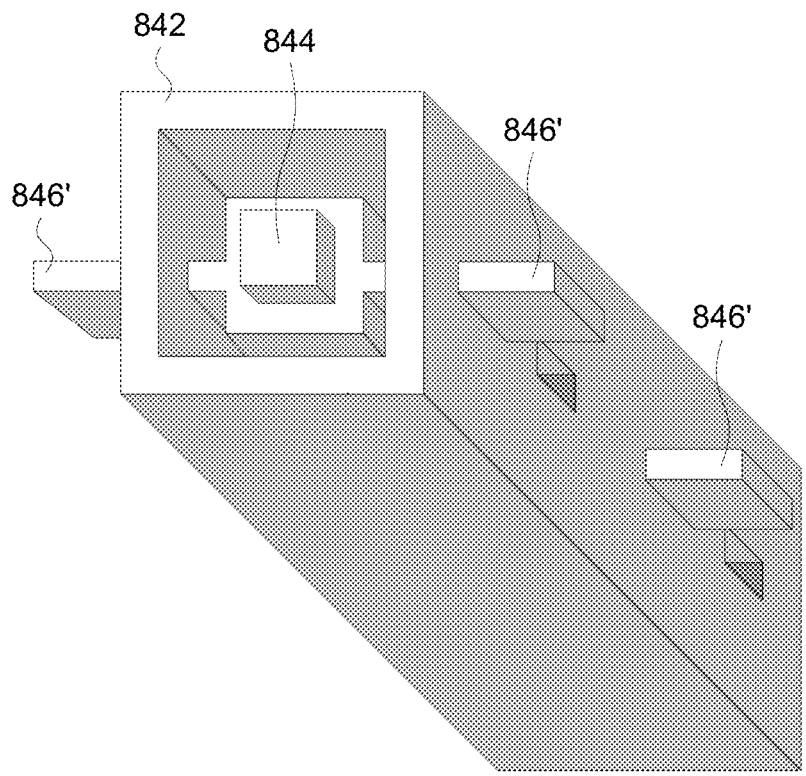

FIGS. 20A and 20B depict perspective views of structures that include conductive elements and dielectric support structures that may be formed in part according to the process of FIG. 19. The coaxial structure/device of FIG. 20A includes an outer conductor 842, an inner conductor 844, and dielectric support structures 846 that hold the two conductors in desired relative positions. During formation, the inner and outer conductors are formed from one of the three conductive materials discussed in relation to the process of FIG. 19 (a primary material) and the outer conductor is formed not only with entry and exit ports 848 and 850 but also with processing ports 852. Within some of these processing ports a secondary conductive material is located and which is made to contact the inner conductor 844. In the remainder of the build volume a tertiary conductive material is located. After formation of all layers of the structure, the secondary conductive material is removed and a dielectric material 846 is made to fill the created void or voids.

Thereafter, the tertiary conductive material is removed leaving the hollowed out structure/device of FIG. 20A. It should be understood that in the discussion of FIG. 20A, the references to the primary, secondary, and tertiary materials do correlate one-to-one with the first, second, and third conductive materials of the process of FIG. 19 but not necessarily respectively.

FIG. 20B depicts a similar structure to that of FIG. 20A with the exception that the inner conductor and outer conductor positions are more firmly held into position by modified dielectric structures 846'.

Figure 21A:
FIGS. 21A-21T illustrate application of the process flow of FIG. 19 to form a coaxial structure similar to that depicted in FIG. 20A where two of the conductive materials are sacrificial materials that are removed after formation of the layers of the structure and wherein a dielectric material is used to replace one of the removed sacrificial materials.
Figure 21B:
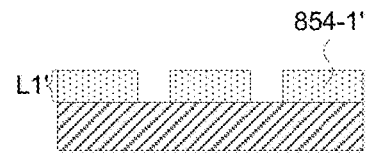
Figure 21C:
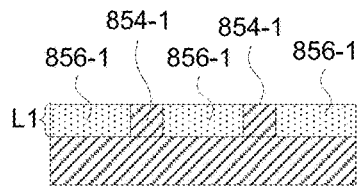
Figure 21D:
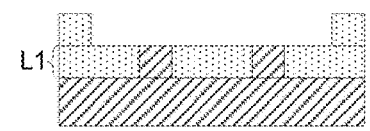
Figure 21E:
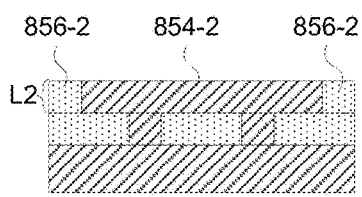
Figure 21F:
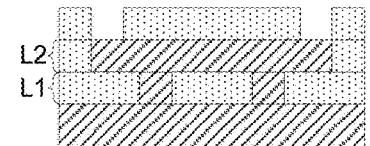
Figure 21G:
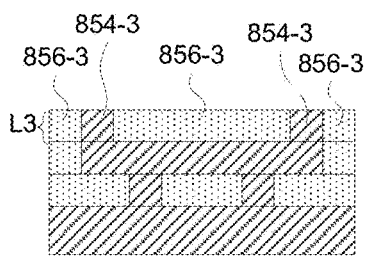
Figure 21H:
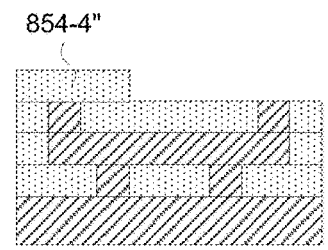
Figure 21I:
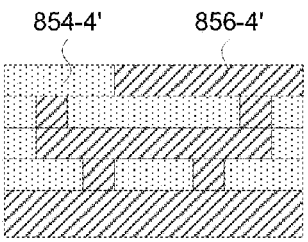
Figure 21J:
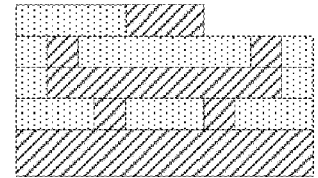
Figure 21K:
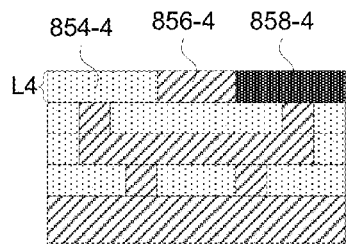
Figure 21L:
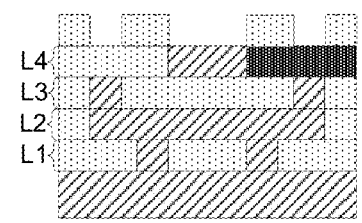
Figure 21M:
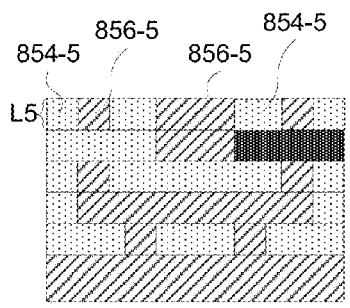
Figure 21N:
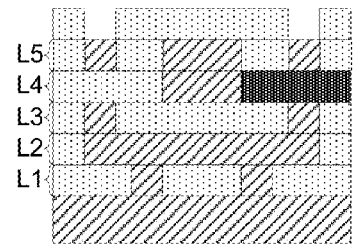
Figure 21O:
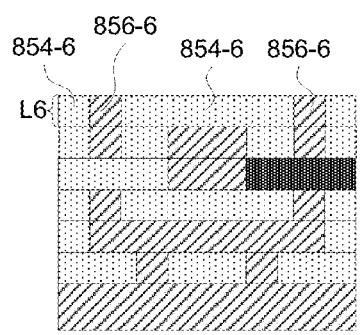
Figure 21P:
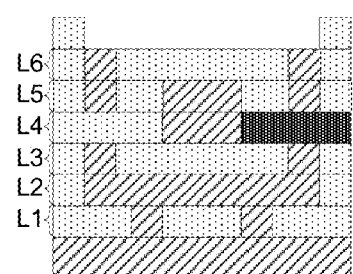
Figure 21Q:
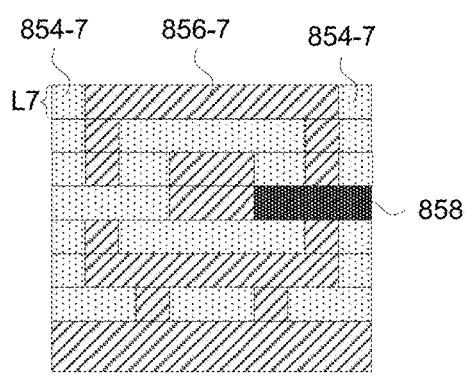
Figure 21R:
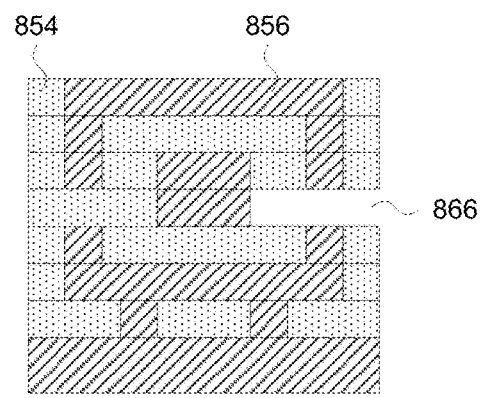
Figure 21S:
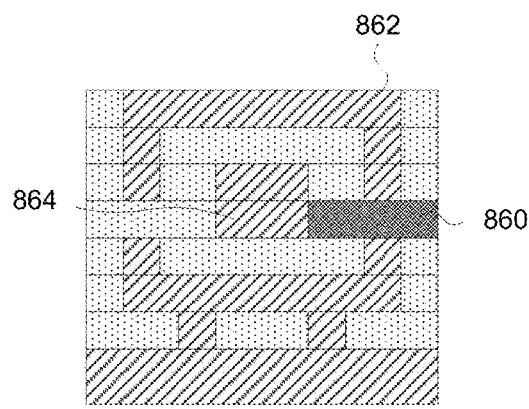
Figure 21T:
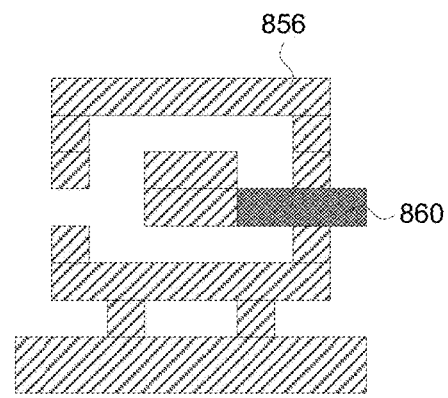

FIGS. 21A-21T illustrate application of the process flow of FIG. 19 to form a coaxial structure similar to that depicted in FIG. 20A where two of the conductive materials are sacrificial materials that are removed after formation of the layers of the structure and wherein a dielectric material is used to replace one of the removed sacrificial materials.

FIG. 21A depicts the starting material of the process (i.e. a blank substrate 852 onto which layers will be deposited). In moving through the process, it is assumed that the supplied substrate was sufficiently conductive to allow deposition without the need for application of a seed layer (i.e. the answer to the inquiry of 804 was "yes") and that the answer to the inquiry of 808 was also "yes". FIG. 21B depicts the result of the operation of block 819 related to the deposit of the first conductive material 854 for producing an initial deposition 854-1' for the first layer. Next, it is assumed the answer to the inquiry of block 812 is "yes" for the first layer. It is also assumed for the first layer that the answer to the inquiry of block 816 is "no". As such FIG. 21C illustrates the combined deposition of the second material 856 (block 810) and the planarization of the deposited first and second conductive materials 854-1 and 856-1 (block 828) to complete the formation of the first layer L1. FIGS. 21D and 21E represent the same processes and operations as were applied to the formation of the first layer for formation of the second layer L2 which is composed of distinct regions 854-2 and 856-2 of first and second conductive materials. FIGS. 21F and 21(g) represent the same processes and operations as were applied to the formation of the first and second layers for formation of the third layer L3 which is composed of distinct regions 854-3 and 856-3 of first and second conductive materials.

FIGS. 21H-21K illustrate the results of some of the operations associated with forming the fourth layer L4 of the structure/device. FIG. 21H depicts the result of the operation of block 810 related to the deposit of the first conductive material 854 for producing an initial deposition 854-4" for the fourth layer. Next, it is assumed the answer to the inquiry of block 812 is "yes" for the fourth layer. It is also assumed for the fourth layer that the answer to the inquiry of block 816 is "yes". As such, FIG. 21I illustrates the combined deposition of the second material 856 (block 810) and the planarization of the deposited first and second conductive materials 854-4' and 856-4' (block 822) to form a smooth but only partially formed fourth layer. FIG. 21J illustrates the result of operation 824 in etching away a portion of the planed deposit 856-4'. FIG. 21K illustrates the combined results of operations 826 and 828 to yield the completed fourth layer L4 which is composed of distinct regions 854-4 and 856-4, and 858-4 of first conductive material 854, the second conductive material 856, and the third conductive material 858.

FIGS. 21L and 21M, FIGS. 21N and 21O, and 21P and 21Q represent the same processes and operations as were applied to the formation of the first three layers for formation of the fifth through seventh layers (L5, L6, and L7) which are composed respectively of distinct regions 854-5 and 856-5, 854-6 and 856-6, and 854-7 and 856-7 of first and second conductive materials.

FIGS. 21R-21T represent an extension of the process flow of FIG. 19. FIG. 21R represents the result of the selective removal (e.g. by etching or melting) of the third conductive material to form a void 866 that extends through an outer wall 862 of first conductive material to contact an isolated interior structure 864 of the second conductive material (e.g. the inner conductor of a coaxial transmission line). FIG. 21S depicts the structure of FIG. 21R with the void 866 filled by a selected dielectric material 860 which contacts both the outer wall 862 and the interior structure 864. FIG. 21T depicts the structure of FIG. 21S with the first conductive material removed to yield a final substantially air filled structure with the interior structure 864 supported relative to the outer wall by one or more dielectric structures. FIG. 21T also depicts an opening in the structure.

Figure 22A:
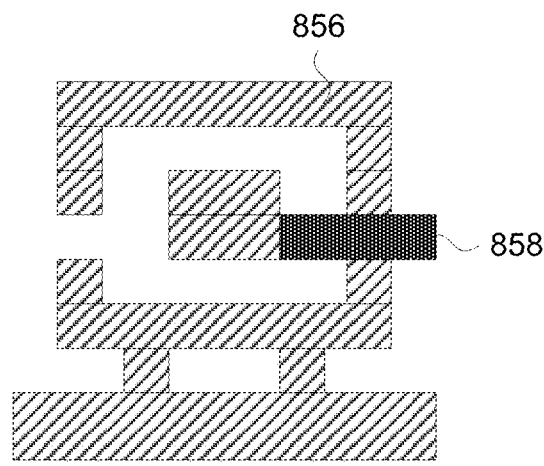
FIGS. 22A-22C illustrate the extension of the removal and replacement process of FIGS. 21R-21T.
Figure 22B:
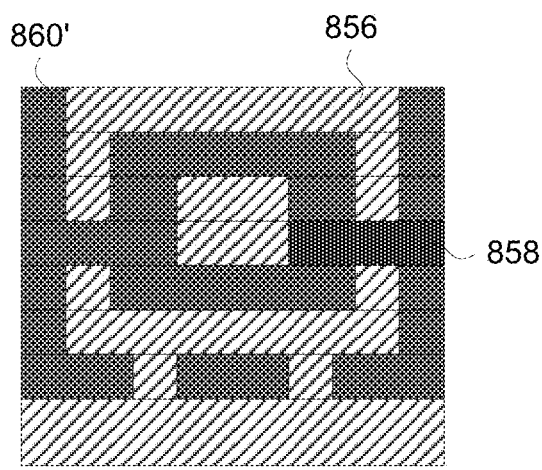
Figure 22C:
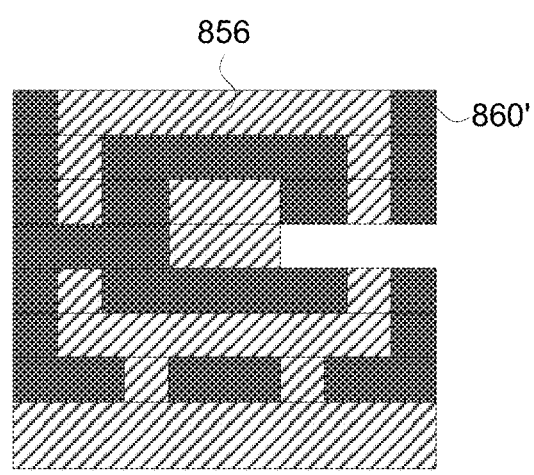

FIGS. 22A-22C depict application of the first removal, back filling, and second removal operations to the opposite materials as illustrated in FIGS. 21R-21T. In FIGS. 22A-22C the first conductive material 854 is removed to create a void, the void is filled with a dielectric 860', and then the third conductive material is removed.

In alternative embodiments, the processes of FIGS. 21R-21T and 22A-22C can be extended to include a second filling operation to fill the void that results from the final removal operation. The second filling operation may use the same or a different dielectric than was originally used. In still further alternatives more than three conductive materials may be used such that the resulting structure/device is comprised of two or more conductive materials, and/or is accompanied by two, three or more solid, liquid, or gaseous dielectrics.

Figure 23A:
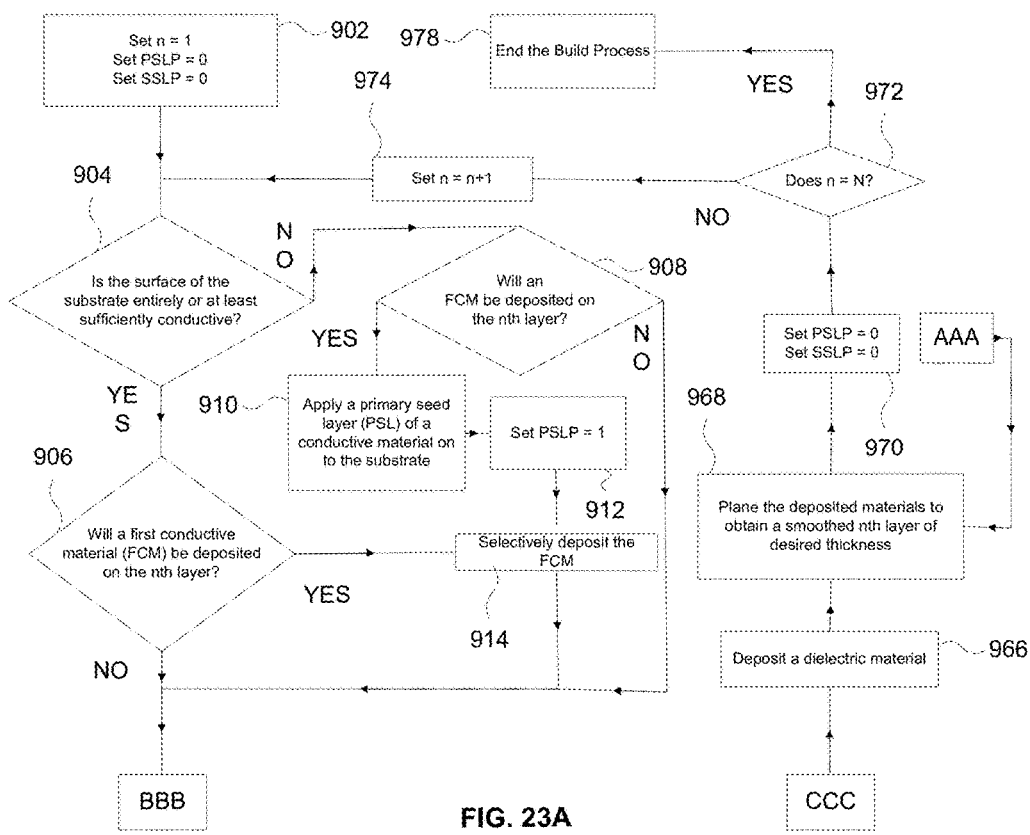
FIGS. 23A and 23B depict a flowchart of a sample electrochemical fabrication process that involves the use of two conductive materials and a dielectric material.
Figure 23B:
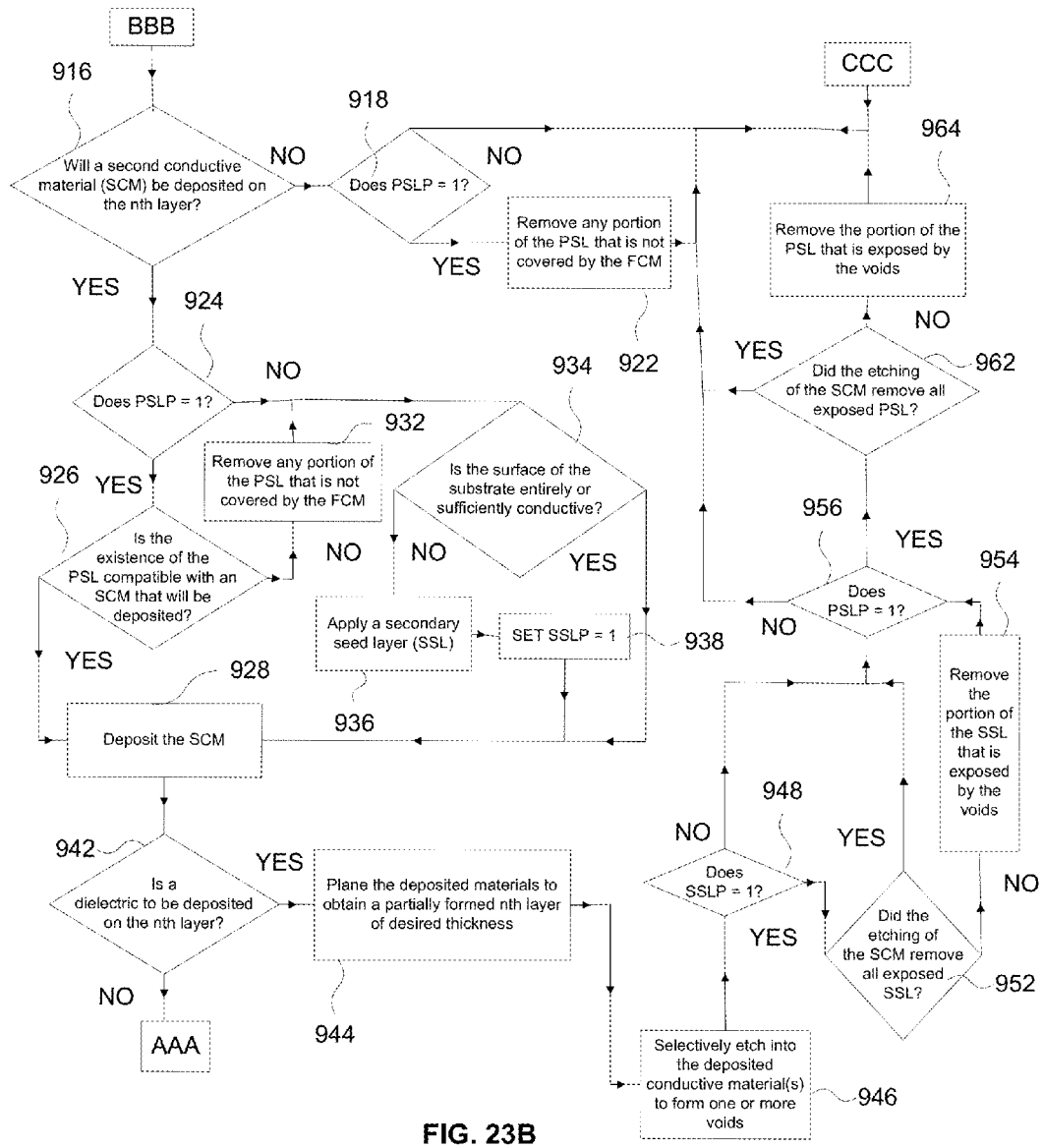

FIGS. 23A and 23B provide a flow chart of an electrochemical fabrication process that builds up three-dimensional structures/devices using two conductive materials and one dielectric material.

The process of FIGS. 23A and 23B begins at block 902 with the setting of three process variables: (1) the layer number is set to one, n=1, (2) a primary seed layer parameter is set to zero, PSLP=0, and (3) a second seed layer parameter is set to zero, SSLP=0. The process then proceeds to decision block 904 where the inquiry is made as to whether the surface of the substrate is entirely or at least sufficiently conductive? If "yes" the process proceeds to decision block 906 and if "no" the process proceeds to block 908.

In blocks 906 and 908, the same inquiry is made as to whether a first conductive material (FCM) will be deposited on the nth layer (i.e. the first layer). If the answer to the inquiry of block 906 is "yes", the process proceeds to block 914 and if it is "no", the process proceeds to block 916. If the answer to the inquiry of block 908 is "yes", the process proceeds to block 910 and if it is "no", the process proceeds to block 916.

Block 910 calls for application of a primary seed layer (PSL) of a conductive material on to the substrate. This seed layer may be applied in a variety of ways some of which have been discussed previously herein. From Block 910 the process proceeds to block 912 where the primary seed layer parameter is set to one, PSLP=1, which indicates that a primary seed layer has been deposited on the current layer.

From block 912 and from a "yes" answer from block 906 the process proceeds to block 914 which calls for the selectively deposition of the FCM. In some alternatives, the preferential deposition is via a CC mask. From block 914, from a "no" answer in block 908, and from a "no" answer in block 906 the process proceeds to decision block 916.

In decision block 916 an inquiry is made as to whether a second conductive material (SCM) will be deposited on the nth layer (i.e. the first layer in this case). If the answer to the inquiry of block 916 is "yes", the process proceeds to block 924 and if it is "no", the process proceeds to block 918.

In blocks 924 and 918, the same inquiry is made as to whether a primary seed layer has been deposited on the first layer (i.e. Does PSLP=1?). If the answer to the inquiry of block 924 is "yes", the process proceeds to block 926 and if it is "no", the process proceeds to block 934. If the answer to the inquiry of block 918 is "yes", the process proceeds to block 922 and if it is "no", the process proceeds to block 966.

In decision block 926 an inquiry is made as to whether the existence of the PSL is compatible with an SCM that will be deposited. If the answer to the inquiry of block 924 is "yes", the process proceeds to block 928 and if it is "no", the process proceeds to block 932.

Blocks 932 and 922 call for the removal of any portion of the PSL that is not covered by the FCM. From block 932 the process proceeds to block 934, as did a "no" response in block 924, and from block 922 the process proceeds to block 966. In decision block 934 an inquiry is made as to whether the surface of the substrate is entirely or sufficiently conductive. Though this question was asked previously, the answer may have changed due to a different pattern of conductive material to be deposited or due to the removal of a previously supplied seed layer because it is incompatible with the second conductive material that is to be deposited. If the answer to the inquiry of block 934 is "yes", the process proceeds to block 928 and if it is "no", the process proceeds to block 936.

Block 936 calls for application of a secondary seed layer (SSL) which will allow a second conductive material to be deposited in a subsequent operation. After which the process proceeds to block 938 where SSLP is set to one, thereby indicating that the present layer received the secondary seed layer which information will be useful in subsequent operations.

Block 928 is reached by a "yes" response to either of block 926 or 934, or via block 938. Block 928 calls for the deposition of the second conductive material (SCM). This deposition operation may be a selective operation or a blanket operation.

From block 928 the process proceeds to decision block 942 where an inquiry is made as to whether a dielectric will be deposited on the nth layer (i.e. the first layer). If the answer to the inquiry of block 942 is "yes", the process proceeds to block 944 and if it is "no", the process proceeds to block 968.

Block 944 calls for planarizing the deposited materials to obtain a partially formed nth layer having a desired thickness which may be different from the final thickness of the layer. After planarization the process proceeds to block 946 which calls for the selectively etching into one or both of the deposited conductive materials to form one or more voids into which the dielectric may be located after which the process proceeds to block 948. If the answer to the inquiry of block 948 is "yes", the process proceeds to block 952 and if it is "no", the process proceeds to block 956.

Decision block 952 inquires as whether the etching of block 946 resulted in the removal of all exposed SSL? If the answer to the inquiry of block 952 is "yes", the process proceeds to block 956 and if it is "no", the process proceeds to block 954.

Block 954 calls for the removal of the portion of the SSL that is exposed by the voids formed in block 946. After the operation of block 954, the process proceeds to decision block 956.

Decision block 956 inquires as whether PSLP is equal to one. If the answer to the inquiry of block 956 is "yes", the process proceeds to decision block 962 and if it is "no", the process proceeds to block 966.

Decision block 962 inquires as to whether the etching of the SCM removed all the exposed PSL. If the answer to the inquiry of block 956 is "yes", the process proceeds to decision block 966 and if it is "no", the process proceeds to block 964.

Block 964 calls for the removal of the portion of the PSL that is exposed by the voids created in block 946. After the operation of block 964 the process proceeds to block 966.

Block 966 calls for the deposition of the dielectric material. The deposition process may be selective or of a blanket nature and various processes are possible some of which were discussed elsewhere herein.

Block 968 calls for planarization of the deposited materials to obtain a final smoothed nth layer of desired thickness.

After completion of the formation of the nth layer by the operation of block 968, the process proceeds to decision block 970 where PSLP and SSLP are both set to zero, after which the process proceeds to decision block 972. This decision block inquires as to whether the nth layer (i.e. the current layer) is the last layer of the structure (i.e. the Nth layer), if so the process moves to block 978 and ends, but if not, the process proceeds to block 974.

Block 974 increments the value of "n", after which the process loops back to block 904 which again inquires as to whether or not surface of the substrate (i.e. the substrate surface as modified by the formation of the immediately preceding layer) is sufficiently conductive. The process then continues to loop through blocks 904-974 until the formation of the Nth layer is completed.

As with the processes of FIGS. 16 and 19, various alternatives to the process of FIGS. 23A and 23B exist. These variations may involve changing the order of the material depositions as a whole or changing the order of the operations for performing each type of material deposition based on what other operations have occurred or will occur during the formation of a given layer. Additional materials of the conductive or dielectric type may be added. Ultimate selectivity of any deposition may occur by depositing material in voids, by actual control of the deposition locations, or by etching away material after deposition. Additional operations may be added to the process to remove selected materials or to deposit additional materials.

Figure 24:
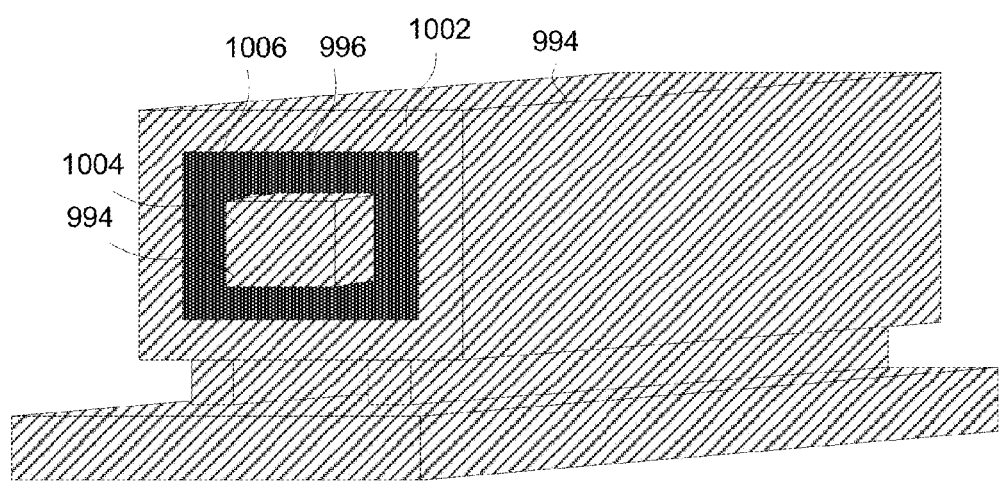
FIG. 24 illustrates a perspective view of a structure that may be formed using an extension of the process of FIGS. 23A and 23B.

FIG. 24 depicts a perspective view of a coaxial structure that includes outer and inner conductive elements 1002 and 1004, respectively, made from material 994 and a dielectric support structure 1006 made from a material 996. The structure of FIG. 24 may be formed according to the process of FIGS. 23A and 23B with the addition of a post layer formation operation that removes one of the conductive materials. During layer-by-layer buildup of the structure, the inner and outer conductors are formed from one of the two conductive materials discussed in relation to the process of FIGS. 23A and 23B (i.e. a primary material). A secondary conductive material is used as a sacrificial material. A dielectric material (i.e. a tertiary material) is also used as part of the structure. After formation of all layers of the structure, the secondary conductive material is removed to yield the final structure comprised of the primary conductive material 994 and the dielectric material 996.

Figure 25A:
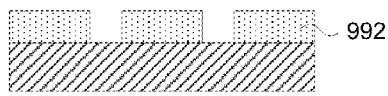
FIGS. 25A-25Z illustrate side views of a sample layer formation process according to FIGS. 23A and 23B to form a coaxial structure with a dielectric material that supports only the inner conductor.
Figure 25B:
Figure 25C:
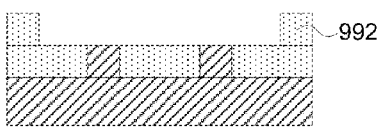
Figure 25D:
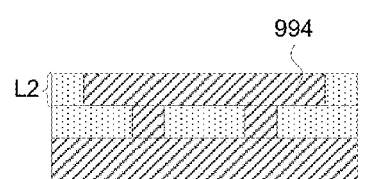
Figure 25E:
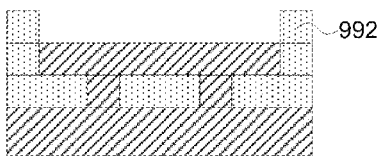
Figure 25F:
Figure 25G:
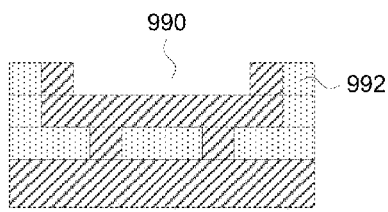
Figure 25H:
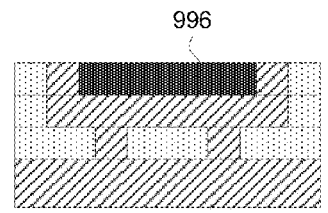
Figure 25I:
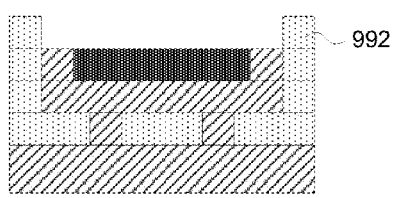
Figure 25J:
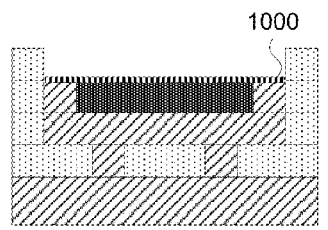
Figure 25K:
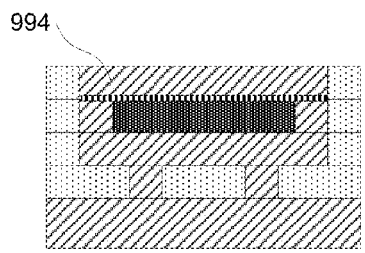
Figure 25L:
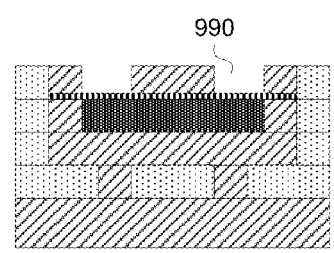
Figure 25M:
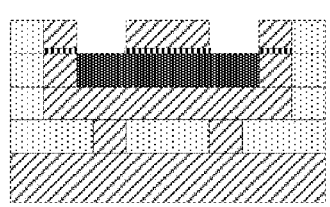
Figure 25N:
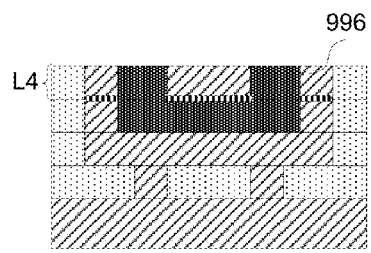
Figure 25O:
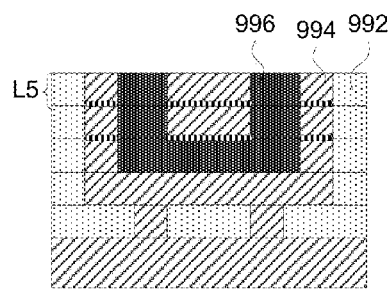
Figure 25P:
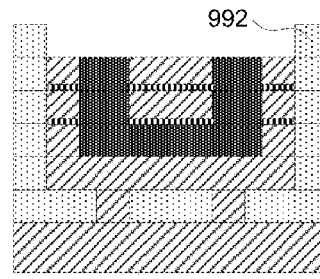
Figure 25Q:
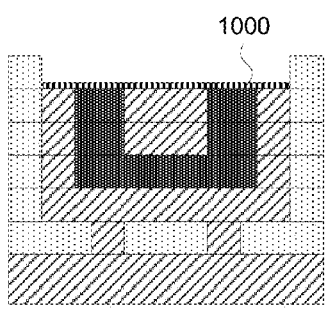
Figure 25R:
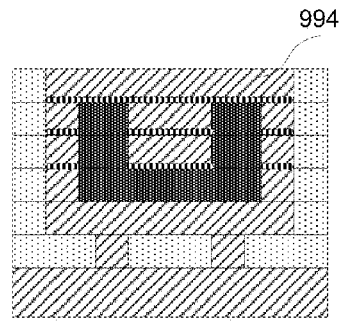
Figure 25S:
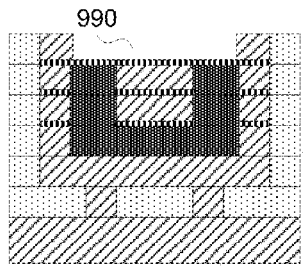
Figure 25T:
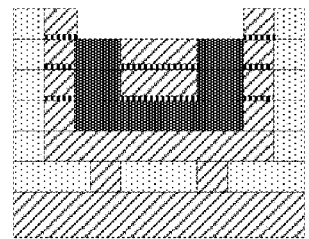
Figure 25U:
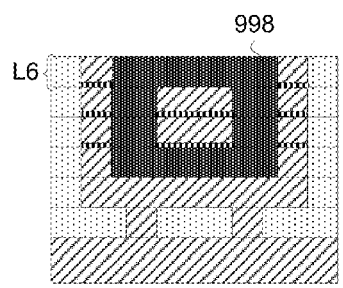
Figure 25V:
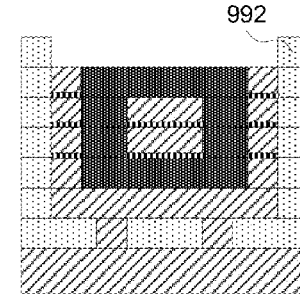
Figure 25W:
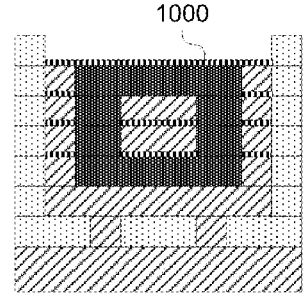
Figure 25X:
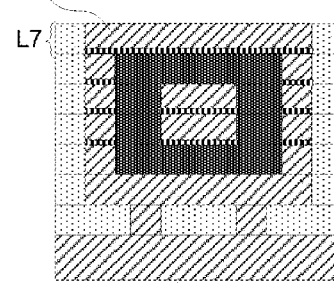
Figure 25Y:
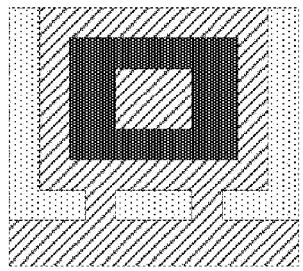
Figure 25Z:
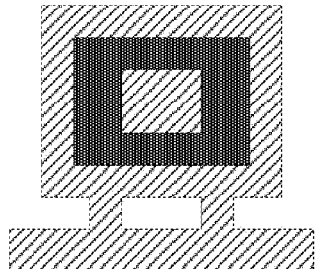
Figure 26A:
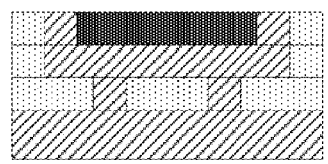
FIGS. 26A-26F illustrate an alternative to the process of FIGS. 25H-25K when a seed layer is needed prior to depositing the first conductive material for the fourth layer of the structure.
Figure 26B:
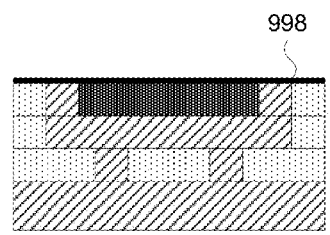
Figure 26C:
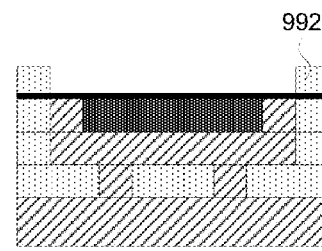
Figure 26D:
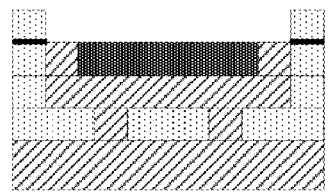
Figure 26E:
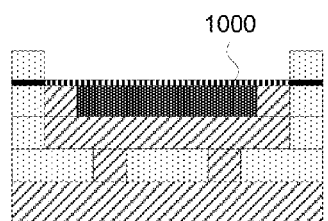
Figure 26F:
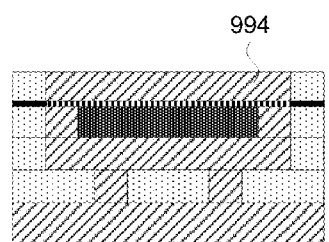

FIGS. 25A-25Z illustrate side views of the results of various operations of FIGS. 23A and 23B that are used in forming layers of the sample coaxial component illustrated in FIG. 24. The operations associated with the results illustrated in FIGS. 25A-25X and 26A-26F are set forth in the TABLE 6.

TABLE 6

| FIGS. "25" FIGS. "26" | Layers "L" | Operation | Comments |
|---|---|---|---|
| 25A, C, E, I, P, V 26C | 1, 2, 3, 4, 6, 7 | 914 | The 1$^{st}$ material 992 is deposited |
| 25B, D, F, X 26F | 1, 2, 6, 7 | 936 & 968 | The 2$^{nd}$ material 994 is deposited and planarized to complete formation of the layer |
| 25F, K, R -- | 3, 4, 6 | 928 & 944 | The 2$^{nd}$ material 994 is deposited and planarized to form an incomplete layer |
| 25G, L, S -- | 3, 4, 6 | 946 | The deposited material is etched to form voids 990 |
| 25H, N U -- | 3, 4, 6 | 966 & 968 | The 3$^{rd}$ material 996 is deposited and planarized to complete formation of the layer |
| 25J, Q, W 26E | 4, 6, 7 | 936 | A secondary seed layer 1000 is applied |
| -- 26B | | | A primary seed layer 998 is applied |
| 25M, T -- | 4, 6 | | Exposed portions of the secondary seed layer are removed |
| --- 26D | | | Exposed portions of the primary seed layer are removed |
| (o) -- | 5 | | All operations performed for layer 4 |

FIG. 25Y illustrates an overview of the completed structure with the presence of the layer delimiters removed and the under the assumption that the second seed layer material was identical to the second material. FIG. 25Z illustrates the result of a post process 1$^{st}$ material removal operation (e.g. selective etching) that yields the structure illustrated in FIG. 24.

FIGS. 26A-26E illustrate an alternative to the process of FIGS. 25H-25K when use of the primary seed layer is needed prior to depositing the first conductive material for the fourth layer of the structure.

Figure 27:
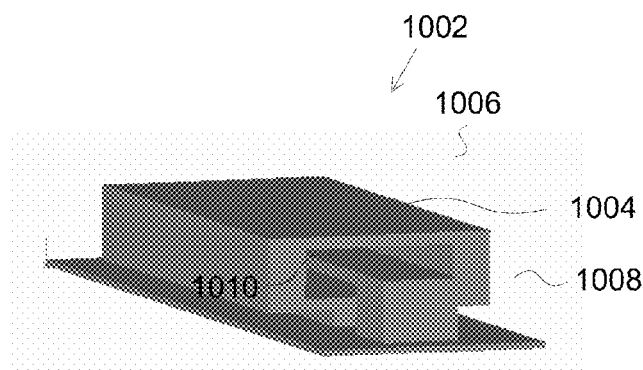
FIG. 27 depicts a perspective view of a coaxial transmission line.

FIG. 27 depicts a perspective view of a coaxial transmission line. The coaxial transmission line 1002 includes an outer conductive shield 1006 surrounding an inner conductor 1004. In the illustrated embodiment, the transmission line 1002 may be set away from a substrate 1008 by a spacer 1010. In the illustrated embodiment the substrate may be a dielectric with an appropriate ground potential being applied to the shield 1006 via conductive spacer 1010 (e.g. via the underside of the substrate) while a signal may be applied to the central conductor (e.g. via an appropriate connection from the underside of the substrate). In alternative embodiments, the shielding may curve around the bend in the central conductor such that the shield provides substantially complete shielding of the central conductor at substantially all of its locations above the substrate (except for maybe one or more openings in the shield that allows removal of a sacrificial material that may have been used during device formation. In other alternative embodiments, the substrate may be conductive with a dielectric material providing isolation were the central conductor and the interior portion of the coaxial element penetrates the substrate. In still other embodiments, the shielding may take the forms of a conductive mesh or even one or more conductive lines that extend out of the plane of the substrate. In still other embodiments, the transmission line may be curved in a single plane (e.g. a plane parallel to that of the substrate) or it may take on any desired three-dimensional pattern. For example, the transmission line may take a spiraling pattern much like that of a spiral loop of a conductive wire. Similarly, a filter element like those shown in FIGS. 12C and 13 have be converted from the relatively planar configurations shown to a more three dimensional shape where, for example, the main line of the filter (616, 606) takes form of spiral while branches 622, 614, and the like, either take a path down the center of the spiral or take spiral path themselves (e.g. a smaller diameter path than that taken by the main line). Such a configuration can reduce the planar size of the structure at the cost of increasing its height while still maintaining a desired effective length.

Figure 28:
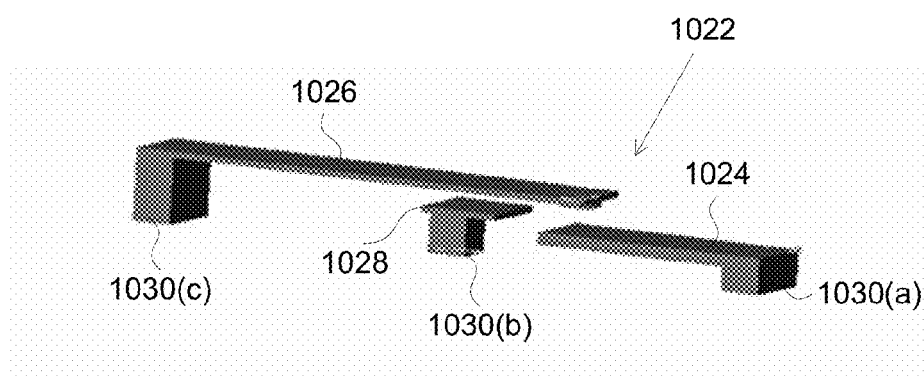
FIG. 28 depicts a perspective view of an RF contact switch.

FIG. 28 depicts a perspective view of an RF contact switch. The RF switch is a cantilever switch. The switch 1022 includes a cantilever beam 1026 which contacts a second beam 1024. The cantilever beam deflects downwards due to electrostatic forces when a voltage is applied between the underlying control electrode 1028. In the illustrated embodiment, all of the switch elements are suspended above the substrate with by pedestals 1030*a*-1030(*c*), which, it is believed, will result in a reduction of parasitic capacitance to the substrate. This approach makes it possible to decrease the distance between the drive electrode and the cantilever beam, which increases actuation force while decreasing the required drive voltage, and at the same time allows increased distance from the substrate, thereby reducing parasitics. This independence of the electrode size and contact gaps is not possible if both must lie on a planar substrate. The flexibility of the multilevel embodiments of electrochemical fabrication makes it possible to place the switch components in more optimal locations. In one embodiment, the long cantilever beam may have a length of about 600 μm and a thickness of 8 μm. A circular contact pad may be located underneath the beam such that the contacts are separated by, for example about 32 μm for high isolation. The lower beam may be suspended, for example, at about 32 μm, above the substrate while the upper beam may be about 88 μm above the substrate. Of course in other embodiments other dimensional relationships may exist. In one example of the use of such a switch, a voltage may be applied between control electrode 1028 and cantilever 1026 to close the switch while an AC signal (e.g. an RF or microwave signal) exists on either the cantilever or the other beam and is capable of propagating once the switch is closed. In some alternative designs, one or both of lines 1026 and 1024 may include protrusions at their contact locations or alternatively the contract locations may be made of an appropriate material to enhance contact longevity. In still other alternative designs, the entire switch may be located within a shielding conductor which might reduce any radiative losses associated with signal propagation along the lengths of lines 1024 and 1026. In still further embodiments, the switch may be used as a capacitive switch by locating a thin layer of dielectric (e.g. nitride) at the contact location of one or both of lines 1024 and 1026 thereby allowing the switch to move the contacts between low and high capacitance values. Signal passage may occur for such a switch when impedance matching occurs (e.g. when capacitance is low higher frequency signals may pass while lower frequency signals may be blocked or significantly attenuated. In still further embodiments control electrode or the nearest portion of line 1026, thereto, may be coated with a dielectric to reduce the possibility of a short occurring between the control electrode and the deflectable line. In still other embodiments, a pull up electrode may be included to supplement separation of the contacts beyond what is possible with the spring force of the deflectable line 1026 alone. In some embodiments the ratio of switch capacitance (assuming it to be a capacitive switch) when open to closed, is preferably greater than about 50 and more preferably greater than about 100. In still other embodiments, a secondary conductor may be attached to and separated from the pedestal 1030(*c*) and the underside of line 1026 by a dielectric. This secondary conductor may be part of the switch control circuitry as opposed to having the control circuitry share conductor 1026 with the signal.

Figure 29:
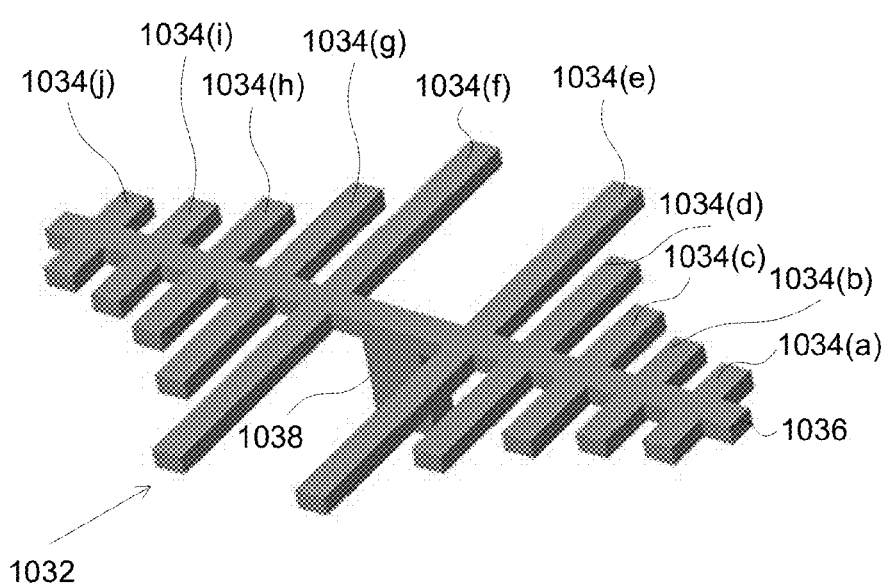
FIG. 29 depicts a perspective view of a log-periodic antenna.

FIG. 29 depicts a perspective view of a log-periodic antenna. The antenna 1032 includes a number of different dipole lengths 1034(*a*)-1034(*j*) along a common feedline 1036 that is supported from a substrate (not shown) by spacer 1038). It is believed that this elevated position may reduce parasitic capacitive losses that may otherwise be associated with the antenna contacting or being in proximity to a lossy substrate. In other embodiments, other antenna configurations may be used, such as for example, linear slot arrays, linear dipole arrays, helix antennas, spiral antennas, and/or horn antennas.

Figure 30A:
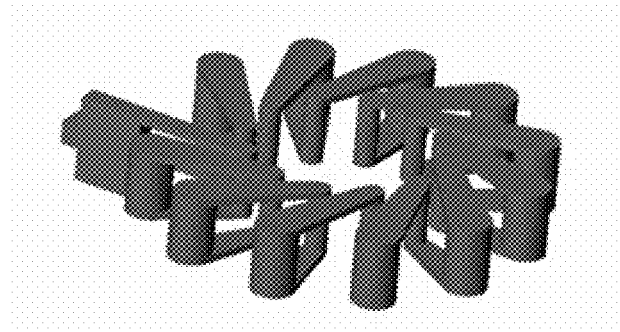
FIGS. 30A and 30B depict perspective views of a sample toroidal inductor rotated by about 180 degrees with respect to one another.
Figure 30B:
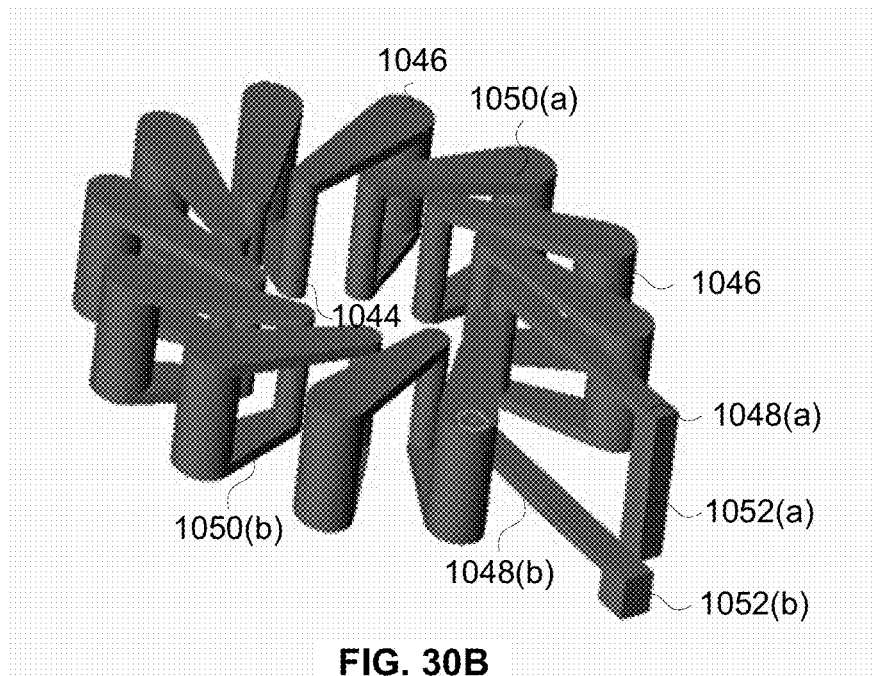
Figure 30C:
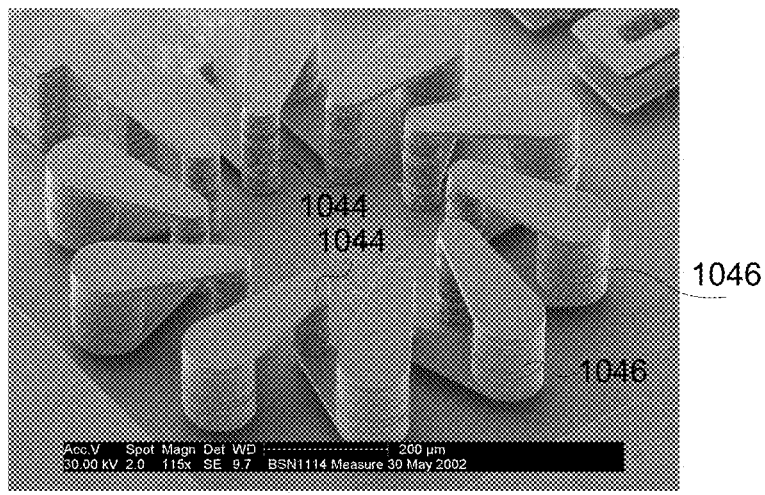
FIG. 30C depicts a perspective view of toroidal inductor formed according to an electrochemical fabrication process

FIGS. 30A-30B depict perspective views of a sample toroidal inductor design rotated by about 180 degrees with respect to one another. FIG. 30C depicts a perspective view of the toroidal inductor of FIGS. 30A and 30B as formed according to an electrochemical fabrication process. The toroidal inductor of FIG. 20C was formed according to the process of FIGS. 2A-2F. In some embodiments the inductor may be formed on a dielectric substrate while in other embodiments the inductor may be formed on a conductive substrate with appropriate dielectrically isolated feedthroughs. In one specific embodiment, the toroidal coil may include 12 windings, be about 900 μm across, and have its lower surface suspended about 40 μm above the substrate. The inductor 1042 includes a plurality of inner conductive columns 1044 and a plurality of outer conductive columns 1046 connected by upper bridging elements and lower bridging elements 1050(*a*) and 1050(*b*). The inductor also includes two circuit connecting elements 1048(*a*) and 1048(*b*) that are supported by spacers 1052(*a*) and 1052(*b*). In some embodiments, the entire inductor may be supported by and spaced from a substrate by the spacers 1052(*a*) and 1052(*b*). It is believed that such spacing may reduce parasitic capacitance that might otherwise result from contact between or proximity of the lower conductive bridges 1050 (*b*) and a substrate (not shown). Though in some embodiments, the inner and outer conductive columns may have similar dimensions, in the illustrated embodiment, the area of each of the inner conductive columns is smaller than the area of the outer conductive columns (e.g. the diameter is smaller). Similarly, in the present embodiment the width of the conductive bridges 1050(*a*) and 1050(*b*) also increase radially outward from the center of the inductor. It is believed that such a configuration will result in reduced ohmic resistance has a desired current travels around the inductive path. It is also believed that such a configuration may lead to reduced leakage of magnetic flux from the inductor and thus contribute to an enhancement in inductance or a reduction in noise that the component may radiate to other circuit elements. In still further embodiments, it may be advantageous to shield the outer circumference of the inductor by a conductive wall. Similarly the inner circumference may also be shielded by a conductive wall, and in still further embodiments the upper surface and potentially even the lower surface may also be shielded by conductive plates or meshes. In some alternative embodiments the spacers 1052(*a*) and 1052(*b*) and even the circuit connecting elements 1048(*a*) and 1048(*b*) may be shielded, at least in part, by conductive elements which may help minimize radiative losses. In further embodiments loops of the inductor may take on a more circular shape as opposed to the substantially rectangular shape illustrated.

Figure 31A:
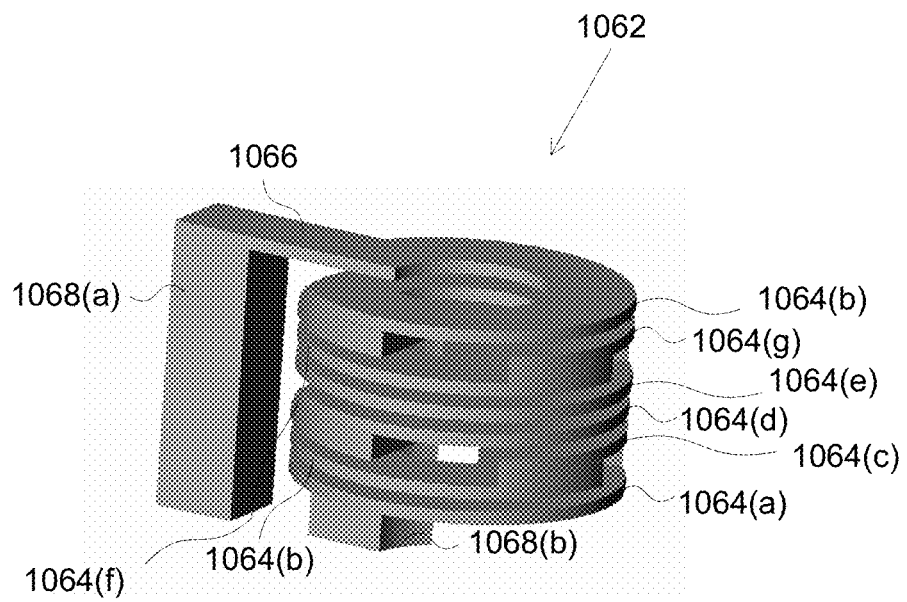
FIGS. 31A and 31B depict perspective views of a spiral inductor design and a stacked spiral inductor formed according to an electrochemical fabrication process.
Figure 31B:
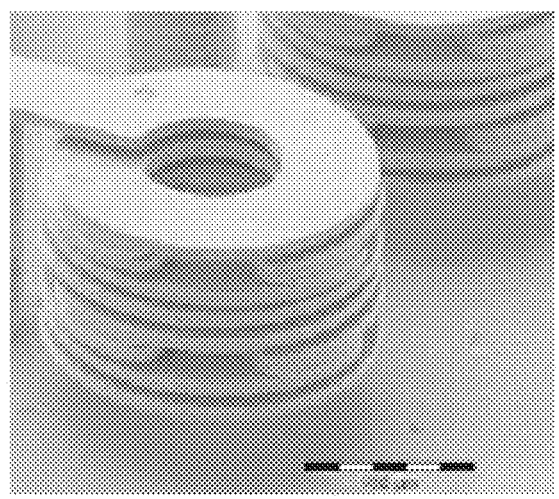

FIGS. 31A-31B depict perspective views of a spiral inductor design and a stacked spiral inductor formed according to an electrochemical fabrication process, respectively. The illustrated inductor 1062 includes eight coils 1064(*a*)-1064(*g*), one connecting bridge 1066, and two spacers 1068(*a*) and 1068(*b*). In one detailed embodiment, the coils may be about 8 μm thick each, they may have an outer diameter of about 200 μm, they may be separated by about 8 μm, and the bottom coil may be elevated about 56 μm above the substrate. As with the illustrated embodiments of FIGS. 27-30C, the spacers are used not only for establishing an electrical connection between the inductor and the rest of the circuit but also to space the inductor coils from a substrate (not shown).

Figure 31C:
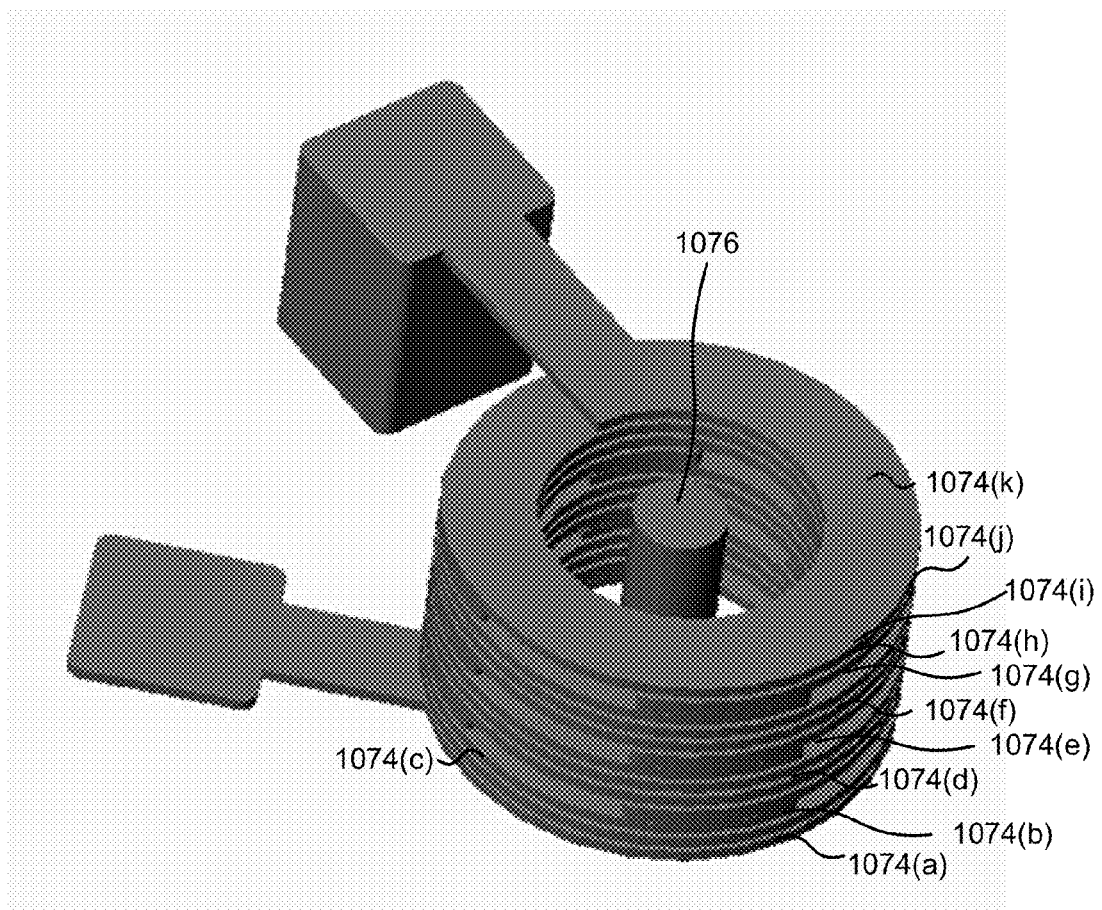
FIG. 31C depicts a variation of the inductors of FIGS. 31A and 31B.

FIG. 31C depicts a variation of the inductors of FIGS. 31A and 31B. The inductor 1072 of FIG. 31C may be formed with the indicated design features using 23 layers. As depicted, the inductor includes 11 coil levels 1074(*a*)-1074 (*k*) and 9 and ⅛ turns. Each coil level is formed from an 8 micron thick layer and is separated from other coil levels by gaps of 4 micron thickness. The inner diameter is 180 microns and outer is 300 micron. As illustrated the inductor includes a core which is 60 micron in diameter with a 60 micron space between the core 1076 and windings 1074(*a*)-1074(*k*). A simple calculation based on a uniform magnetic field yields an inductance of 20 nH for the inductor when the core is disregarded. However since the real inductor has a diameter larger than its length, and the windings are not particularly tight, the inductance will be lower than this theoretical value. The real value is estimated to be in the range of 25%-50% of the theoretical value, (i.e. about 5-10 nH). On the other hand, the inductance may be greatly enhanced by the presence of the core 1076 (e.g. by a factor of 100 or more). Of course, in other embodiments, other configurations are possible.

Figure 32A:
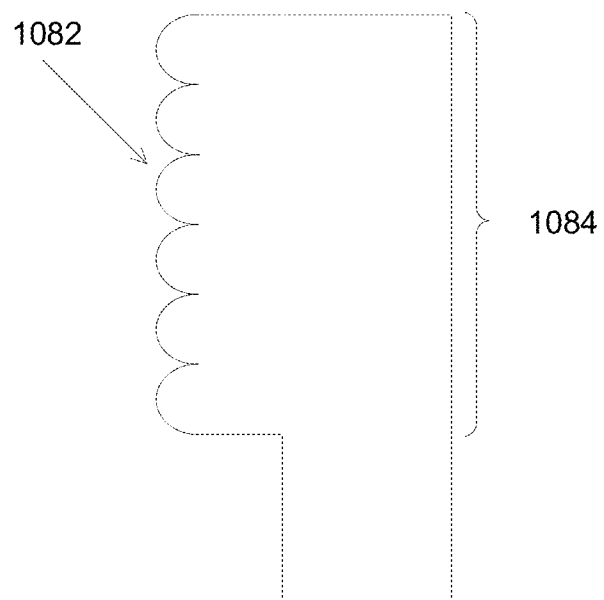
FIGS. 32A and 32B contrast two possible designs where the design of FIG. 32B may offer less ohmic resistance than that of FIG. 32A along with a possible change in total inductance.
Figure 32B:
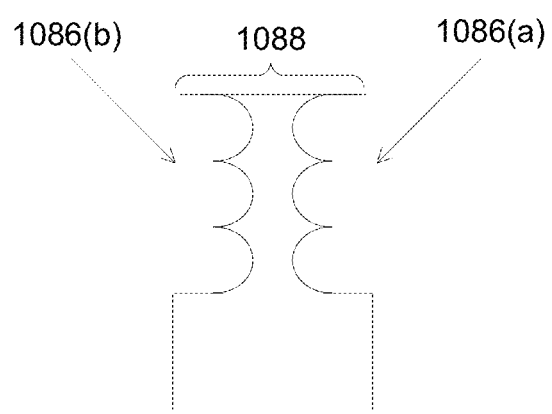

In other embodiments, the inductors of FIGS. 31A-31C may take on different forms. FIGS. 32A and 32B contrast two possible designs where the design of FIG. 32B may offer less ohmic resistance than that of FIG. 32A along with a possible change in total inductance. A single inductor 1082 having N coils and a relative long connector line 1084 is illustrated in FIG. 32A while FIG. 32B depicts two half sized inductors 1086(*a*) and 1086(*b*) where the number of coils in each is considered to be about one-half of those in the inductor of FIG. 32A connected in series via short bridging element 1088. As illustrated since bridging element 1088 is shorter than connector line 1084, it is believed that the inductor pair of FIG. 32B will have less loss than that of FIG. 32A. On the other hand as the coupling between the two inductors is probably reduced, there is probably an associated loss of net inductance. By inclusion of a core that extends in the form of a loop through both inductors it may be possible to bring the inductance back up to or even beyond that of the taller inductor of FIG. 32A.

Figure 33A:
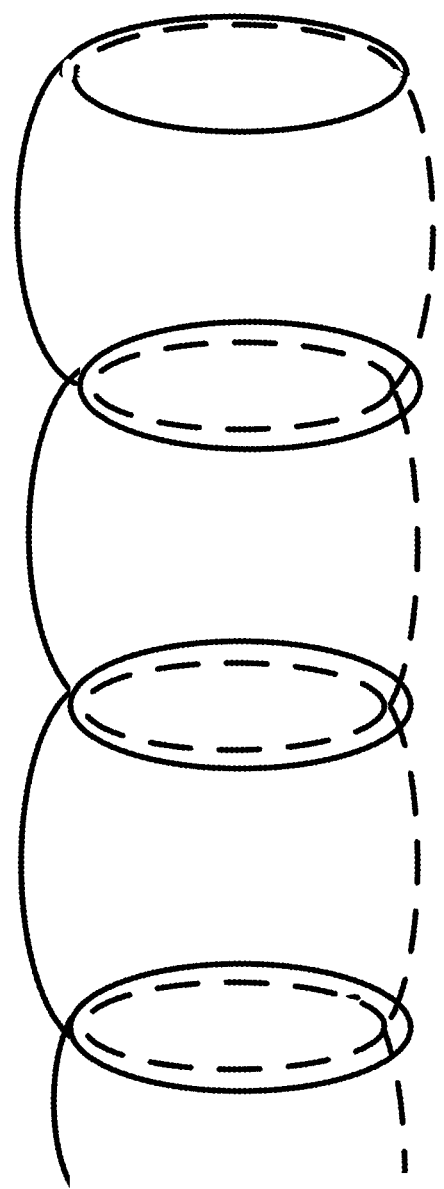
FIGS. 33A and 33B depict a schematic representation of two alternative inductor configurations that minimize ohmic losses while maintaining a high level of coupling between the coils of the inductor.
Figure 33B:
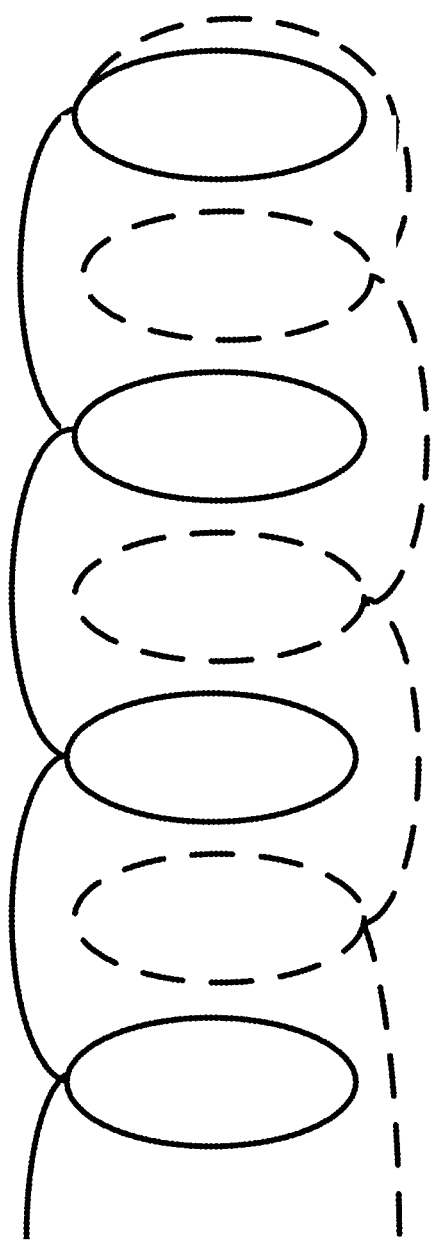

FIGS. 33A and 33B depict a schematic representation of two alternative inductor configurations that minimize ohmic losses while maintaining a high level of coupling between the coils of the inductor. In the figures the upward path of the coils is depicted with a solid line while the downward path of the coils is depicted with a dashed line. In FIG. 33A the upward extending coils have a larger perimeter than the downward extending coils. In FIG. 33B they are of substantially similar perimeter dimensions.

Figure 34:
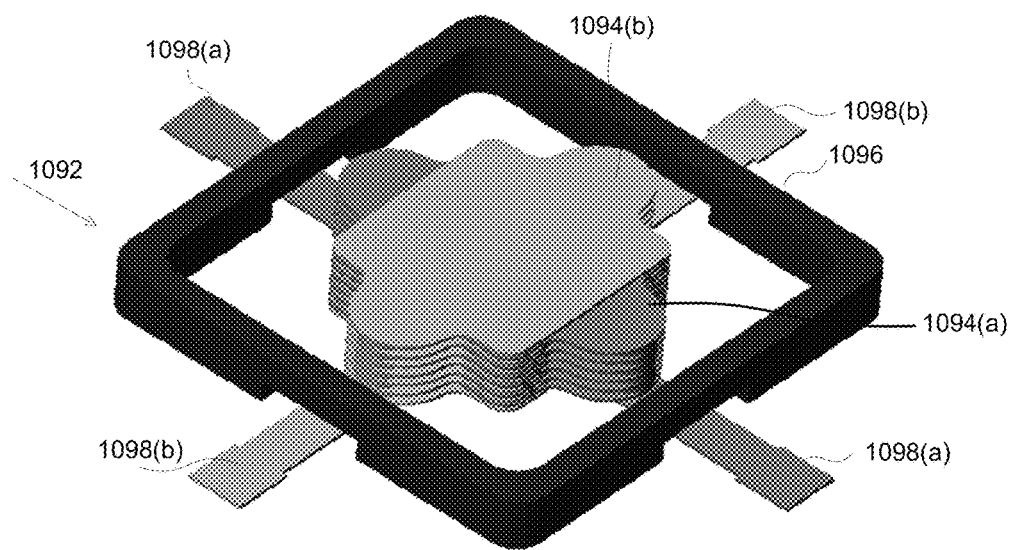
FIG. 34 depicts a perspective view of a capacitor.

FIG. 34 depicts a perspective view of a capacitor 1092 including 12 interdigitated plates (two sets 1094(*a*) and 1094(*b*) of six plates each). In a detailed embodiment each plate may have an eight micron thickness, a 4 micron gap between each plate, and each plate may be 436 µm on a side. Based on these details, the capacitance is calculated at about 5 pF based on an ideal parallel plate calculation. It is anticipated that the value will be somewhat different due to fringe field effects. As illustrated, the capacitor is surrounded by a dam 1096 which may be used to facilitate a post-release dielectric backfill while minimizing dielectric spill over to adjacent devices that may be produced nearby on the same substrate. Backfilling with a dielectric could dramatically increase the capacitance offered by such capacitors. Similarly decreasing the separation between plates and or adding additional plates may also significantly increase the capacitance. The capacitor is shown with two pairs of orthogonally located bond pads 1098(*a*) and 1098(*b*), respectively. As the parallel bond pads are conductively connected, electrical connection to the device may occurred via connection to one of the 1098(*a*) pads and one of the 1098(*b*) pads. As illustrated the bond pads are in line with the lowest plates of the capacitor and the upper plates are connected to the lowest plates by columns located in the extended regions from each group. In other embodiments, the pads could connect more directly to, for example, the mid-level plates of each stack. The current flow could from there proceed both upward and downward to the other plates of each stack respectively.

Figure 35A:
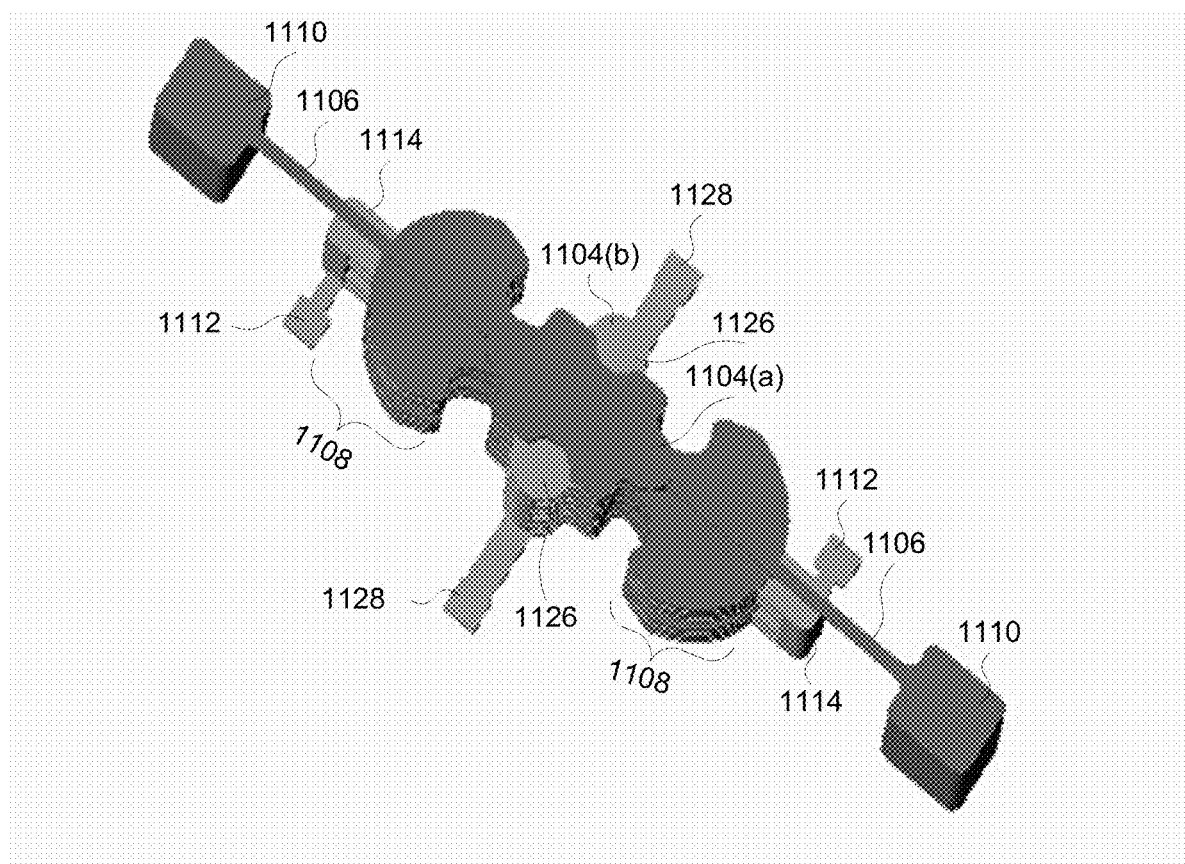
FIGS. 35A and 35B depict a perspective view and a side view, respectively, of an example of a variable capacitor 1102.
Figure 35B:
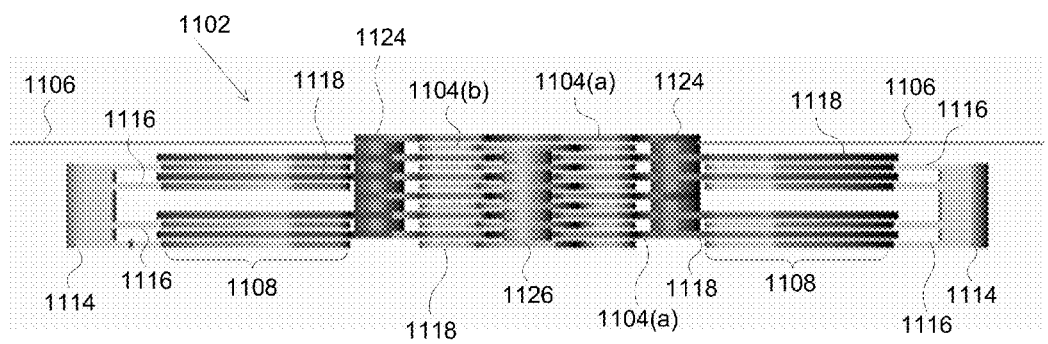

FIGS. 35A and 35B depict a perspective view and a side view, respectively, of an example of a variable capacitor 1102. The capacitor plates have a similar configuration to that of FIG. 34 and are again divided into two sets of six plates 1104(*a*) and 1104(*b*). In this embodiment one set of capacitor plates 1104(*a*) is attached to spring elements 1106 and to two sets of parallel plate electrostatic actuators 1108 that can drive plates 1104(*a*) vertically relative to fixed plates 1104(*b*). In use a DC potential may be applied between spring supports 1110 and actuator pads 1112. Actuator pads 1112 connect to columns 1114 which in turn hold fixed drive plates 1116. When such a drive voltage is applied moveable drive plates 1116 are pulled closer to fixed drive plates which in turn pull moveable capacitor plates 1104(*a*) closer to fixed capacitor plates 1104(*b*) via support columns 1124 and thereby change the capacitance of the device. Capacitor plates 1104(*b*) are held in position by support columns 1126. The capacitor may be connected in a circuit via spring support 1110 and one of fixed capacitor plate contact pads 1128.

Figure 36A:
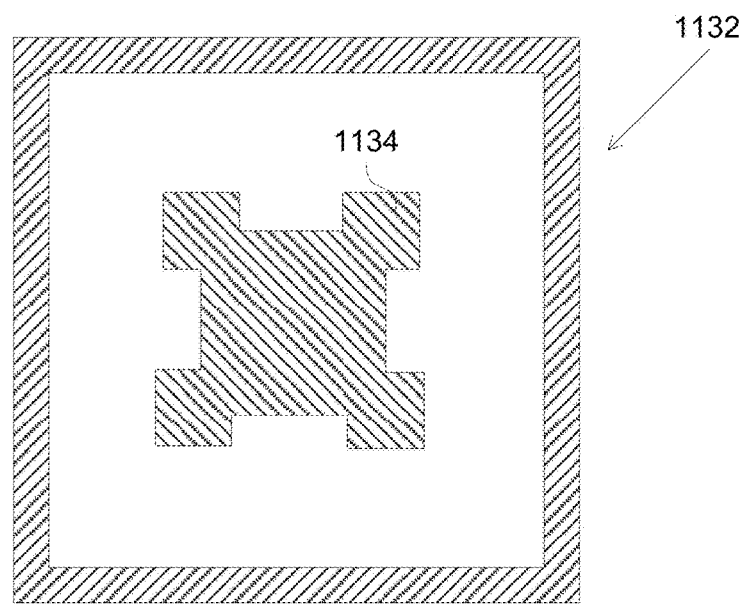
FIGS. 36A-36B depict end views of two example coaxial structures where the central conductors are provided with a cross-sectional configuration that increases their surface area relative to their cross-sectional area.
Figure 36B:
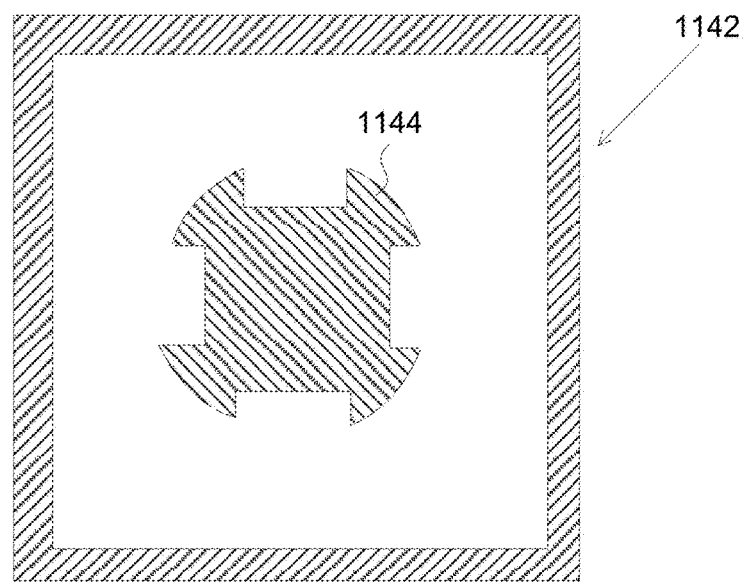

In still further embodiments, resistive losses associated with current carrying conductors such as the spacers of FIGS. 27-31C, with central conductors of coaxial components, and with elements of various other components may be reduced by increasing the surface area of the elements without necessarily increasing their cross-sectional dimensions. It is believed that this can be particularly useful when the frequency of the signal makes the skin depth small compared to the cross-sectional dimensions of the components. For example, a cross-sectional dimension of a current carrying conductor (in a plane perpendicular to the direction of current flow) could be increased by changing it from a circular shape to a square shape or other shape containing a plurality of angles. Two further examples of such coaxial elements are shown in FIGS. 36A and 36B wherein coaxial elements 1132 and 1142, respectively include central conductors 1134 and 1144 which have been modified from a square and circular configuration to modified configurations with indentations so as to increase their surface areas.

Figure 37:
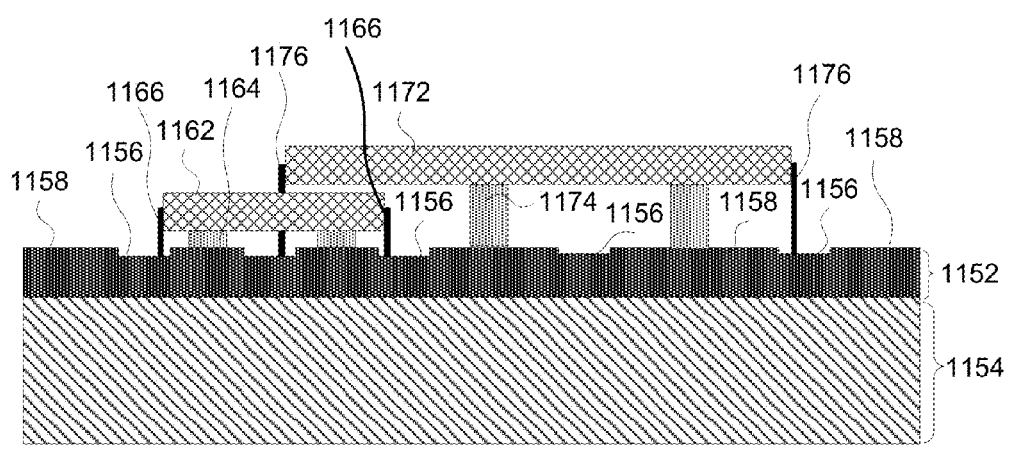
FIG. 37 depicts a side view of an integrated circuit with connection pads that are used for connecting internal signals (e.g. clock signals) to low dispersions transmission lines for communication with other portions of the integrated circuit.

FIG. 37 depicts a side view of another embodiment of the present invention where an integrated circuit 1152 is formed on a substrate 1154 (e.g. silicon) with contact pads 1156 exposed through a protective layer 1158 located on the top of the integrated circuit. The contact pads may be pads for connection to other devices or alternatively may be pads for top side intra-connection for linking separate parts of the integrated circuit. For example, the intraconnects (and interconnects) may be pads for distributing high frequency clock signals (e.g. 10 GHz) to different locations within the integrated circuit via a low dispersion transmission line such as a coaxial capable or waveguide. Two coaxial transmission lines 1162 and 1172 are illustrated as connecting some of the pads to one another. The outer conductors of the coaxial lines are supported by stands or pedestals 1164 and 1174 and the connections to the pads are made by wires 1166 and 1176. In alternative embodiments the connections to the pads may be made by not only the wires but also by bring at least a portion of the coaxial shielding in contact with or into closer proximity with the surface of the integrated circuit. In some embodiments, the coaxial structures may be supported by the central wires and any grounding connections only while in other embodiments pedestals or the like may be used. In some implementations coaxial structures may be preformed and picked and placed at desired locations on the integrated circuits or alternatively the EFAB process may be performed directly onto the upper surface of the integrated circuit. Some implementations of such microdevice to IC integration are set forth in U.S. Provisional Patent Application No. 60/379,133 which is described briefly hereafter and is incorporated herein in its entirety. Of course in other embodiments some pads may be for connection between components of the IC while some other pads may be for connections to other components.

Figure 38A:
FIGS. 38A and 38B illustrate first and second generation computer controlled electrochemical fabrication systems (i.e. EFAB® Microfabrication systems) that may be used in implementing the processes set forth herein.
Figure 38B:
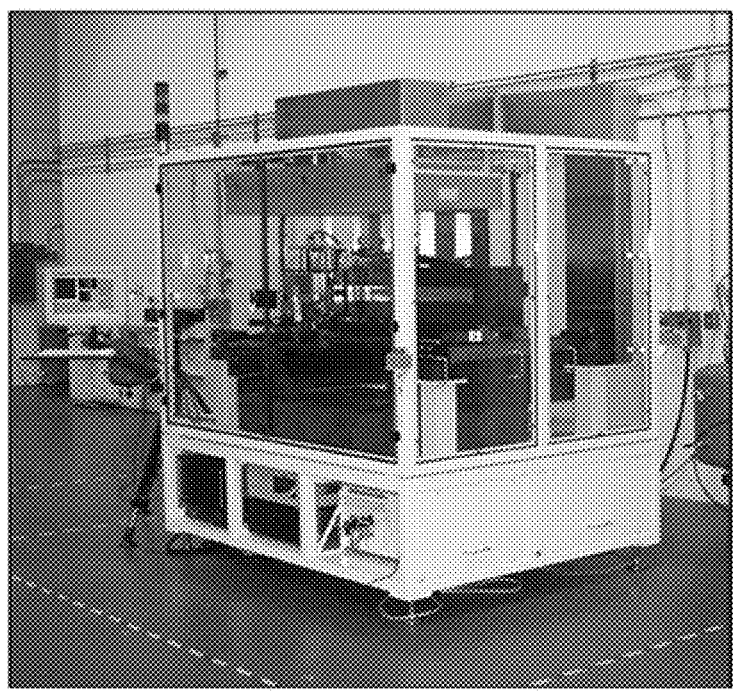

FIGS. 38A and 38B illustrate first and second generation computer controlled electrochemical fabrication systems (i.e. EFAB® Microfabrication systems) produced by Microfabrica. These systems may be used in implementing the processes set forth herein and in forming devices/structures set forth herein. As presently configured these systems include selective deposition and blanket deposition stations, a planarization station, various cleaning and surface activation stations, inspection stations, plating bath circulation subsystems, atmosphere control systems (e.g. temperature control and air filtering system), and a transport stage for moving the substrate relative to the various stations (i.e. for providing Z, X, and Y motion). Other systems may include one or more selective etching stations, one or more blanket etching stations, one or more seed layer formation stations (e.g. CVD or PVD deposition stations), selective atmosphere control systems (e.g. for supplying specified gases globally or within certain work areas), and maybe even one or more rotational stages for aligning the substrate and/or selected stations.

In some embodiments, it is possible to build a number of similar components on a single substrate where the multiple components may be used together on the substrate or they may be diced from one another and applied to separate secondary substrates as separate components for use on different circuit/component boards. In other embodiments the electrochemical processes of various embodiments set forth herein may be used in a generic way to form various distinct components simultaneously on a single substrate where the components may be formed in their final positions and with many if not all of their desired interconnections. In some embodiments single or multiple identical or distinct components may be formed directly onto integrated control circuits or other substrates that include premounted components. In some embodiments, it may be possible to form entire systems from a plurality of monolithically formed and positioned components.

In still further embodiments, the devices or groups of devices may be formed along with structures that may be used for packaging the components. Such packaging structures are set forth in U.S. Patent Application No. 60/379,182 which is described in the table of patent application set forth hereafter. This incorporated application teaches several techniques for forming structures and hermetically sealable packages. Structures may be formed with holes that allow removal of a sacrificial material. After removal of the sacrificial material, the holes may be filled in a variety of ways. For example, adjacent to or in proximity to the holes a meltable material may be located which may be made to flow and seal the holes and then resolidify. In other embodiments the holes may be plugged by locating a plugging material in proximity to but spaced from the openings and after removal of sacrificial material then causing the plugging material to bridge the gaps associated with the holes and seal them either via a solder like material or other adhesive type material. In still other embodiments, it may be possible to perform a deposition to fill the holes, particularly if such a deposition is essentially a straight line deposition process and if underneath the holes a structural element is located that can act as a deposition stop and build up point from which the deposit can build up to plug the holes.

Though the application has focused the bulk of its teachings on coaxial transmission lines and coaxial filters, it should be understood that these structures may be used as fundamental building blocks of other structures. As such, RF and microwave components of various embodiments may include one or more of a microminiature coaxial component, a transmission line, a low pass filter, a high pass filter, a band pass filter, a reflection-based filter, an absorption-based filter, a leaky wall filter, a delay line, an impedance matching structure for connecting other functional components, one of a class of antennas, a directional coupler, a power combiner (e.g., Wilkinson), a power splitter, a hybrid combiner, a magic TEE, a frequency multiplexer, or a frequency demultiplexer. The antennas include pyramidal (i.e., smooth wall) and scalar (corrugated wall) feedhorns—components that can efficiently transfer microwave power from the microminiature transmission line into free space. EFAB produced microminiature coax will also enable new components with multiple functionalities. The combination of power combining (or splitting) and frequency multiplexing (or demultiplexing) could readily be combined in a single microminiature-coax structure having multiple input and output ports.

Other embodiments of the present invention may involve the formation and use of waveguides and waveguide components. Some embodiments may involve the formation of discrete components that may be combined manually or automatically while may involve the formation of entire systems such as signal distribution networks and the like.

The patent applications in the following table are hereby incorporated by reference herein as if set forth in full. The gist of each patent application is included in the table to aid the reader in finding specific types of teachings. It is not intended that the incorporation of subject matter be limited to those topics specifically indicated, but instead the incorporation is to include all subject matter found in these applications. The teachings in these incorporated applications can be combined with the teachings of the instant application in many ways. For example, the various apparatus configurations disclosed in these referenced applications may be used in conjunction with the novel features of the instant invention to provide various alternative apparatus that include the functionality disclosed herein:

| U.S. patent application No., Filing Date U.S. application Pub No., Pub Date | Inventor, Title |
|---|---|
| 09/493,496 - Jan. 28, 2000 U.S. Pat. No. 6,790,377 - Sep. 14, 2004 | Cohen, "Method For Electrochemical Fabrication" |
| 10/677,556 - Oct. 1, 2003 2004-0134772 - Jul. 15, 2004 10/830,262 - Apr. 21, 2004 2004-0251142A - Dec. 16, 2004 U.S. Pat. No. 7,198,704 - Apr. 3, 2007 | Cohen, "Monolithic Structures Including Alignment and/or Retention Fixtures for Accepting Components" Cohen, "Methods of Reducing Interlayer Discontinuities in Electrochemically Fabricated Three-Dimensional Structures" |
| 10/271,574 - Oct. 15, 2002 2003-0127336A - Jul. 10, 2003 U.S. Pat. No. 7,288,178 - Oct. 30, 2007 | Cohen, "Methods of and Apparatus for Making High Aspect Ratio Microelectromechanical Structures" |
| 10/697,597 - Dec. 20, 2002 2004-0146650A - Jul. 29, 2004 | Lockard, "EFAB Methods and Apparatus Including Spray Metal or Powder Coating Processes" |
| 10/677,498 - Oct. 1, 2003 2004-0134788 - Jul. 15, 2004 U.S. Pat. No. 7,235,166 - Jun. 26, 2007 | Cohen, "Multi-cell Masks and Methods and Apparatus for Using Such Masks To Form Three-Dimensional Structures" |

| U.S. patent application No., Filing Date U.S. application Pub No., Pub Date | Inventor, Title |
|---|---|
| 10/724,513 - Nov. 26, 2003 2004-0147124 - Jul. 29, 2004 U.S. Pat. No. 7,368,044 - May 6, 2008 | Cohen, "Non-Conformable Masks and Methods and Apparatus for Forming Three-Dimensional Structures" |
| 10/607,931 - Jun. 27, 2003 2004-0140862 - Jul. 22, 2004 U.S. Pat. No. 7,239,219 - Jul. 3, 2007 | Brown, "Miniature RF and Microwave Components and Methods for Fabricating Such Components" |
| 10/841,100 - May 7, 2004 2005-0032362 - Feb. 10, 2005 U.S. Pat. No. 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/387,958 - Mar. 13, 2003 2003-022168A - Dec. 4, 2003 | Cohen, "Electrochemical Fabrication Method and Application for Producing Three-Dimensional Structures Having Improved Surface Finish" |
| 10/434,494 - May 7, 2003 2004-0000489A - Jan. 1, 2004 | Zhang, "Methods and Apparatus for Monitoring Deposition Quality During Conformable Contact Mask Plating Operations" |
| 10/434,289 - May 7, 2003 20040065555A - Apr. 8, 2004 | Zhang, "Conformable Contact Masking Methods and Apparatus Utilizing In Situ Cathodic Activation of a Substrate" |
| 10/434,294 - May 7, 2003 2004-0065550A - Apr. 8, 2004 | Zhang, "Electrochemical Fabrication Methods With Enhanced Post Deposition Processing" |
| 10/434,295 - May 7, 2003 2004-0004001A - Jan. 8, 2004 | Cohen, "Method of and Apparatus for Forming Three-Dimensional Structures Integral With Semiconductor Based Circuitry" |
| 10/434,315 - May 7, 2003 2003-0234179 A - Dec. 25, 2003 U.S. Pat. No. 7,229,542 - Jun. 12, 2007 | Bang, "Methods of and Apparatus for Molding Structures Using Sacrificial Metal Patterns" |
| 10/434,103 - May 7, 2004 2004-0020782A - Feb. 5, 2004 U.S. Pat. No. 7,160,429 - Jan. 9, 2007 | Cohen, "Electrochemically Fabricated Hermetically Sealed Microstructures and Methods of and Apparatus for Producing Such Structures" |
| 10/841,006 - May 7, 2004 2005-0067292 - May 31, 2005 | Thompson, "Electrochemically Fabricated Structures Having Dielectric or Active Bases and Methods of and Apparatus for Producing Such Structures" |
| 10/434,519 - May 7, 2003 2004-0007470A - Jan. 15, 2004 U.S. Pat. No. 7,252,861 - Aug. 7, 2007 | Smalley, "Methods of and Apparatus for Electrochemically Fabricating Structures Via Interlaced Layers or Via Selective Etching and Filling of Voids" |
| 10/724,515 - Nov. 26, 2003 2004-0182716 - Sep. 23, 2004 U.S. Pat. No. 7,291,254 - Nov. 6, 2007 | Cohen, "Method for Electrochemically Forming Structures Including Non-Parallel Mating of Contact Masks and Substrates" |
| 10/841,347 - May 7, 2004 2005-0072681 - Apr. 7, 2005 | Cohen, "Multi-step Release Method for Electrochemically Fabricated Structures" |
| 60/533,947 - Dec. 31, 2003 | Kumar, "Probe Arrays and Method for Making" |
| 10/841,300 - May 7, 2004 2005 0032375 - Feb. 10, 2005 | Cohen, "Methods for Electrochemically Fabricating Structures Using Adhered Masks, Incorporating Dielectric Sheets, and/or Seed layers That Are Partially Removed Via Planarization" |
| 60/534,183 - Dec. 31, 2003 | Cohen, "Method and Apparatus for Maintaining Parallelism of Layers and/or Achieving Desired Thicknesses of Layers During the Electrochemical Fabrication of Structures" |
| 11/733,195 - Apr. 9, 2007 2008-0050524 - Feb. 28, 2008 | Kumar, "Methods of Forming Three-Dimensional Structures Having Reduced Stress and/or Curvature" |
| 11/506,586 - Aug. 8, 2006 2007-0039828 - Feb. 22, 2007 U.S. Pat. No. 7,611,616 - Nov. 3, 2009 | Cohen, "Mesoscale and Microscale Device Fabrication Methods Using Split Structures and Alignment Elements" |
| 10/949,744 - Sep. 24, 2004 2005-0126916 - Jun. 16, 2005 U.S. Pat. No. 7,498,714 - Mar. 3, 2009 | Lockard, "Three-Dimensional Structures Having Feature Sizes Smaller Than a Minimum Feature Size and Methods for Fabricating" |

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use blanket deposition processes that are not electrodeposition processes. Some embodiments may use selective deposition processes on some layers that are not conformable contact masking processes and are not even electrodeposition processes. Some embodiments may use the non-conformable contact mask or non-contact masking techniques set forth in the above referenced US Provisional Application corresponding to P-US042-B-MG.

Some embodiments may use nickel as a structural material while other embodiments may use different materials such as copper, gold, silver, or any other electrodepositable materials that can be separated from the a sacrificial material. Some embodiments may use copper as the structural material with or without a sacrificial material. Some embodiments may remove a sacrificial material while other embodiments may not. In some embodiments the sacrificial material may be removed by a chemical etching operation, an electrochemical operation, or a melting operation. In some embodiments the anode may be different from the conformable contact mask support and the support may be a porous structure or other perforated structure. Some embodiments may use multiple conformable contact masks with different patterns so as to deposit different selective patterns of material on different layers and/or on different portions of a single layer. In some embodiments, the depth of deposition will be enhanced by pulling the conformable contact mask away from the substrate as deposition is occurring in a manner that allows the seal between the conformable portion of the CC mask and the substrate to shift from the face of the conformal material to the inside edges of the conformable material.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A coaxial waveguide, comprising:
a center conductor having a length;
an outer conductor comprising one or more walls, spaced apart from and disposed around the center conductor;
a substrate to which the outer conductor connects;
one or more dielectric support members for supporting the center conductor in contact with the center conductor and partially embedded within the outer conductor; and
a core volume between the center conductor and the outer conductor, wherein the core volume is under vacuum or in a gas state,
wherein the core volume completely surrounds at least portions of the length of the central conductor.

2. A coaxial waveguide, comprising:
a center conductor having a length;
an outer conductor comprising one or more walls, spaced apart from and disposed around the center conductor;
one or more dielectric support members for supporting the center conductor in contact with the center conductor and partially embedded within the outer conductor; and
a core volume between the center conductor and the outer conductor, wherein the core volume is under vacuum or in a gas state,
wherein the core volume completely surrounds at least portions of the length of the central conductor, and
wherein the outer conductor comprises a plurality of stacked planar layers.

3. A coaxial waveguide, comprising:
a center conductor;
an outer conductor comprising one or more walls, spaced apart from and disposed around the center conductor;
one or more dielectric support members for supporting the center conductor in contact with the center conductor and partially embedded within the outer conductor; and
a core volume between the center conductor and the outer conductor, wherein the core volume is under vacuum or in a gas state,
wherein the outer conductor is monolithic and comprises a plurality of planar layers.

4. A coaxial waveguide, comprising:
a center conductor having a length;
an outer conductor comprising one or more walls, spaced apart from and disposed around the center conductor;
one or more dielectric support members for supporting the center conductor in contact with the center conductor and partially embedded within the outer conductor; and
a core volume between the center conductor and the outer conductor, wherein the core volume is under vacuum or in a gas state,
wherein the core volume completely surrounds at least portions of the length of the central conductor,
wherein the outer conductor further comprises a conductive base to which the walls connect and wherein the conductive base is located below the central conductor.

5. A coaxial waveguide, comprising:
a center conductor having a length;
an outer conductor comprising one or more walls, spaced apart from and disposed around the center conductor;
one or more dielectric support members for supporting the center conductor in contact with the center conductor and partially embedded within the outer conductor; and
a core volume between the center conductor and the outer conductor, wherein the core volume is under vacuum or in a gas state,
wherein the core volume completely surrounds at least portions of the length of the central conductor,
wherein the outer conductor further comprises a conductive top to which the walls connect and wherein the conductive top is located above the central conductor.

6. A coaxial waveguide, comprising:
a center conductor having a length;
an outer conductor comprising one or more walls, spaced apart from and disposed around the center conductor;
one or more dielectric support members for supporting the center conductor in contact with the center conductor and partially embedded within the outer conductor; and
a core volume between the center conductor and the outer conductor, wherein the core volume is under vacuum or in a gas state,
wherein the core volume completely surrounds at least portions of the length of the central conductor,
wherein a dielectric support member extends only from one side of the outer conductor to the central conductor but not to an opposite side of the outer conductor.

7. A coaxial waveguide, comprising:
a center conductor having a length;
an outer conductor comprising one or more walls, spaced apart from and disposed around the center conductor;
one or more dielectric support members for supporting the center conductor in contact with the center conductor and partially embedded within the outer conductor; and
a core volume between the center conductor and the outer conductor, wherein the core volume is under vacuum or in a gas state,
wherein the core volume completely surrounds at least portions of the length of the central conductor,
wherein the waveguide is functionally coupled to an active electronic device.

8. A three-dimensional microstructure, comprising:
a first microstructural element formed of a first material; and
a second microstructural element formed of a second material different from the first material;
a third microstructural element formed of a third material that is different from the second material;
wherein the second microstructural element comprises an anchoring portion embedded in the first microstructural element and contacting the third microstructural element for mechanically locking the first microstructural element to third microstructural element via the second microstructural element,
wherein each of the first and third microstructural elements comprises a conductor and the second microstructural element comprises a dielectric, and wherein at least one of the first and third microstructural elements is a monolithic structure comprising a plurality of adhered planar layers of a conductor.

9. The microstructure of claim 8 wherein the anchoring portion includes a change in cross-section.

10. The microstructure of claim 8 configured to function as a coaxial microwave or RF component.

11. A three-dimensional microstructure, comprising:
a first microstructural element formed of a first material; and
a second microstructural element formed of a second material different from the first material;
a third microstructural element formed of a third material that is different from the second material;
wherein the second microstructural element comprises an anchoring portion embedded in the first microstructural element and contacting the third microstructural element for mechanically locking the first microstructural element to third microstructural element via the second microstructural element
wherein one of the first-third microstructural elements contains a patterned locking portion that mechanically locks the respective element to another of the first to third elements.

12. The microstructure of claim 11 wherein the patterned locking portion comprises an opening through at least one of the first-third elements.

13. The microstructure of claim 11 wherein the first material comprises a metal, the second material comprises a dielectric, and the third material comprises a metal.

14. A three-dimensional microstructure formed by a sequential build process, comprising:
a first microstructural element formed of a first material; and
a second microstructural element formed of a second material different from the first material;
wherein the first or second microstructural element comprises an anchoring portion embedded in the other of the first or second microstructural element for mechanically locking the first microstructural element to the second microstructural element, wherein the anchoring portion includes a change in cross-section so as to provide locking.

15. The microstructure of claim 14 wherein the first material comprises a metal, the second material comprises a dielectric, and the third material comprises a metal.

16. A coaxial waveguide, comprising:
a center conductor having a length;
an outer conductor comprising one or more walls, spaced apart from and disposed around the center conductor;
one or more dielectric support members for supporting the center conductor in contact with the center conductor and partially embedded within the outer conductor; and
a core volume between the center conductor and the outer conductor, wherein the core volume is under vacuum or in a gas state,
wherein the core volume completely surrounds at least portions of the length of the central conductor and wherein the core volume defines a passage having a length,
at least one conductive spoke extending between the central conductor and the outer conductor at each of a plurality of locations where successive locations along the length of the passage are spaced by approximately one-half of a propagation wavelength, or an integral multiple thereof, within the passage for a frequency to be passed by the component,
wherein one or more of the following conditions are met: (1) the central conductor, the conductive structure, and the conductive spokes are monolithic; (2) a cross-sectional dimension of the passage perpendicular to a propagation direction of the radiation along the passage is less than about 1 mm, more preferably less than about 0.5 mm, and most preferably less than about 0.25 mm; (3) more than about 50% of the passage is filled with a gaseous medium, more preferably more than about 70% of the passage is filled with a gaseous medium, and most preferably more than about 90% of the passage is filled with a gaseous medium; (4) at least a portion of the conductive portions of the component are formed by an electrodeposition process; (5) at least a portion of the conductive portions of the component are formed from a plurality of successively deposited layers; (6) at least a portion of the passage has a generally rectangular shape; (7) at least a portion of the central conductor has a generally rectangular shape; (8) the passage extends along a two-dimensional non-linear path; (9) the passage extends along a three-dimensional path; (10) the passage comprises at least one curved region and a side wall of the passage in the curved region has a nominally smaller radius than an opposite side of the passage in the curved region and is provided with a plurality of surface oscillations having smaller radii; (11) the conductive structure is provided with channels at one or more locations where the electrical field at a surface of the conductive structure, if it were there, would have been less than about 20% of its maximum value within the passage, more preferably less than 10% of its maximum value within the passage, even more preferably less than 5% of its maximum value within the passage, and most preferably where the electrical field would have been approximately 0% of its maximum value; (12) the conductive structure is provided with patches of a different conductive material at one or more locations where the electrical field at the surface of the conductive structure, if it were there, would have been less than about 20% of its maximum value within the passage more preferably less than about 10% of its maximum value within the passage, even more preferably less than about 5% of its maximum value within the passage, and most preferably where the electrical field would have been approximately 0% of its maximum value; (13) mitered corners are used at least some junctions for segments of the passage that meet at angles between 60° and 120°; and/or (14) the conductive spokes are spaced at an integral multiple of one-half the wavelength and bulges on the central conductor or bulges extending from the conductive structure extend into the passage at one or more locations spaced from the conductive spokes by an integral multiple of approximately one-half the wavelength.

* * * * *